US012805004B2

(12) United States Patent
Lin et al.

(10) Patent No.: US 12,805,004 B2
(45) Date of Patent: Nov. 17, 2026

(54) SEMICONDUCTOR STRUCTURE AND METHOD FOR FORMING THE SAME

(71) Applicant: TAIWAN SEMICONDUCTOR MANUFACTURING COMPANY, LTD., Hsinchu (TW)

(72) Inventors: Ta-Chun Lin, Hsinchu (TW); Jhon-Jhy Liaw, Zhudong Township, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 735 days.

(21) Appl. No.: 18/178,406

(22) Filed: Mar. 3, 2023

(65) Prior Publication Data

US 2024/0297170 A1 Sep. 5, 2024

(51) Int. Cl.

| | |
|---|---|
| ***H01L 27/088*** | (2006.01) |
| ***H01L 21/8234*** | (2006.01) |
| ***H10D 84/01*** | (2025.01) |
| ***H10D 84/03*** | (2025.01) |
| ***H10D 84/83*** | (2025.01) |

(52) U.S. Cl.
CPC ......... *H10D 84/83* (2025.01); *H10D 84/0128* (2025.01); *H10D 84/0142* (2025.01); *H10D 84/038* (2025.01)

(58) Field of Classification Search
CPC ............. H10D 62/121; H10D 30/6735; H10D 84/038; H10D 84/8311; H10D 84/832; H10D 30/6757; H10D 84/83138
See application file for complete search history.

(56) References Cited

U.S. PATENT DOCUMENTS

| | | | | |
|---|---|---|---|---|
| 9,209,247 | B2 | 12/2015 | Colinge et al. | |
| 9,236,267 | B2 | 1/2016 | De et al. | |
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 2017/0170331 | A1* | 6/2017 | Liang | H10D 30/6713 |
| 2022/0238678 | A1* | 7/2022 | Lee | H10D 62/121 |
| 2023/0402520 | A1* | 12/2023 | Mehta | H10D 30/6757 |

FOREIGN PATENT DOCUMENTS

DE 1020130109635 * 2/2015 ............. H01L 29/78

OTHER PUBLICATIONS

DE1020130109635 Machine Translation (Year: 2015).*

* cited by examiner

*Primary Examiner* — John A Bodnar
(74) *Attorney, Agent, or Firm* — Cooper Legal Group, LLC

(57) ABSTRACT

Semiconductor structures and methods for manufacturing the same are provided. The semiconductor structure includes first nanostructures formed over a substrate along a first direction, and a first gate structure formed over the first nanostructures along a second direction. The semiconductor structure includes a gate spacer layer formed adjacent to the first gate structure, and a first number of the nanostructures directly below the gate spacer layer is greater than a second number of the nanostructures directly below the first gate structure.

20 Claims, 62 Drawing Sheets

SEMICONDUCTOR STRUCTURE AND METHOD FOR FORMING THE SAME

BACKGROUND

The electronics industry is experiencing ever-increasing demand for smaller and faster electronic devices that are able to perform a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). However, integration of fabrication of the multi-gate devices can be challenging.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

FIGS. 3A-2 to 3M-2 illustrate cross-sectional representations of various stages of manufacturing the semiconductor structure shown along line B-B' in FIG. 1E and in FIG. 2, in accordance with some embodiments.

FIGS. 3A-3 to 3M-3 illustrate cross-sectional representations of various stages of manufacturing the semiconductor structure shown along line $C_1$-$C_1$' and $C_2$-$C_2$' in FIG. 1E and in FIG. 2, in accordance with some embodiments.

FIGS. 10A-1 to 10F-1 illustrate cross-sectional representations of various stages of manufacturing the semiconductor structure 100*d* shown along line A-A' in FIG. 8 and in FIG. 9, in accordance with some embodiments.

FIGS. 10A-2 to 10D-2 illustrate cross-sectional representations of various stages of manufacturing the semiconductor structure 100*d* shown along line B-B' in FIG. 8 and in FIG. 9, in accordance with some embodiments.

FIGS. 10E-2 to 10F-2 illustrate cross-sectional representations of various stages of manufacturing the semiconductor structure 100*d* shown along line B-B' and F-F' in FIG. 8 and in FIG. 9, in accordance with some embodiments.

FIGS. 10A-3 to 10B-3 illustrate cross-sectional representations of various stages of manufacturing the semiconductor structure shown along line $D_1$-$D_1$' in FIG. 8 and in FIG. 9, in accordance with some embodiments.

FIGS. 10C-3 to 10D-3 illustrate cross-sectional representations of various stages of manufacturing the semiconductor structure shown along line $D_2$-$D_2$' in FIG. 8 and in FIG. 9, in accordance with some embodiments.

FIGS. 10E-3 to 10F-3 illustrate cross-sectional representations of various stages of manufacturing the semiconductor structure shown along line C-C', $D_1$-$D_1$' and E-E' in FIG. 8 and in FIG. 9, in accordance with some embodiments.

FIGS. 12A-1 to 12B-1 illustrate cross-sectional representations of various stages of manufacturing a semiconductor structure shown along line A-A' in FIG. 8 and in FIG. 9, in accordance with some embodiments.

FIGS. 12A-2 to 12B-2 illustrate cross-sectional representations of various stages of manufacturing the semiconductor structure shown along line B-B' in FIG. 8 and in FIG. 9, in accordance with some embodiments.

FIGS. 12A-3 to 12B-3 illustrate cross-sectional representations of various stages of manufacturing the semiconductor structure shown along line C-C' and E-E' in FIG. 8 and in FIG. 9, in accordance with some embodiments.

DETAILED DESCRIPTION

Figure 1A:
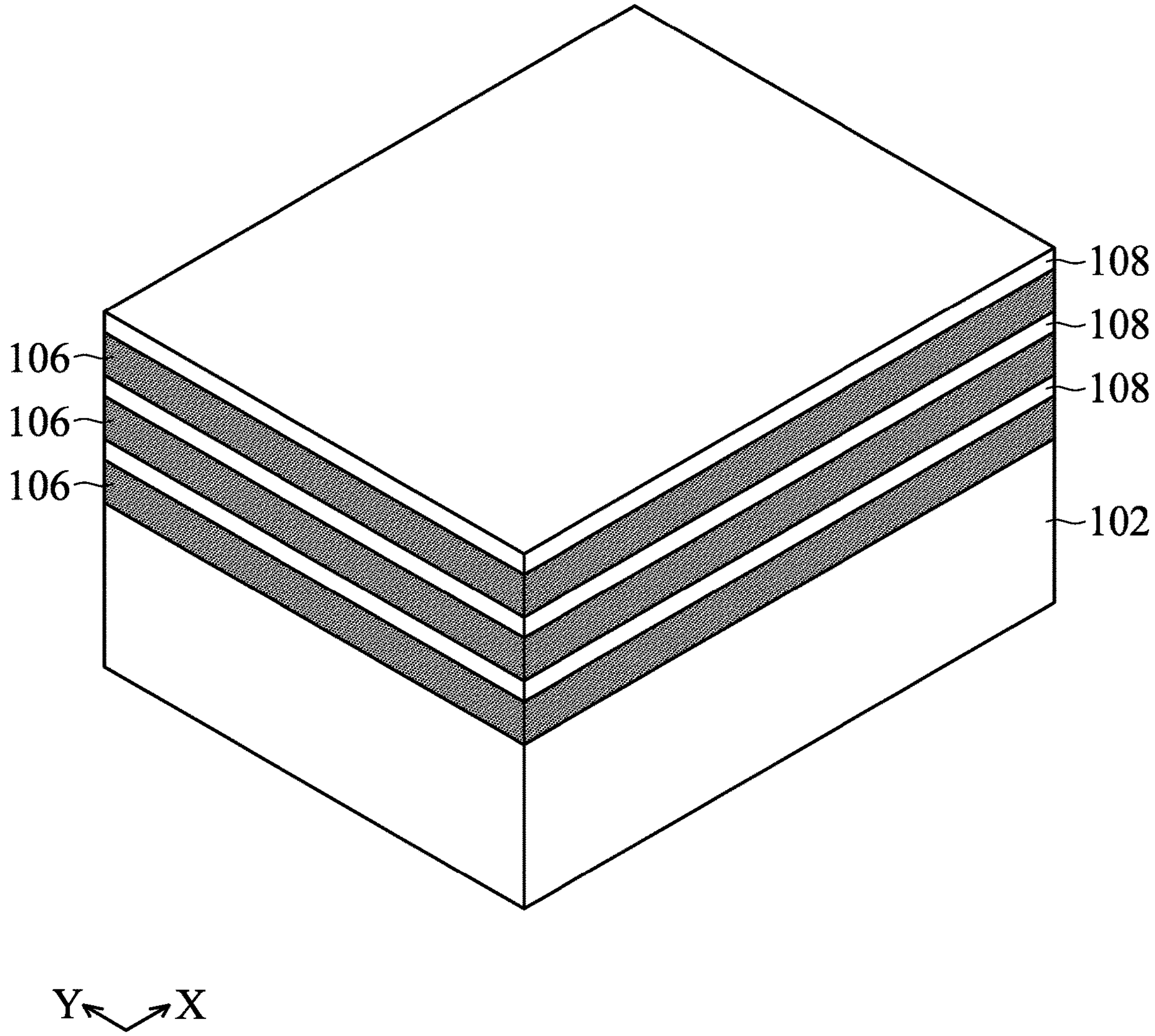
FIGS. 1A to 1E illustrate perspective views of intermediate stages of manufacturing a semiconductor structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The fins described below may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Embodiments of semiconductor structures and methods for forming the same are provided. The semiconductor structures may include a first fin structure and a second fin structure formed over a substrate. The first fin structure includes first nanostructures, and the second fin structure includes second nanostructures along a first direction (e.g. x-axis). A first gate structure formed over the first nanostructures and a first S/D structure adjacent to the first gate structure. A second gate structure formed over the second nanostructures along the second direction (e.g. y-axis). A gate spacer layer is adjacent to the gate structure. A portion of the topmost nanostructures is removed, and therefore the number of nanostructures directly below the gate structure is reduced. In addition, the first width of the first nanostructures along the second direction is smaller than the second width of the second nanostructures along the second direction. In order to fulfill different needs in a region, the first gate structure is formed for power efficiency, and the second gate structure is formed for high speed performance. The first gate structure and second gate structure co-exist to achieve multi-nanostructures for speed performance and power efficiency. Therefore, the performance of the semiconductor structure is improved. The source/drain (S/D) structure or region(s) may refer to a source or a drain, individually or collectively dependent upon the context.

FIGS. 1A to 1E illustrate perspective views of intermediate stages of manufacturing a semiconductor structure 100*a*, in accordance with some embodiments. As shown in FIG. 1A, first semiconductor material layers 106 and second semiconductor material layers 108 are formed over a substrate 102.

The substrate 102 may be a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP.

In some embodiments, the first semiconductor material layers 106 and the second semiconductor material layers 108 are alternately stacked over the substrate 102. In some embodiment, the first semiconductor material layers 106 and the second semiconductor material layers 108 are made of different semiconductor materials. In some embodiments, the first semiconductor material layers 106 are made of SiGe, and the second semiconductor material layers 108 are made of silicon. It should be noted that although three first semiconductor material layers 106 and three second semiconductor material layers 108 are formed, the semiconductor structure may include more or fewer first semiconductor material layers 106 and second semiconductor material layers 108. For example, the semiconductor structure may include two to five of the first semiconductor material layers 106 and the second semiconductor material layers.

The first semiconductor material layers 106 and the second semiconductor material layers 108 may be formed by using low-pressure chemical vapor deposition (LPCVD), epitaxial growth process, another suitable method, or a combination thereof. In some embodiments, the epitaxial growth process includes molecular beam epitaxy (MBE), metal organic chemical vapor deposition (MOCVD), or vapor phase epitaxy (VPE).

Figure 1B:
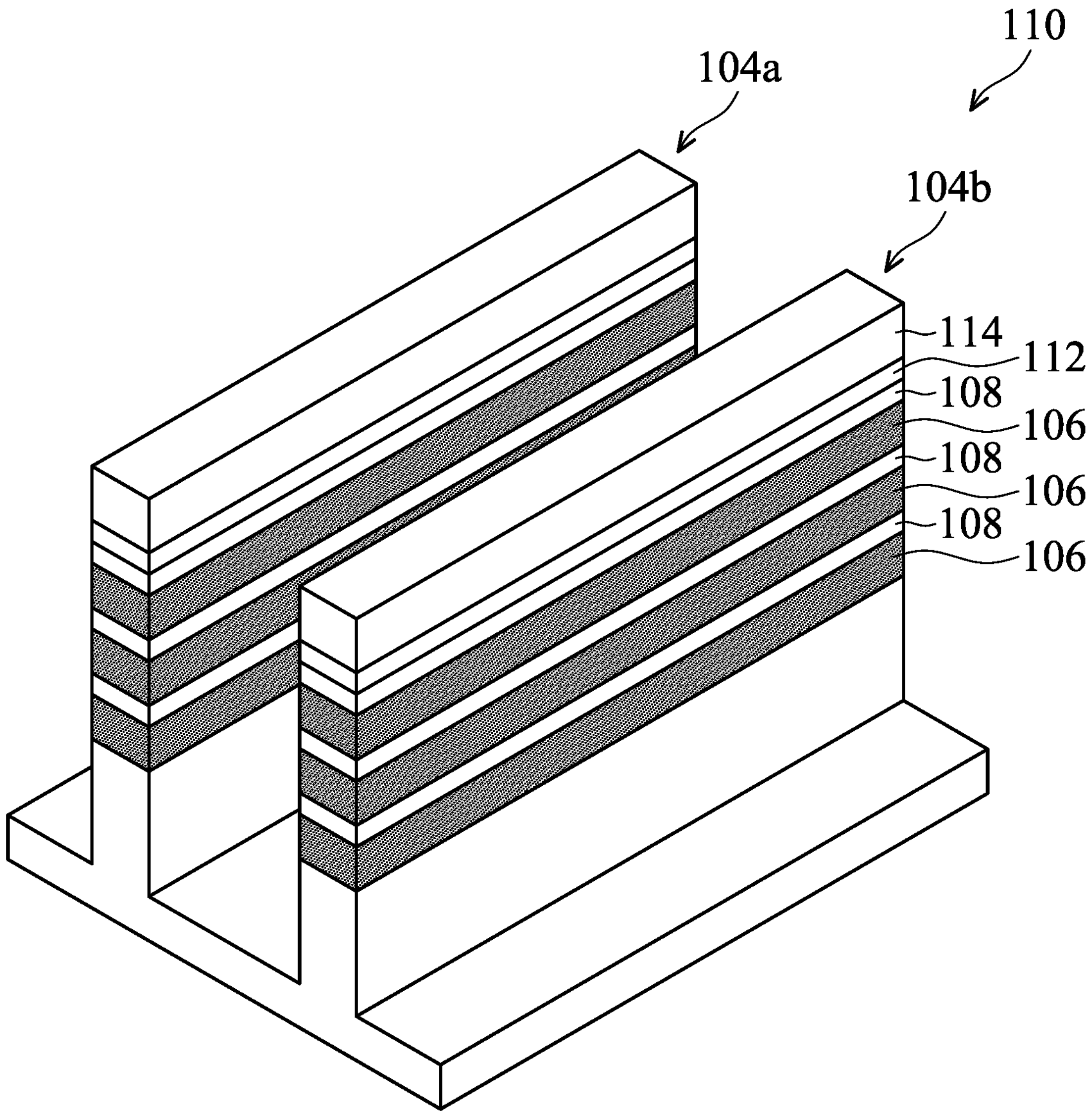

Afterwards, as shown in FIG. 1B, after the first semiconductor material layers 106 and the second semiconductor material layers 108 are formed as a semiconductor material stack over the substrate 102, the semiconductor material stack is patterned to form a first fin structure 104*a* and a second fin structure 104*b*, in accordance with some embodiments. In some embodiments, each of the first fin structure 104*a* and a second fin structure 104*b* includes a base fin structure 105 and the semiconductor material stack of the first semiconductor material layers 106 and the second semiconductor material layers 108.

In some embodiments, the patterning process includes forming a mask structure 110 over the semiconductor material stack, and etching the semiconductor material stack and the underlying substrate 102 through the mask structure 110. In some embodiments, the mask structure 110 is a multilayer structure including a pad oxide layer 112 and a nitride layer 114 formed over the pad oxide layer 112. The pad oxide layer 112 may be made of silicon oxide, which is formed by thermal oxidation or chemical vapor deposition (CVD), and the nitride layer 114 may be made of silicon nitride, which is formed by chemical vapor deposition (CVD), such as low-temperature chemical vapor deposition (LPCVD) or plasma-enhanced CVD (PECVD).

Figure 1C:
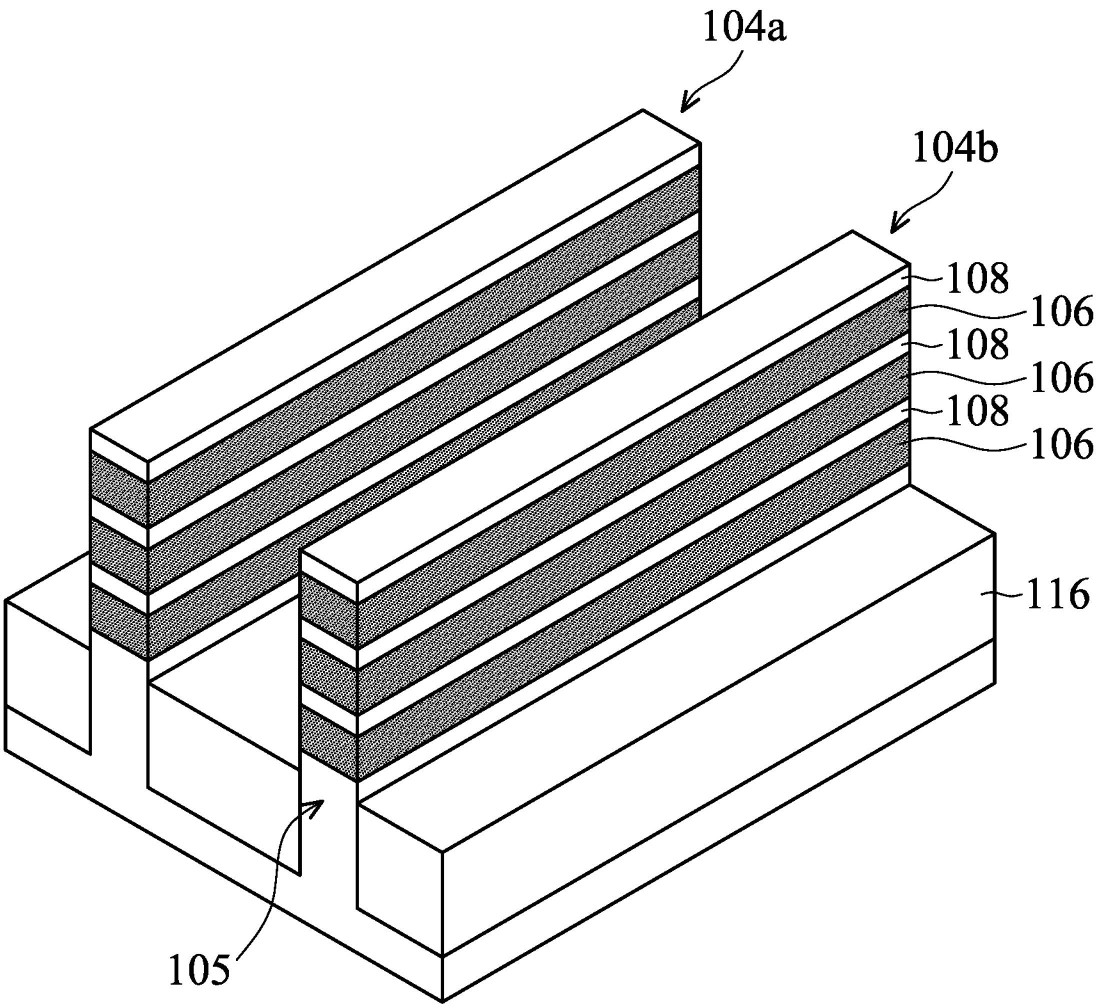

Next, as shown in FIG. 1C, after the first fin structure 104*a* and the second fin structure 104*b* is formed, an isolation structure 116 is formed around first fin structure 104*a* and the second fin structure 104*b*, and the mask structure 110 is removed, in accordance with some embodiments. The isolation structure 116 is configured to electrically isolate active regions (e.g. the first fin structure 104*a* and the second fin structure 104*b*) of the semiconductor structure 100*a* and is also referred to as shallow trench isolation (STI) feature in accordance with some embodiments.

The isolation structure 116 may be formed by depositing an insulating layer over the substrate 102 and recessing the insulating layer so that the first fin structure 104*a* and the second fin structure 104*b* is protruded from the isolation structure 116. In some embodiments, the isolation structure 116 is made of silicon oxide, silicon nitride, silicon oxynitride (SiON), another suitable insulating material, or a combination thereof. In some embodiments, a dielectric liner (not shown) is formed before the isolation structure 116 is formed, and the dielectric liner is made of silicon nitride and the isolation structure formed over the dielectric liner is made of silicon oxide.

Figure 1D:
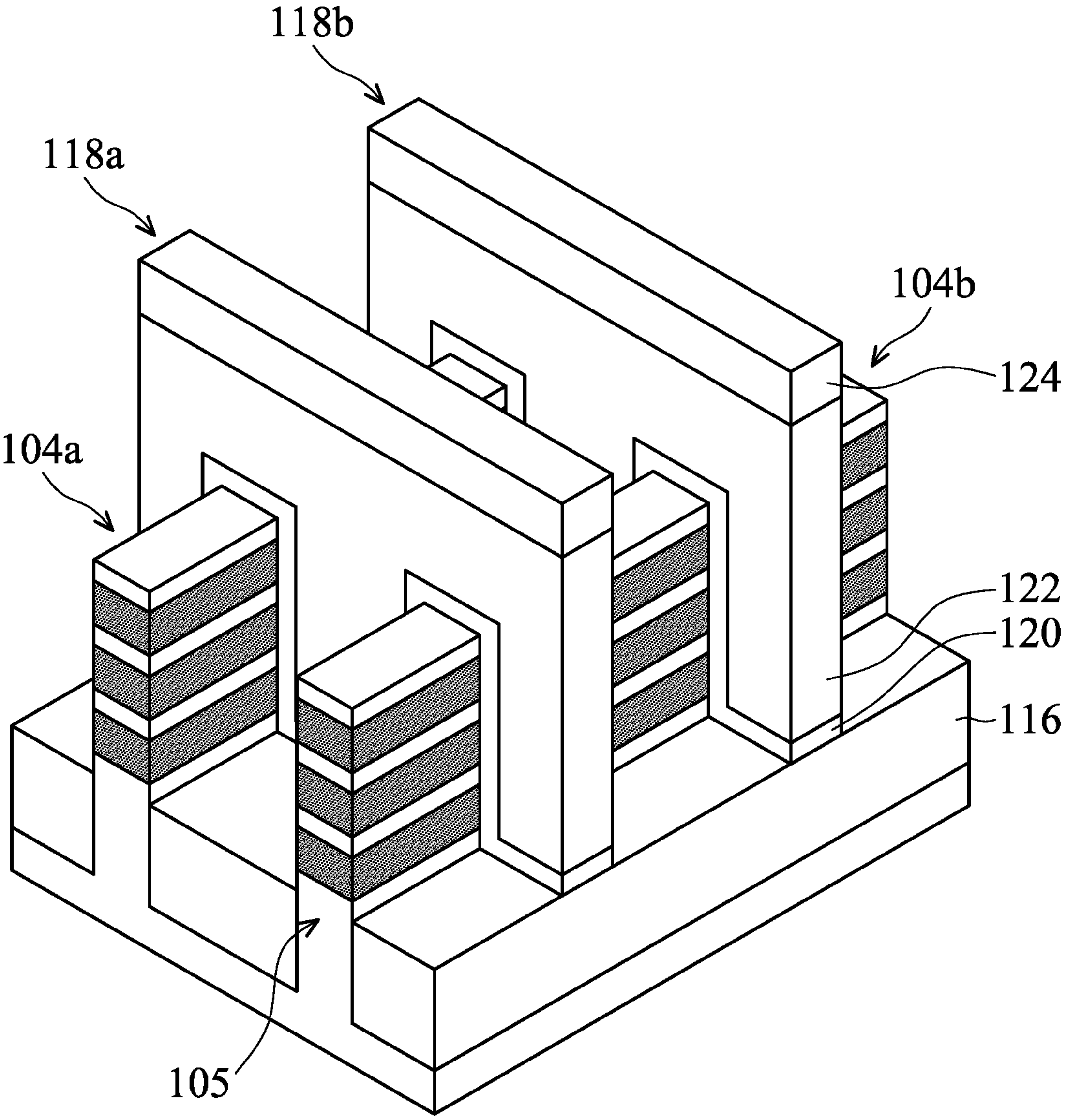

Afterwards, as shown in FIG. 1D, after the isolation structure 116 is formed, first dummy gate structures 118*a* and second dummy gate structures 118*b* are formed across the first fin structure 104*a* and the second fin structure 104*b* and extend over the isolation structure 116, in accordance with some embodiments. The first dummy gate structures 118*a* and the second dummy gate structures 118*b* may be used to define the source/drain (S/D) regions and the channel regions of the resulting semiconductor structure 100*a*.

In some embodiments, each of the first dummy gate structures 118*a* and each of the second dummy gate structures 118*b* includes dummy gate dielectric layers 120 and dummy gate electrode layers 122. In some embodiments, the dummy gate dielectric layers 120 are made of one or more dielectric materials, such as silicon oxide, silicon nitride, silicon oxynitride (SiON), $HfO_2$, HfZrO, HfSiO, HfTiO, HfAlO, or a combination thereof. In some embodiments, the dummy gate dielectric layers 120 are formed using thermal oxidation, chemical vapor deposition (CVD), atomic vapor deposition (ALD), physical vapor deposition (PVD), another suitable method, or a combination thereof.

In some embodiments, the conductive material includes polycrystalline-silicon (poly-Si), poly-crystalline silicon-germanium (poly-SiGe), metallic nitrides, metallic silicides, metals, or a combination thereof. In some embodiments, the dummy gate electrode layers 122 are formed using chemical vapor deposition (CVD), physical vapor deposition (PVD), or a combination thereof.

In some embodiments, hard mask layers 124 are formed over the dummy gate structures 118. In some embodiments, the hard mask layers 124 include multiple layers, such as an oxide layer and a nitride layer. In some embodiments, the oxide layer is silicon oxide, and the nitride layer is silicon nitride.

The formation of the dummy gate structures 118 may include conformally forming a dielectric material as the dummy gate dielectric layers 120. Afterwards, a conductive material may be formed over the dielectric material as the dummy gate electrode layers 122, and the hard mask layer 124 may be formed over the conductive material. Next, the dielectric material and the conductive material may be patterned through the hard mask layer 124 to form the dummy gate structures 118.

Figure 1E:
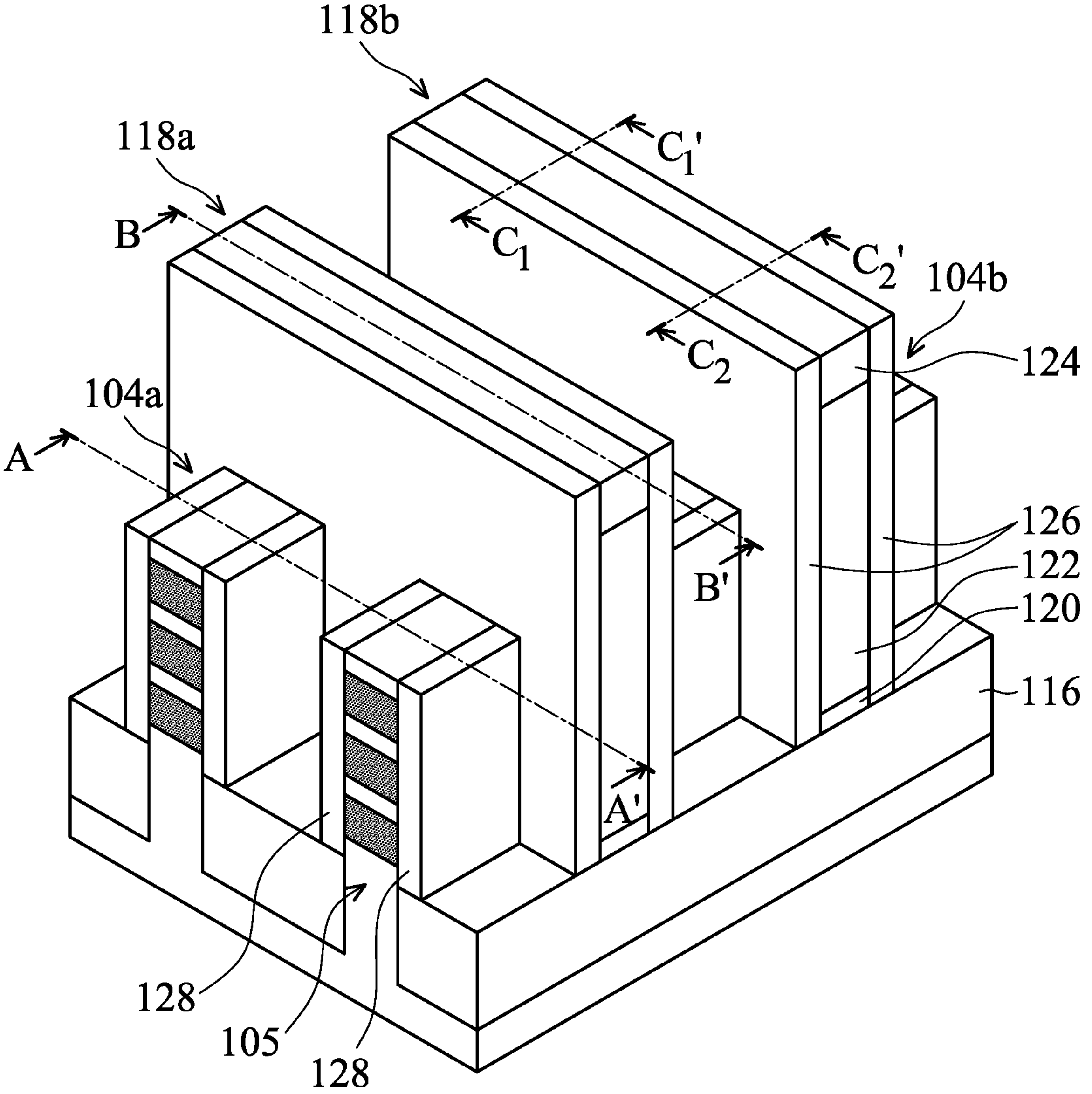

Next, as shown in FIG. 1E, after the dummy gate structures 118 are formed, gate spacer layers 126 are formed along and covering opposite sidewalls of the dummy gate structure 118 and fin spacer layers 128 are formed along and covering opposite sidewalls of the source/drain regions of the fin structure 104, in accordance with some embodiments.

The gate spacer layers 126 may be configured to separate source/drain (S/D) structures from the first dummy gate structure 118*a*, the second dummy gate structures 118*b* and support the first dummy gate structure 118*a*, the second dummy gate structures 118*b*, and the fin space layers 128 may be configured to constrain a lateral growth of subsequently formed source/drain structure and support the first fin structure 104*a* and the second fin structure 104*b*.

In some embodiments, the gate spacer layers 126 and the fin spacer layers 128 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof. The formation of the gate spacer layers 126 and the fin spacer layers 128 may include conformally depositing a dielectric material covering the first dummy gate structure 118*a*, the second dummy gate structure 118*b*, the first fin structure 104*a*, the second fin structure 104*b* and the isolation structure 116 over the substrate 102, and performing an anisotropic etching process, such as dry plasma etching, to remove the dielectric layer covering the top surfaces of the first dummy gate structure 118*a*, the second dummy gate structure 118*b*, the first fin structure 104*a*, the second fin structure 104*b*, and portions of the isolation structure 116.

Figure 2:
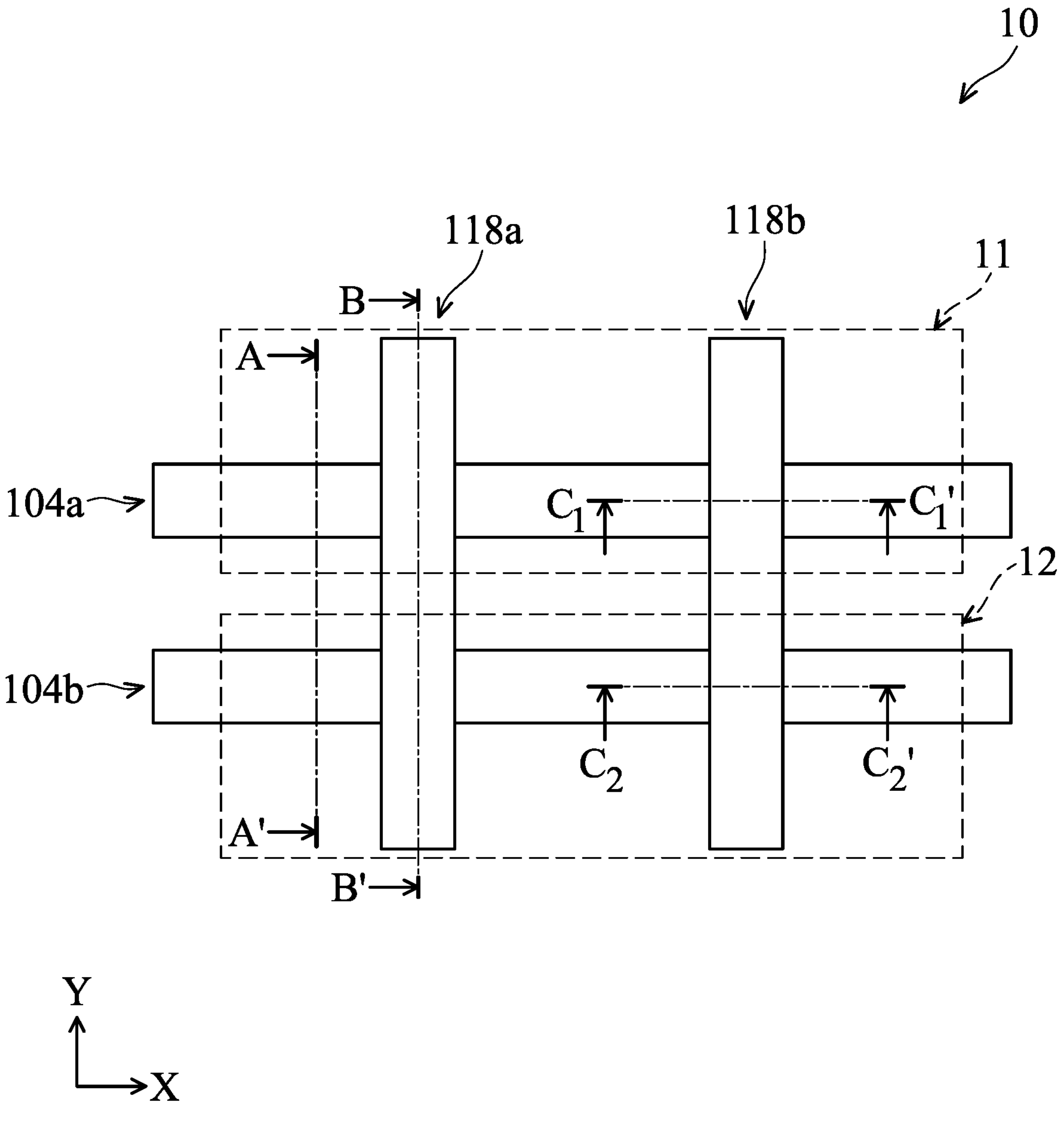
FIG. 2 shows a top-view representation of the semiconductor structure, in accordance with some embodiments.

FIG. 2 shows a top-view representation of the semiconductor structure 100*a*, in accordance with some embodiments. As shown in FIG. 2, the substrate 102 includes a first region 10, and the first region 10 includes a first sub-region 11 and a second sub-region 12. The first fin structure 104*a* is formed in the first sub-region 11 along a first direction (e.g. X-axis), and the second fin structure 104*b* is formed in the second sub-region 12 along the first direction (e.g. X-axis). A first dummy gate structure 118*a* and a second dummy gate structure 118*b* are formed along a second direction (e.g. Y-axis). The first dummy gate structure 118*a* and the second dummy gate structure 118*b* are formed across the first fin structure 104*a* and the second fin structure 104*b*.

Figures 1, 3A:
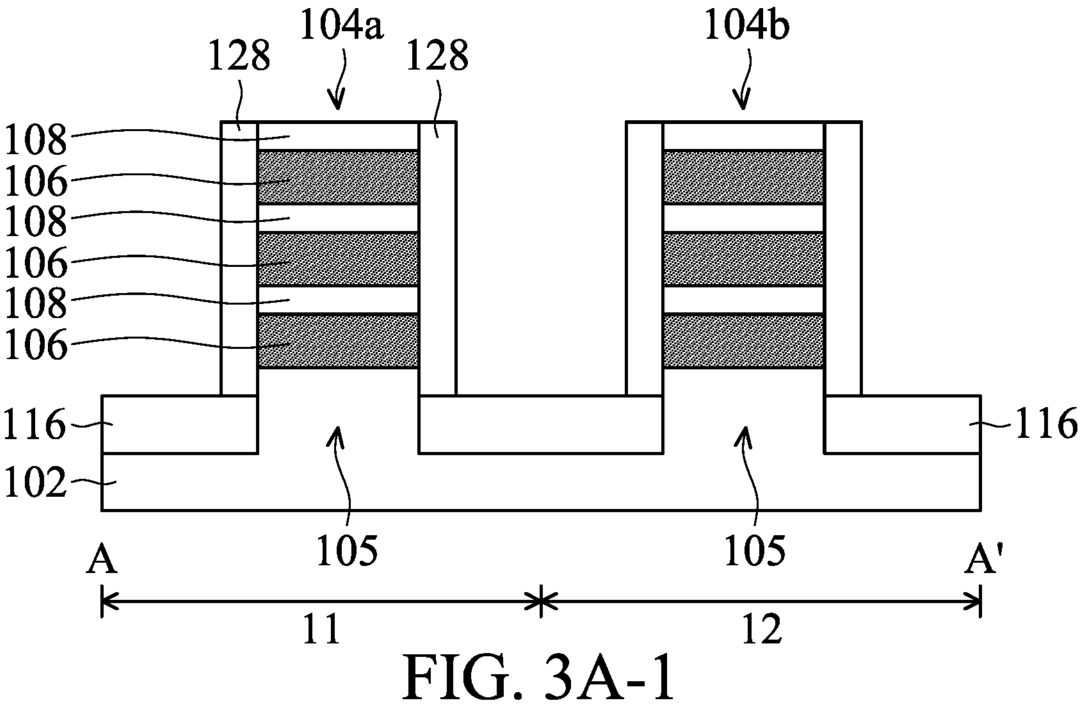
FIGS. 3A-1 to 3M-1 illustrate cross-sectional representations of various stages of manufacturing the semiconductor structure shown along line A-A' in FIG. 1E and in FIG. 2, in accordance with some embodiments.
Figures 2, 3A:
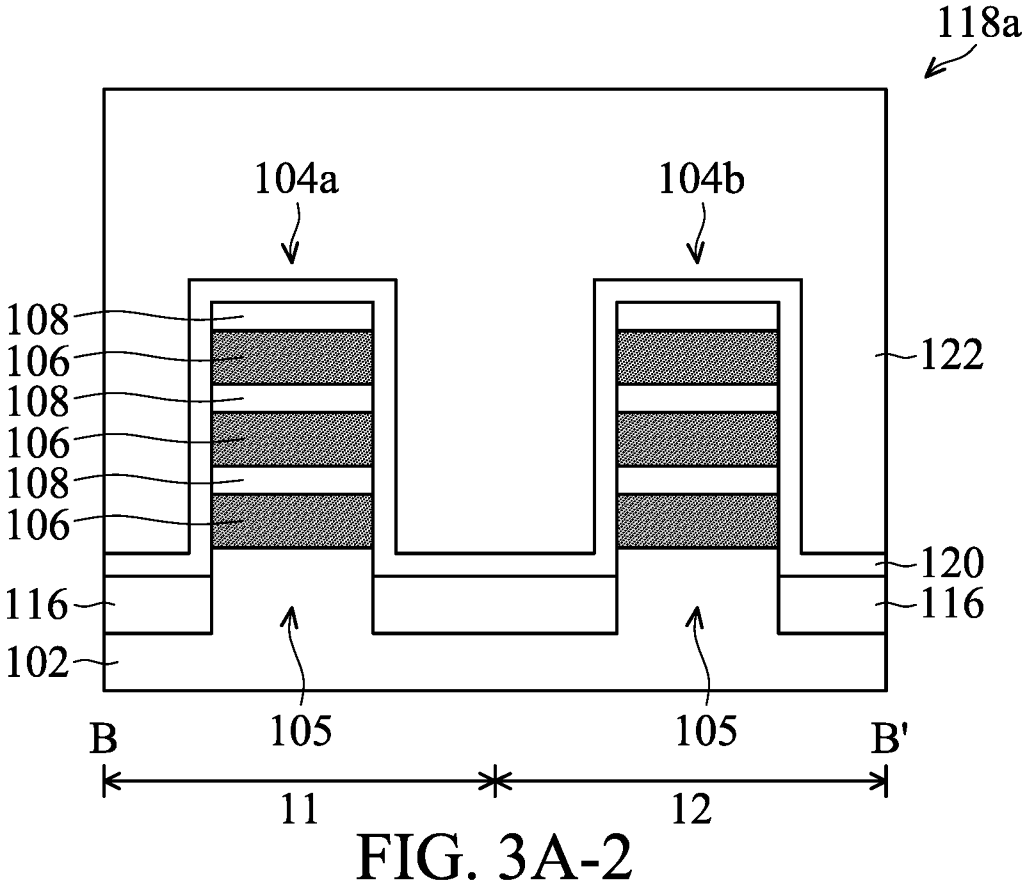
Figures 3, 3A:
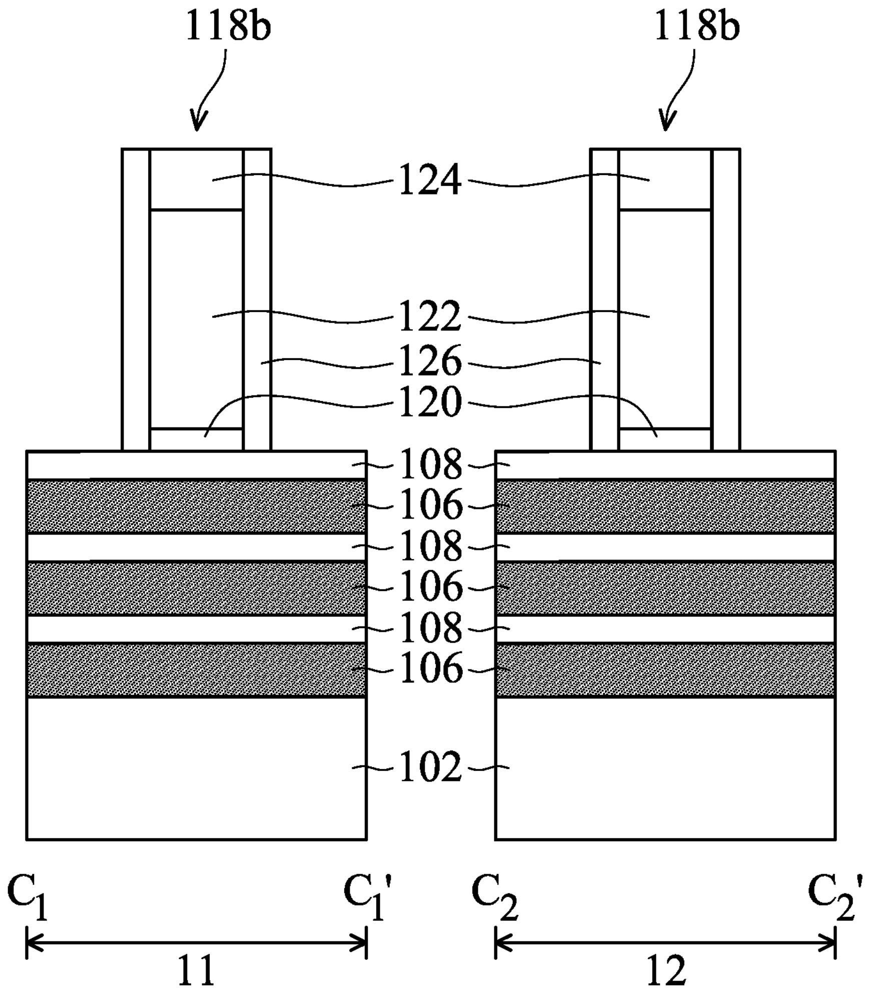
Figures 1, 3B:
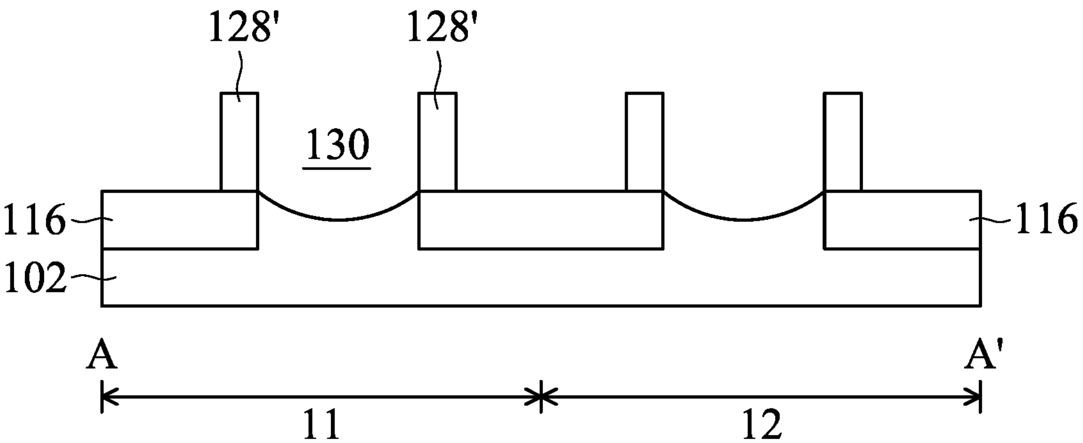
Figures 2, 3B:
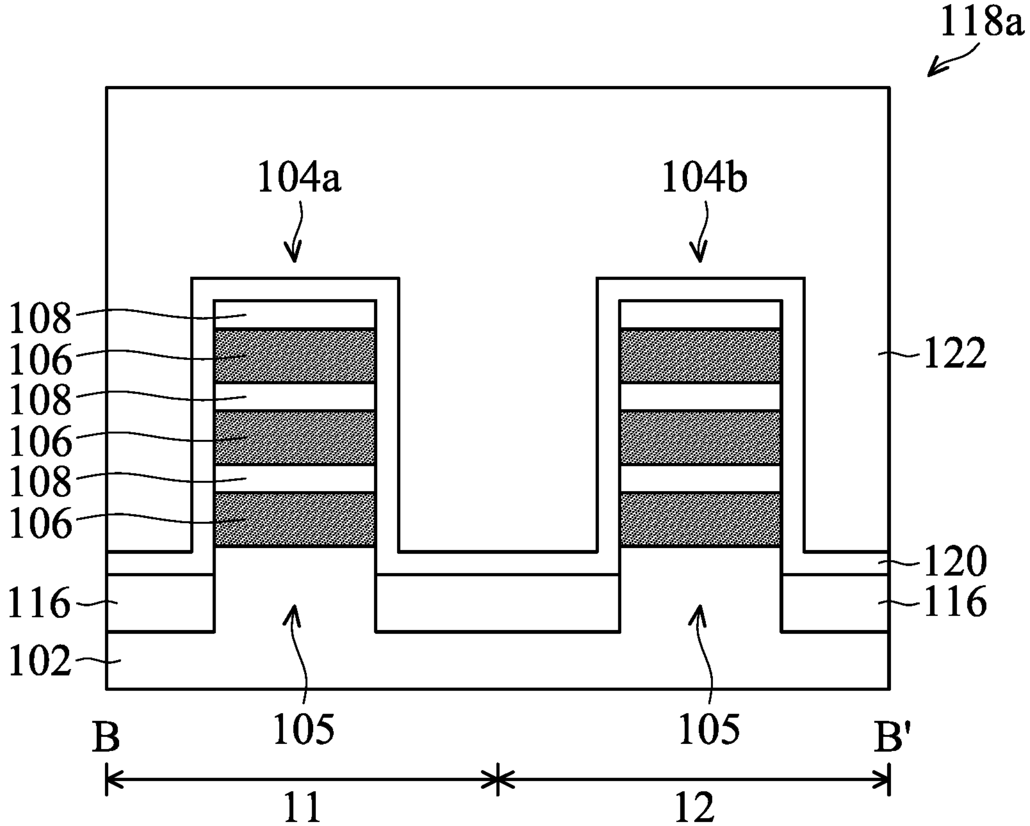
Figures 3, 3B:
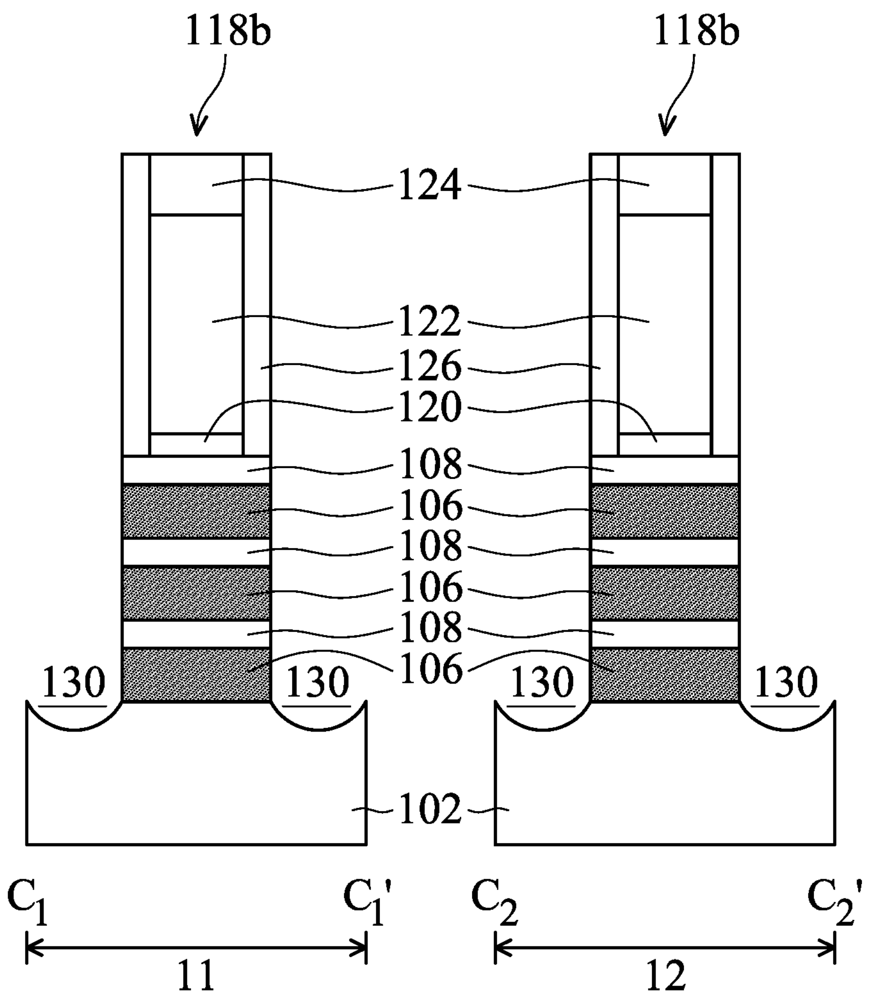
Figures 1, 3C:
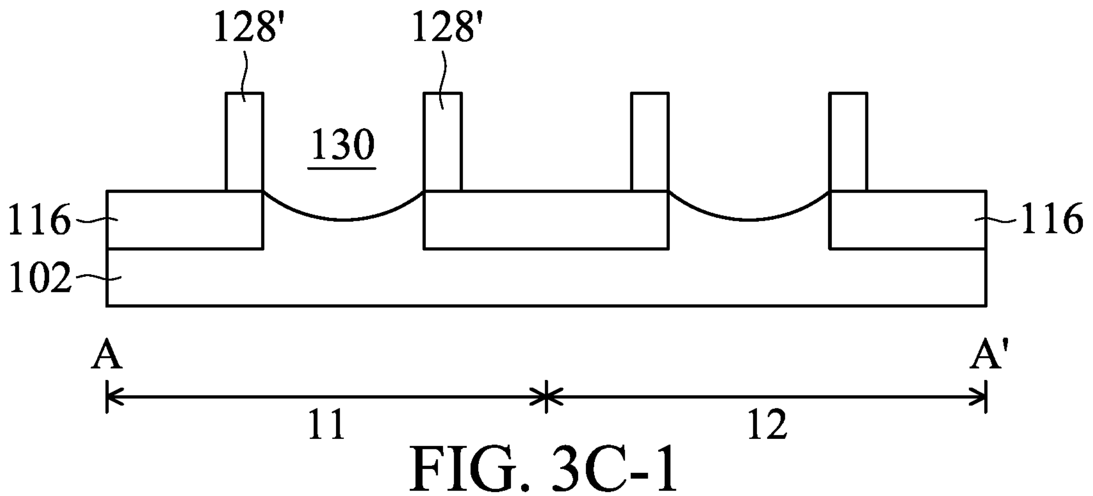
Figures 2, 3C:
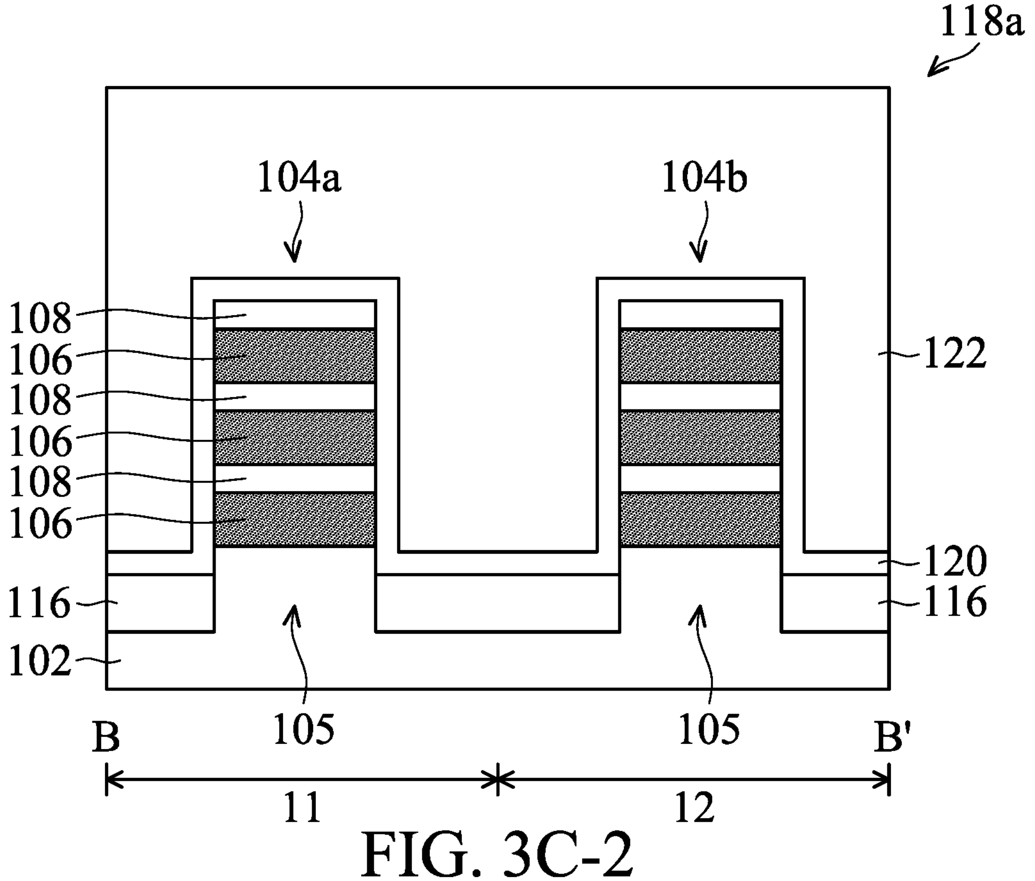
Figures 3, 3C:
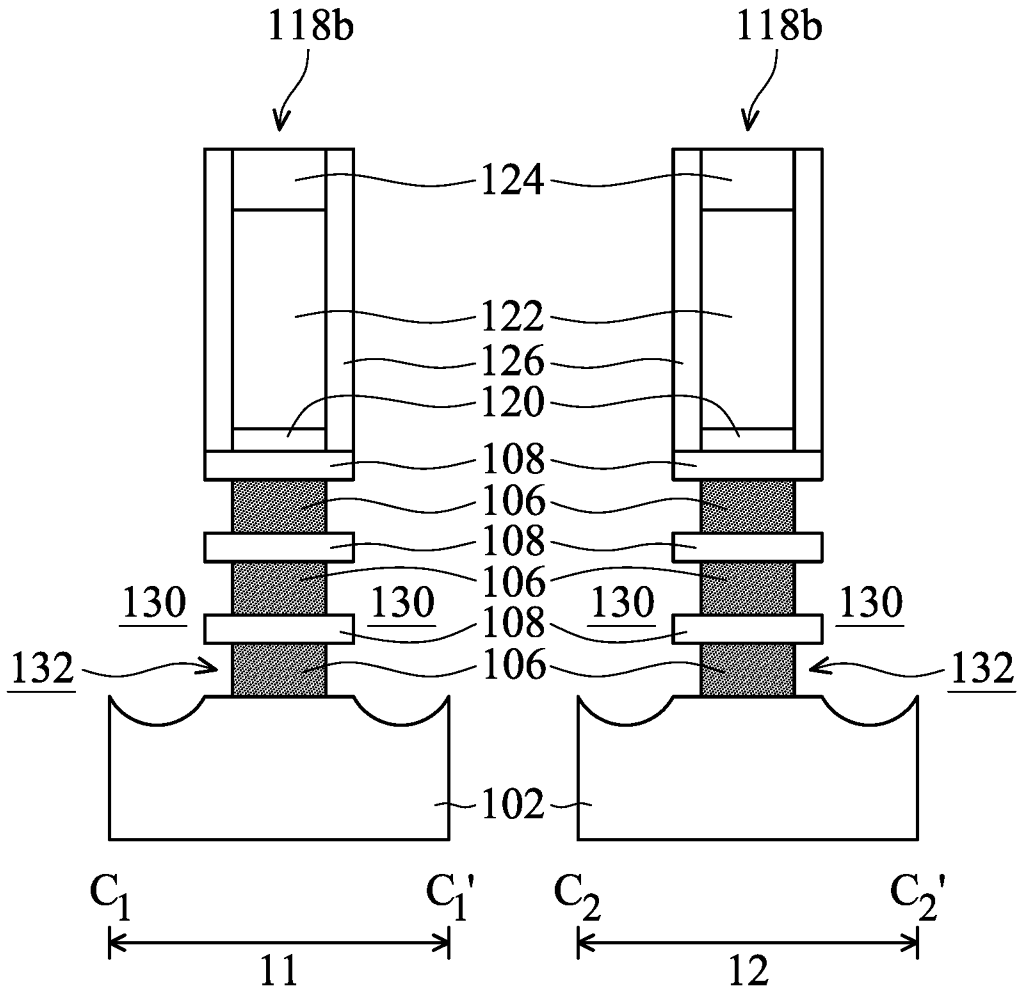
Figures 1, 3D:
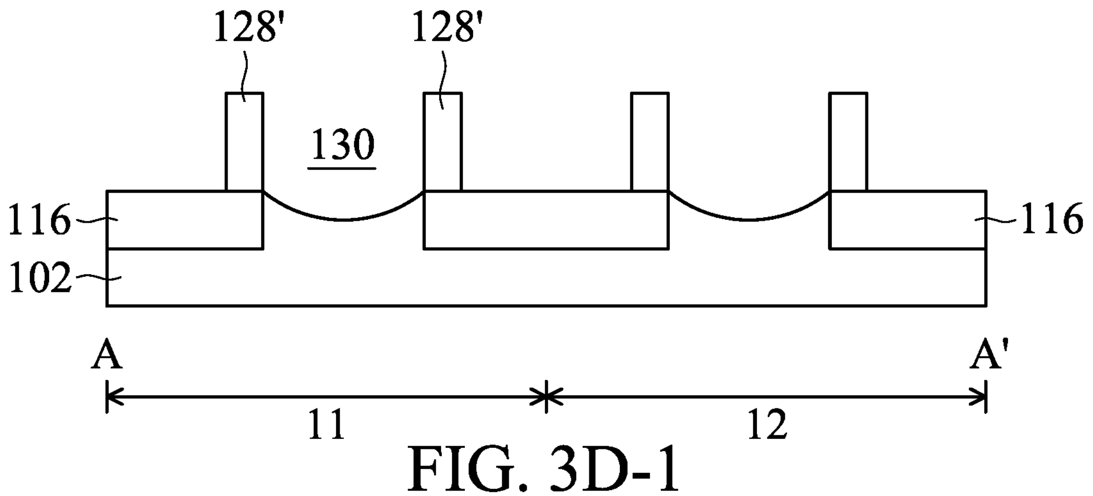
Figures 2, 3D:
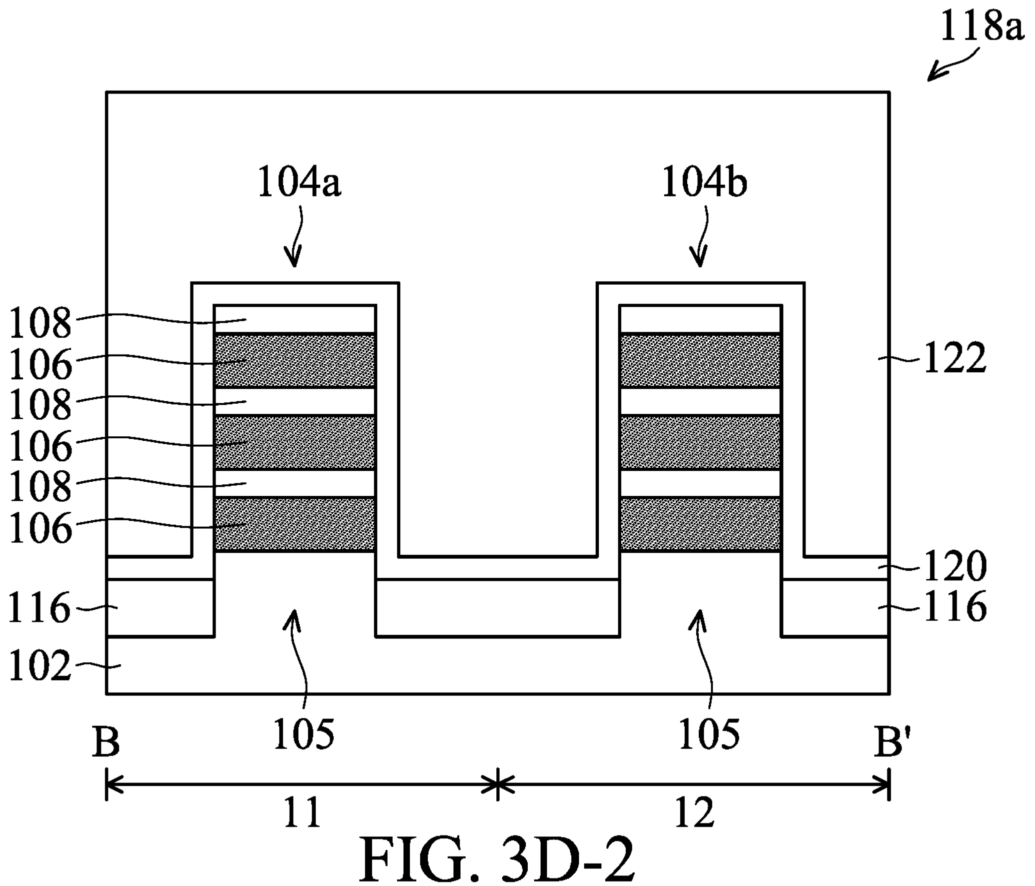
Figures 3, 3D:
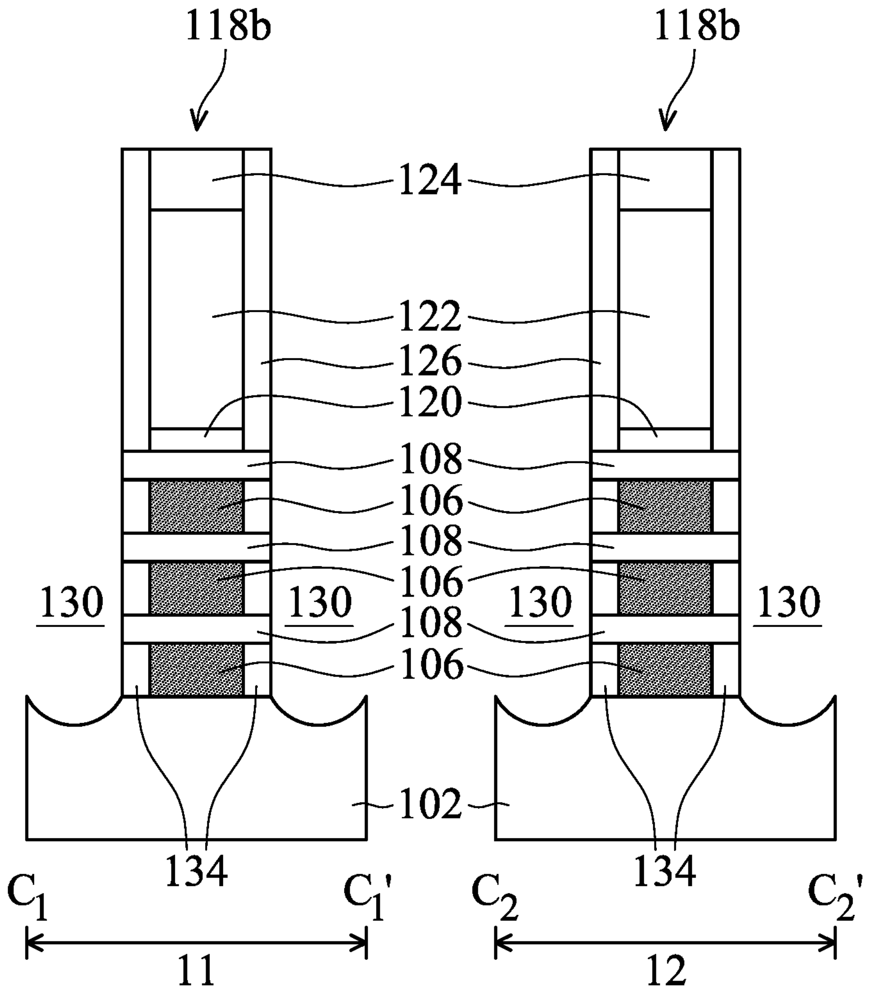
Figures 1, 3E:
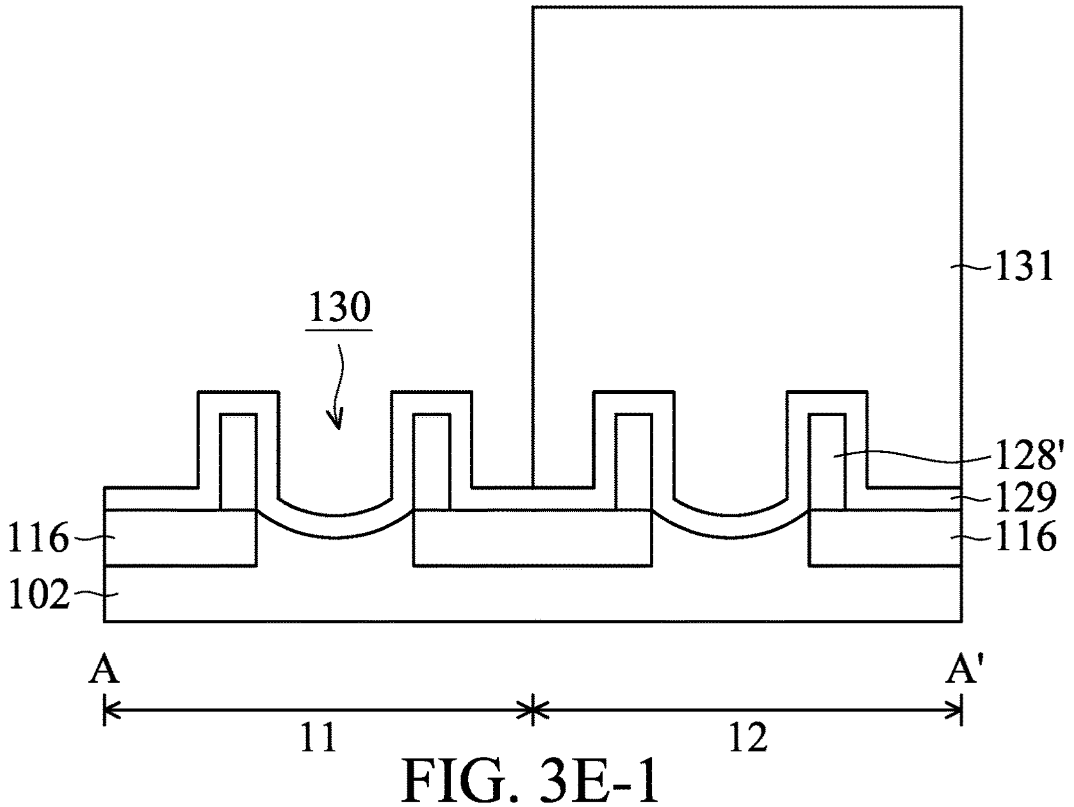
Figures 2, 3E:
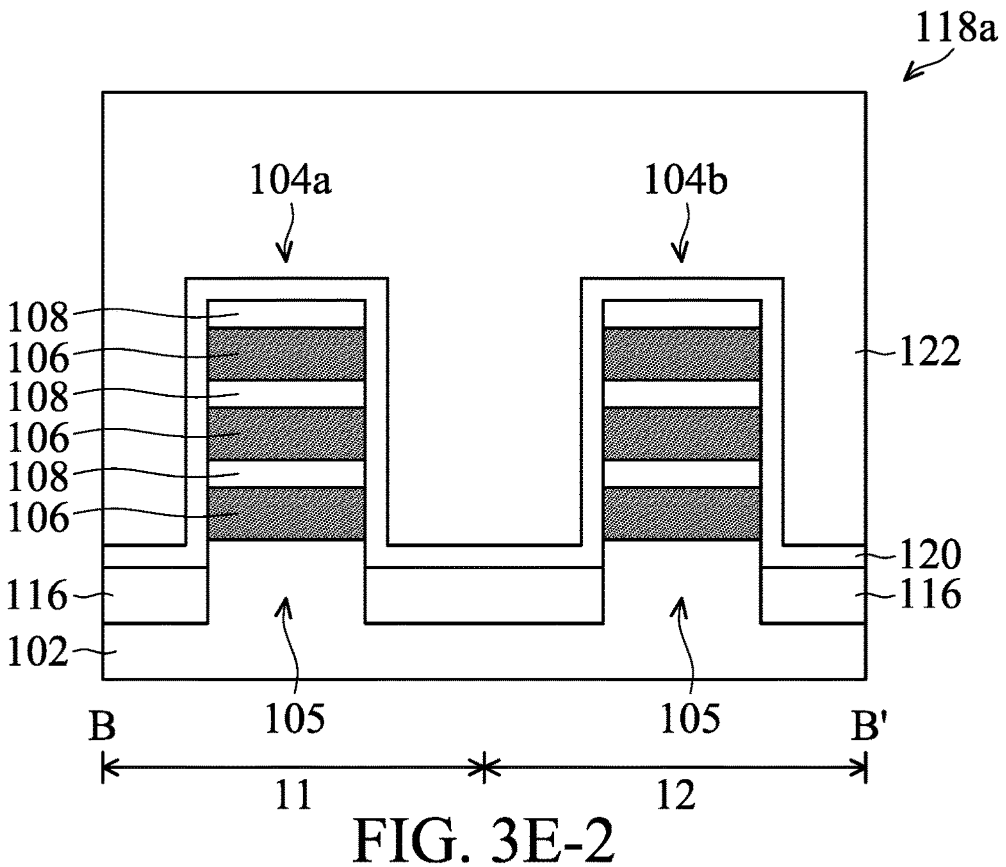
Figures 3, 3E:
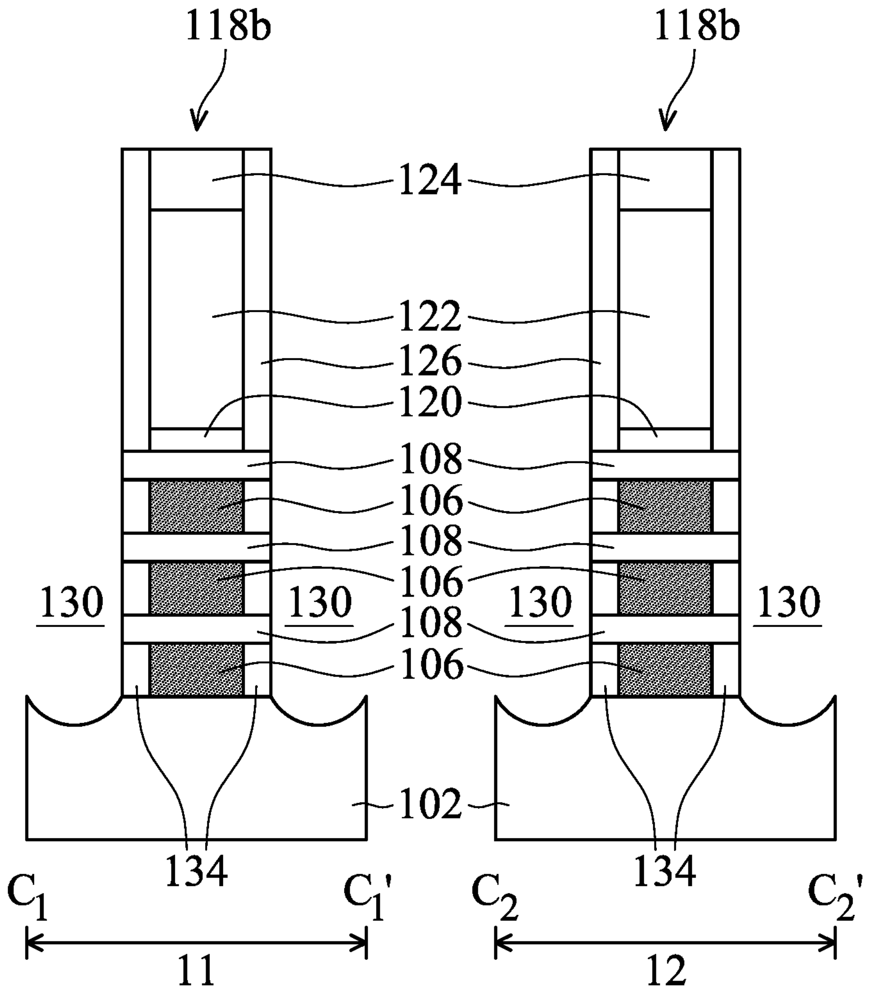
Figures 1, 3F:
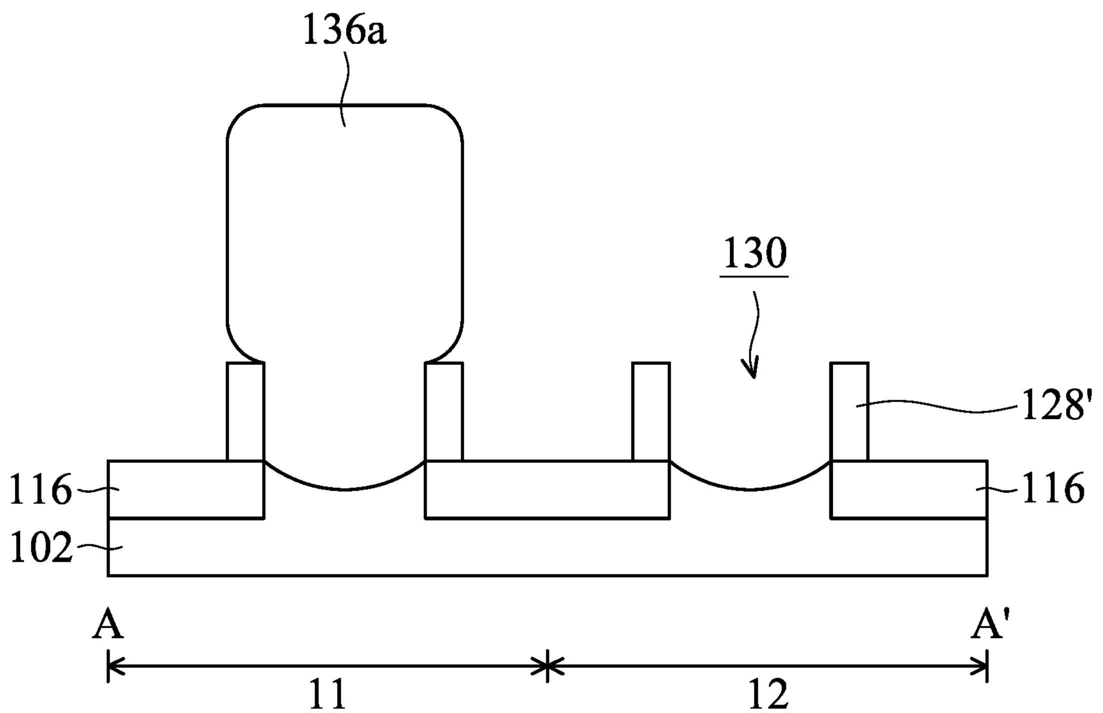
Figures 2, 3F:
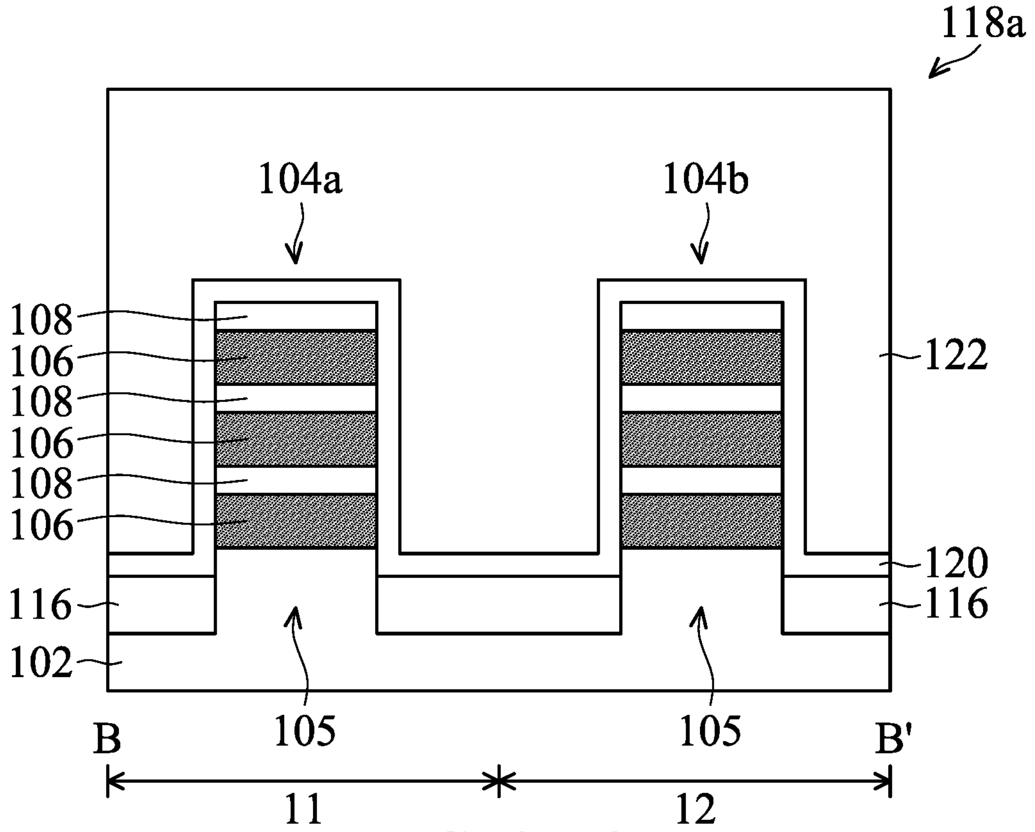
Figures 3, 3F:
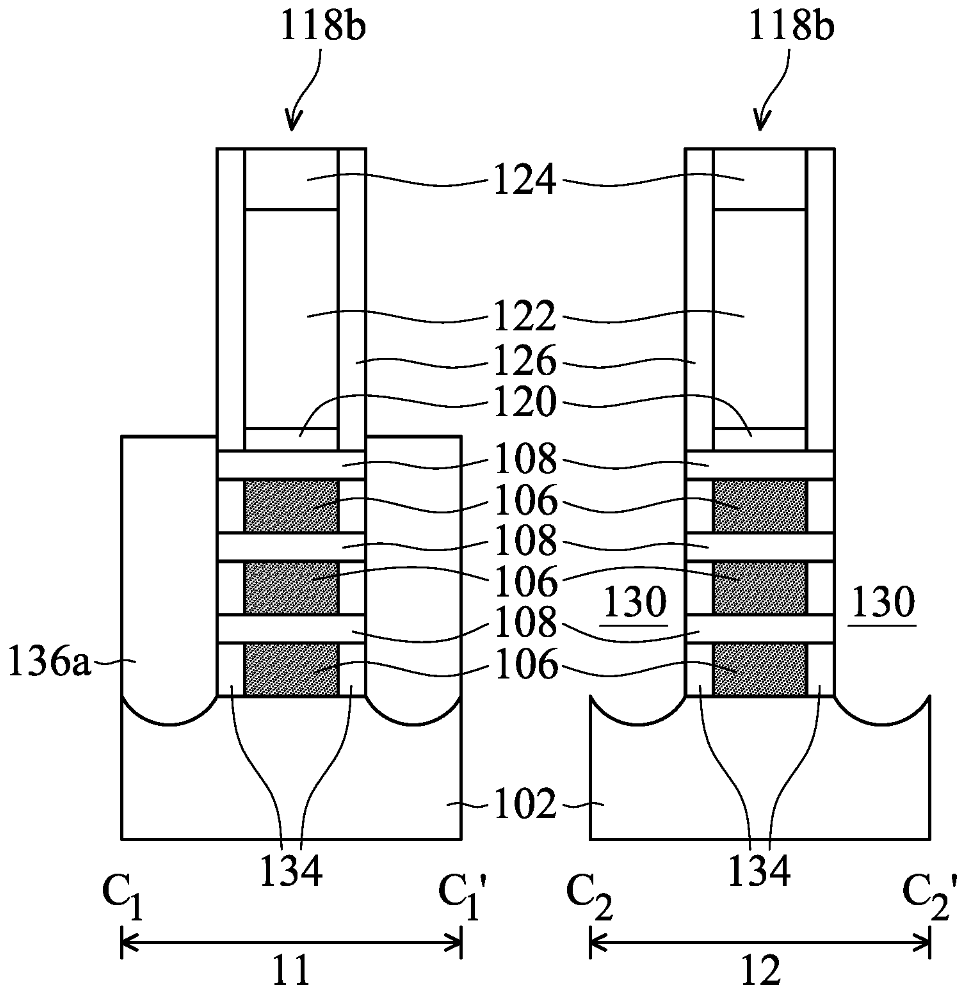
Figures 1, 3G:
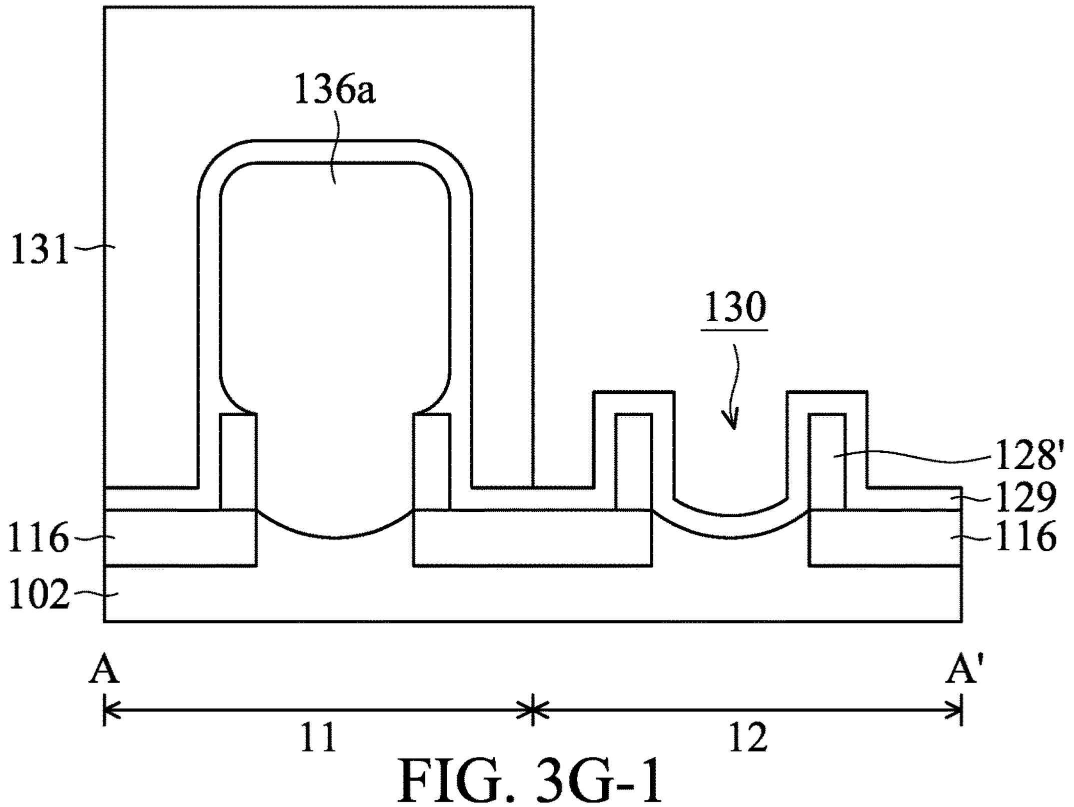
Figures 2, 3G:
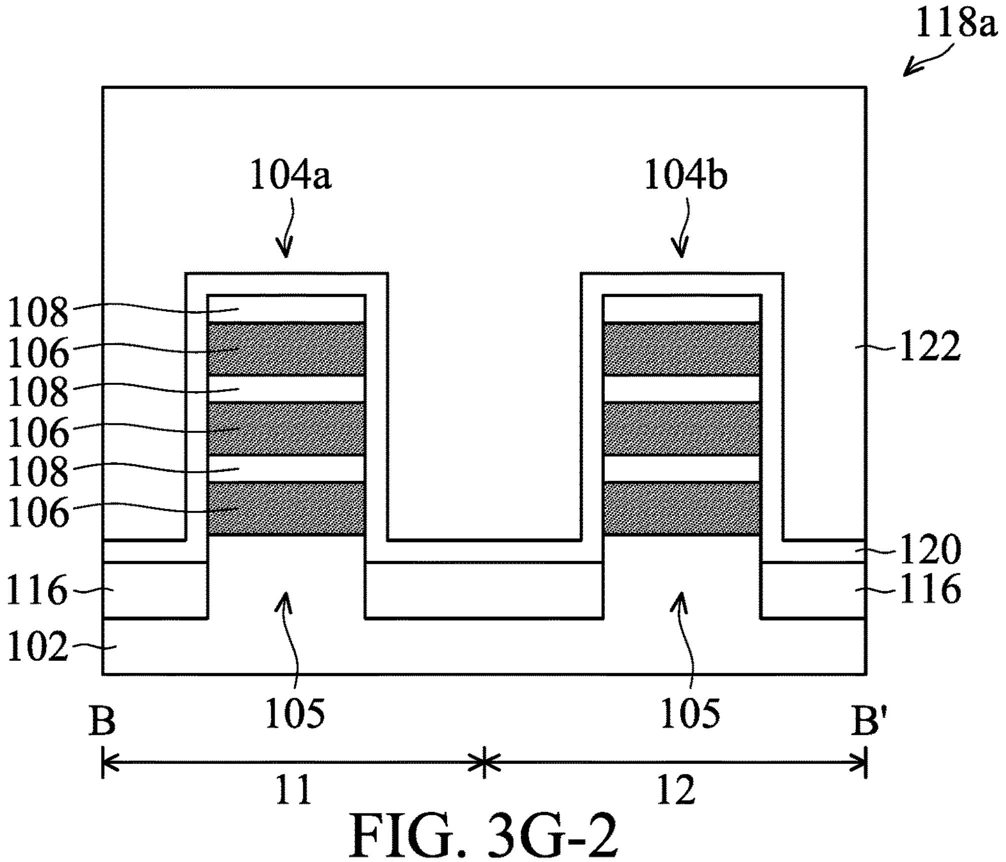
Figures 3, 3G:
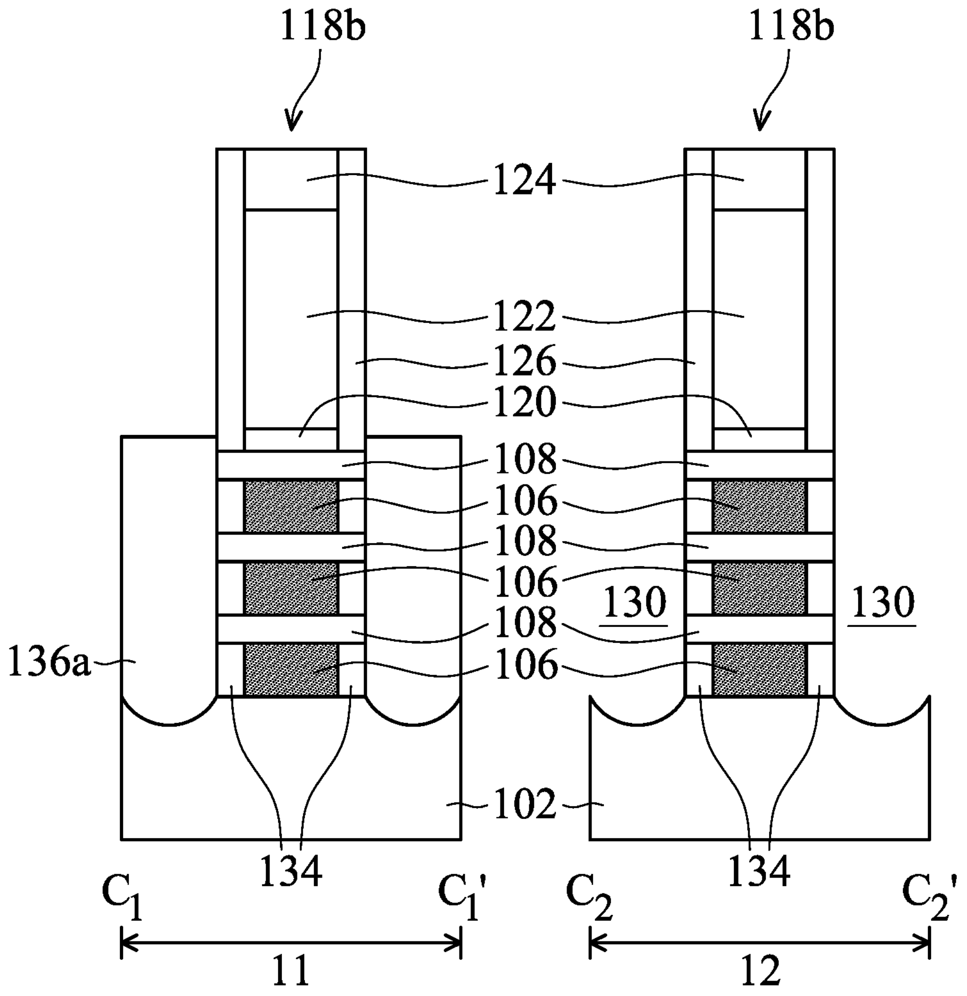
Figures 1, 3H:
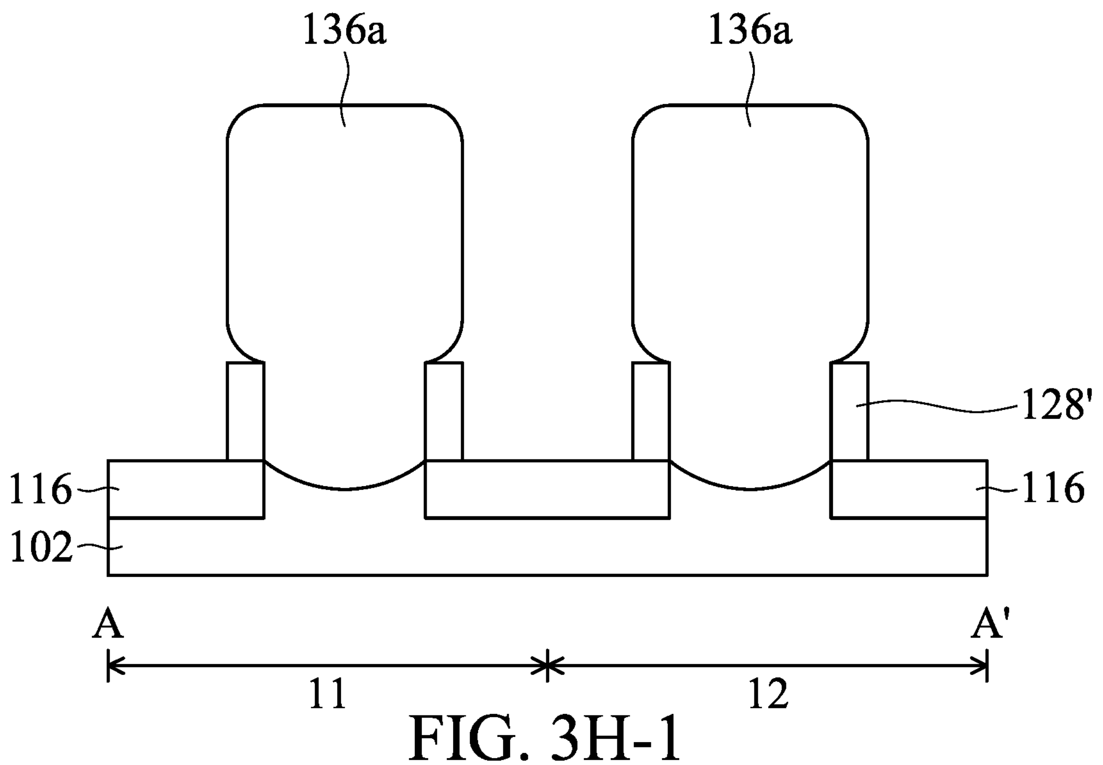
Figures 2, 3H:
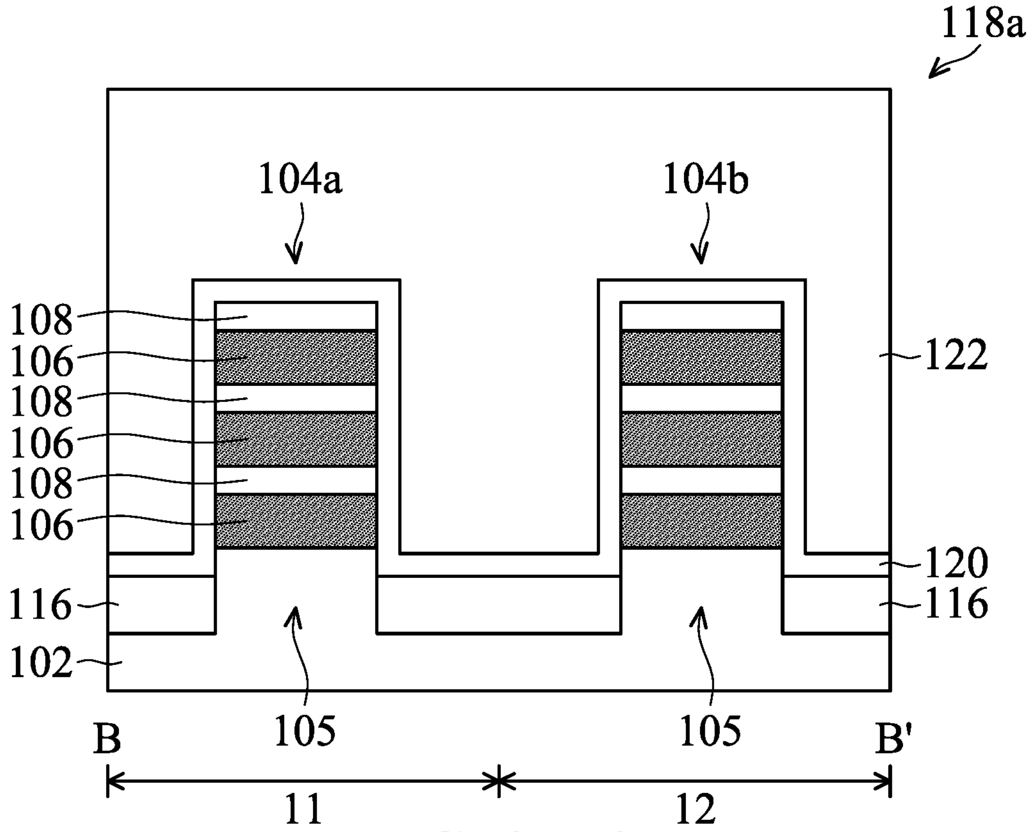
Figures 3, 3H:
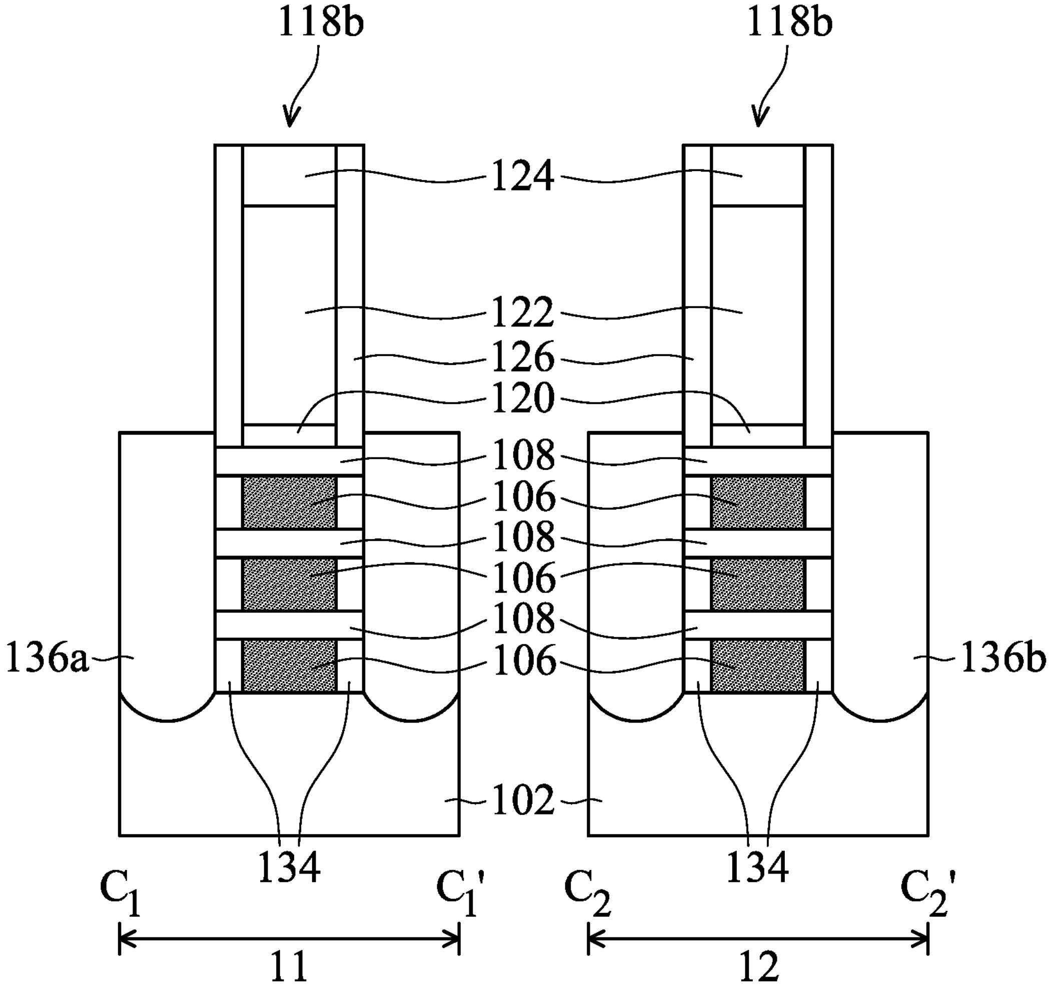
Figures 1, 3I:
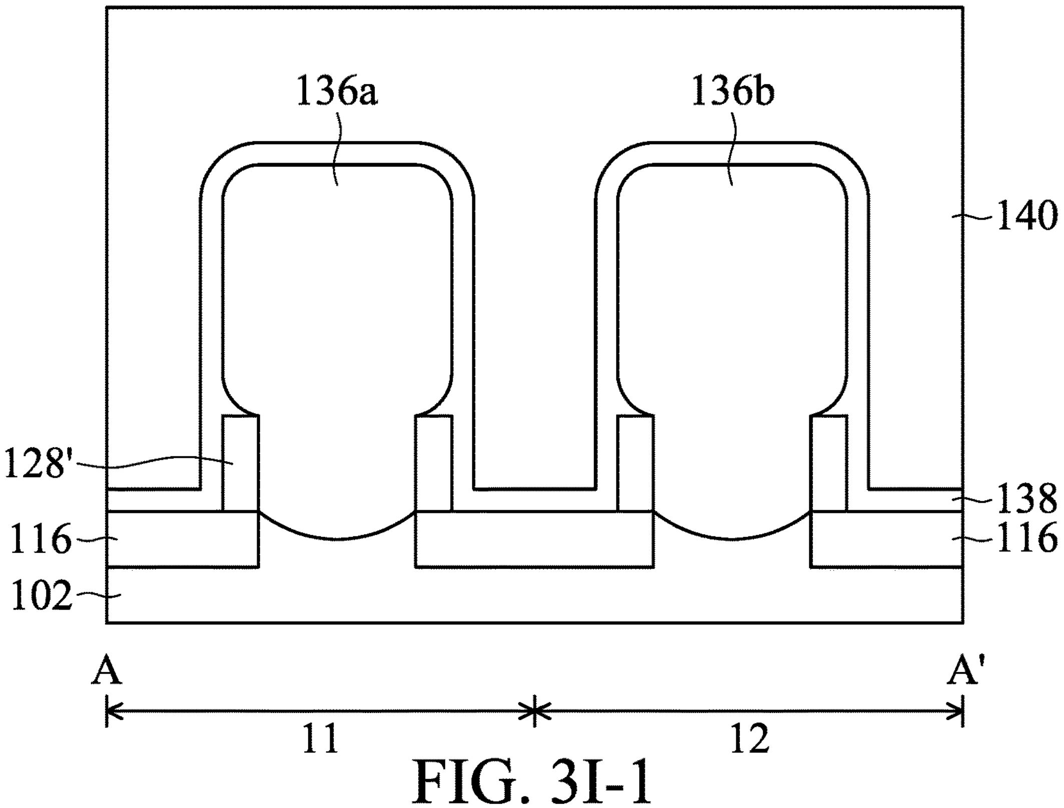
Figures 2, 3I:
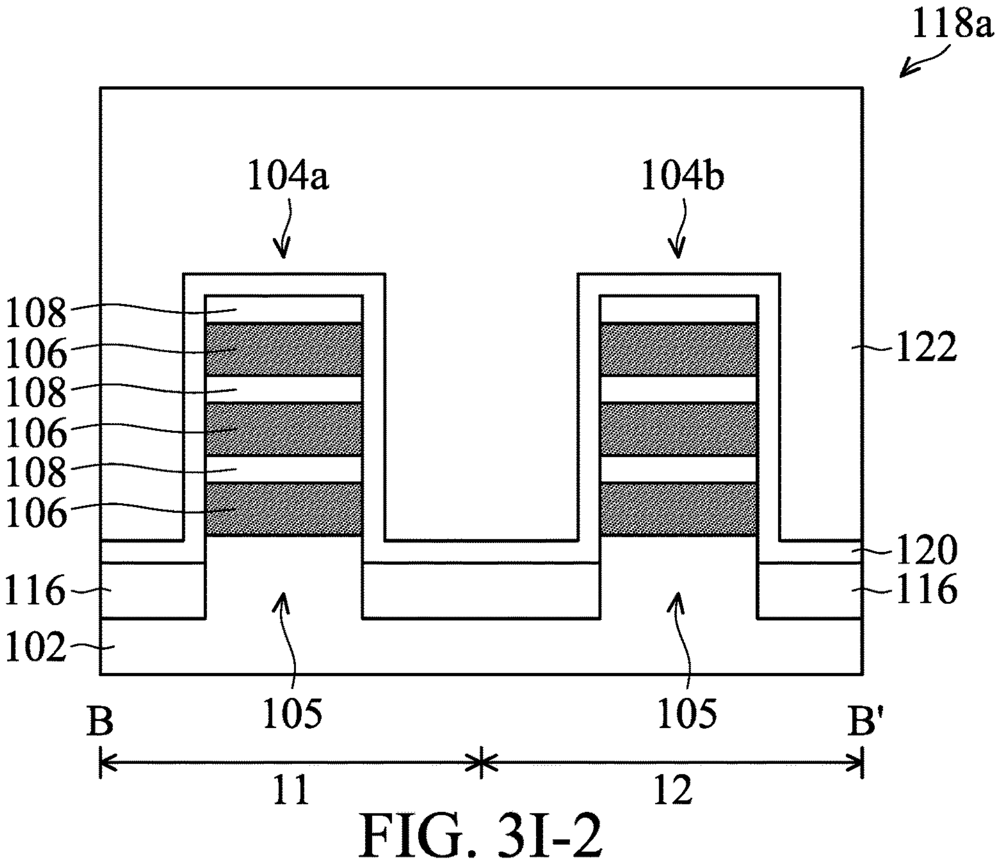
Figures 3, 3I:
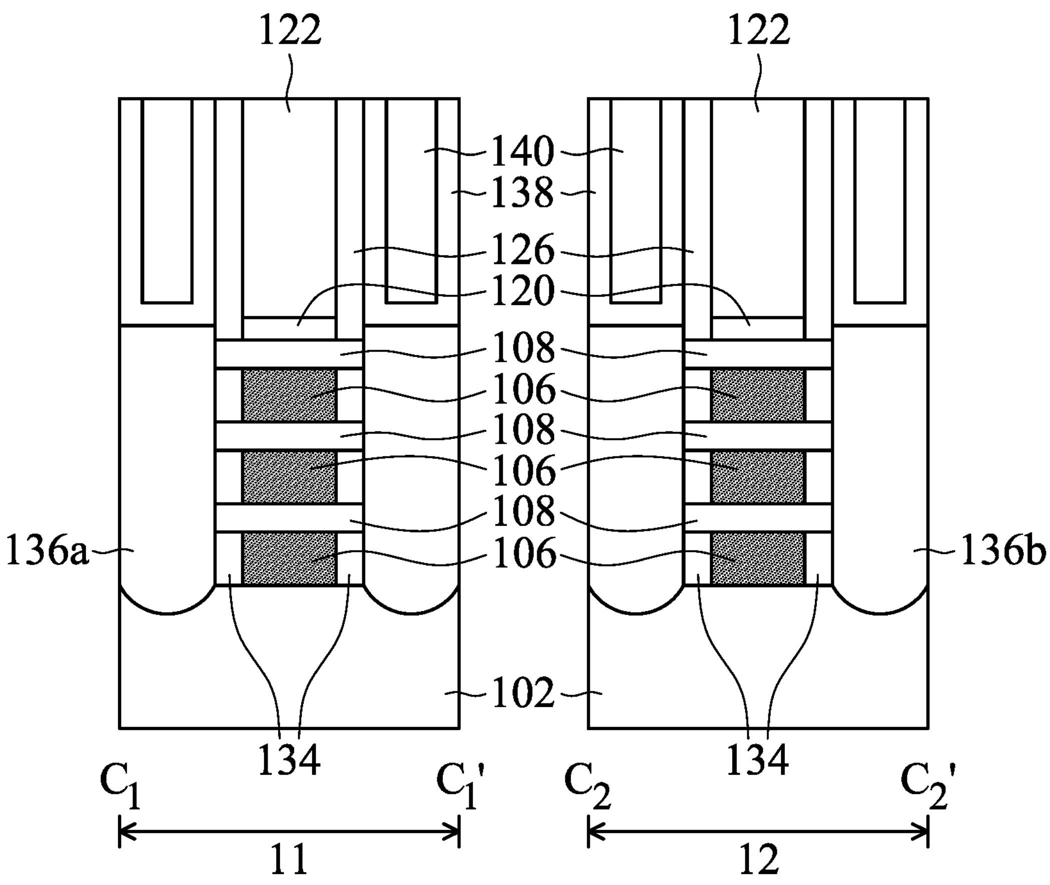
Figures 1, 3J:
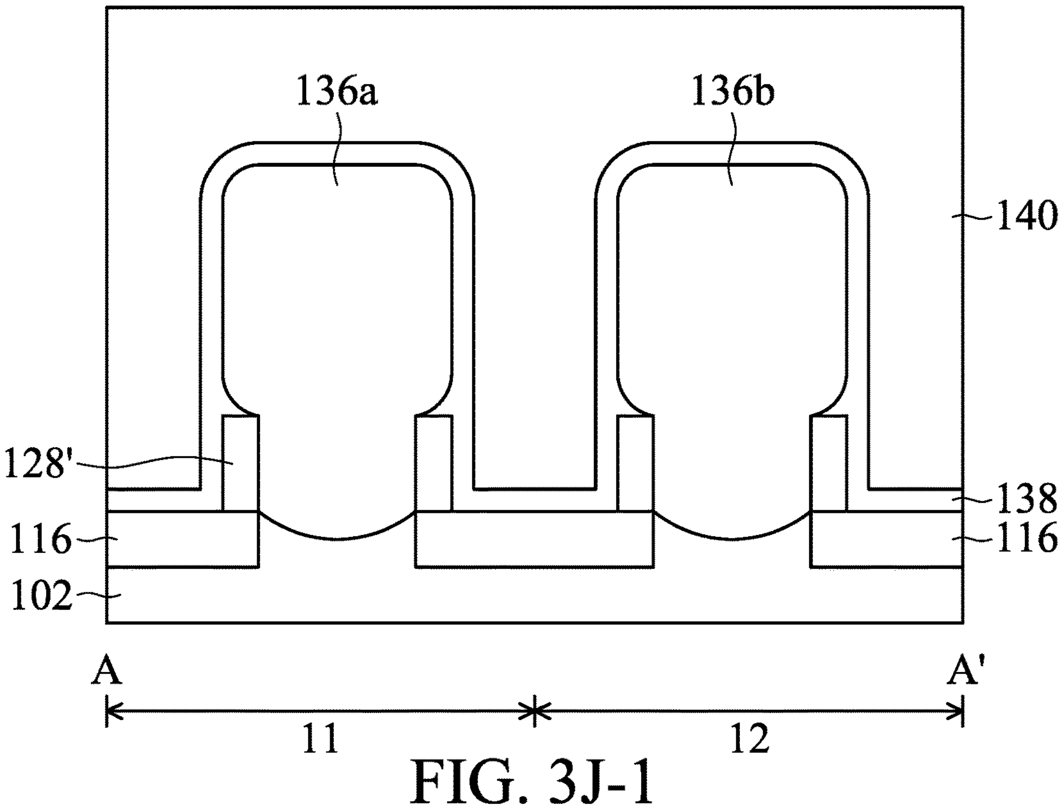
Figures 2, 3J:
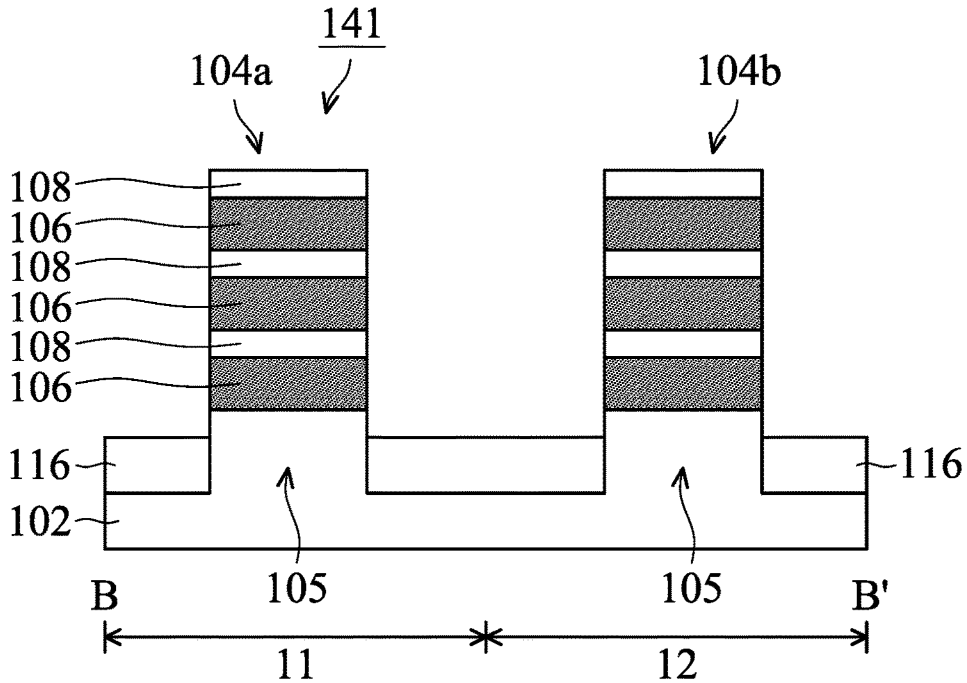
Figures 3, 3J:
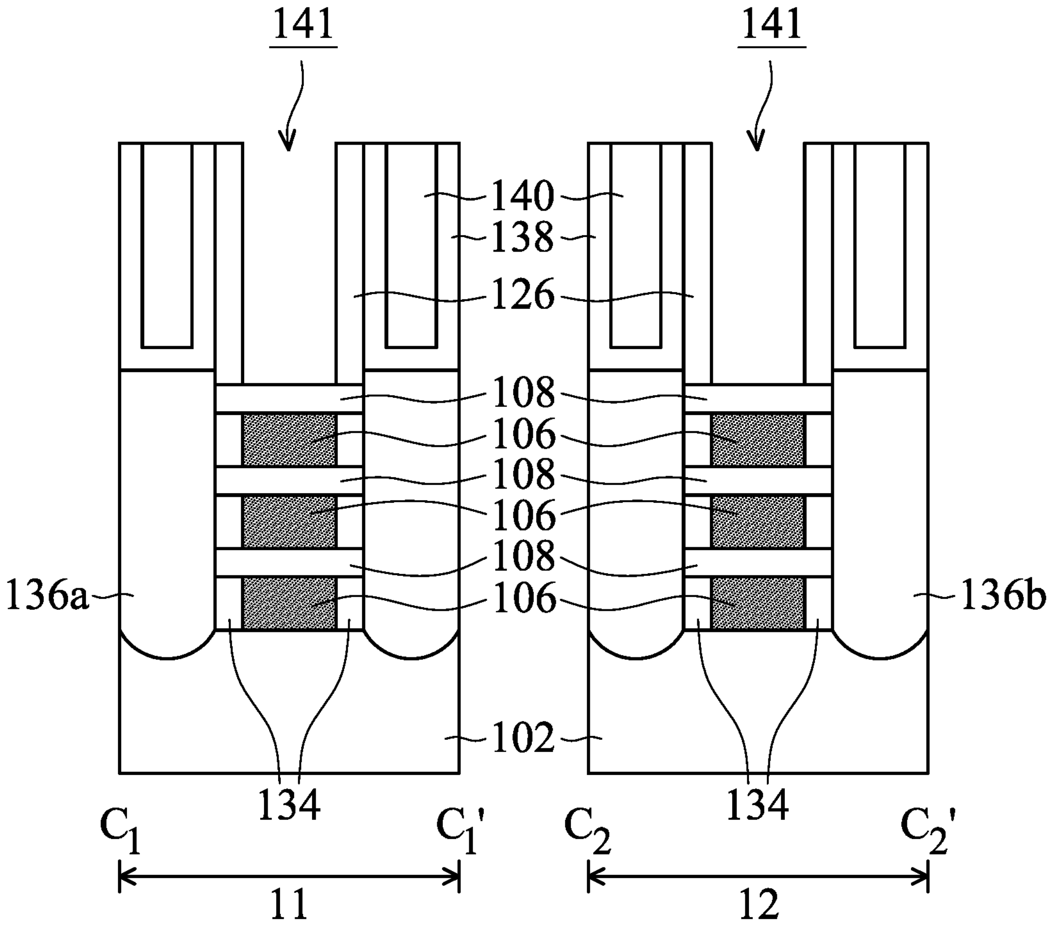
Figures 1, 3K:
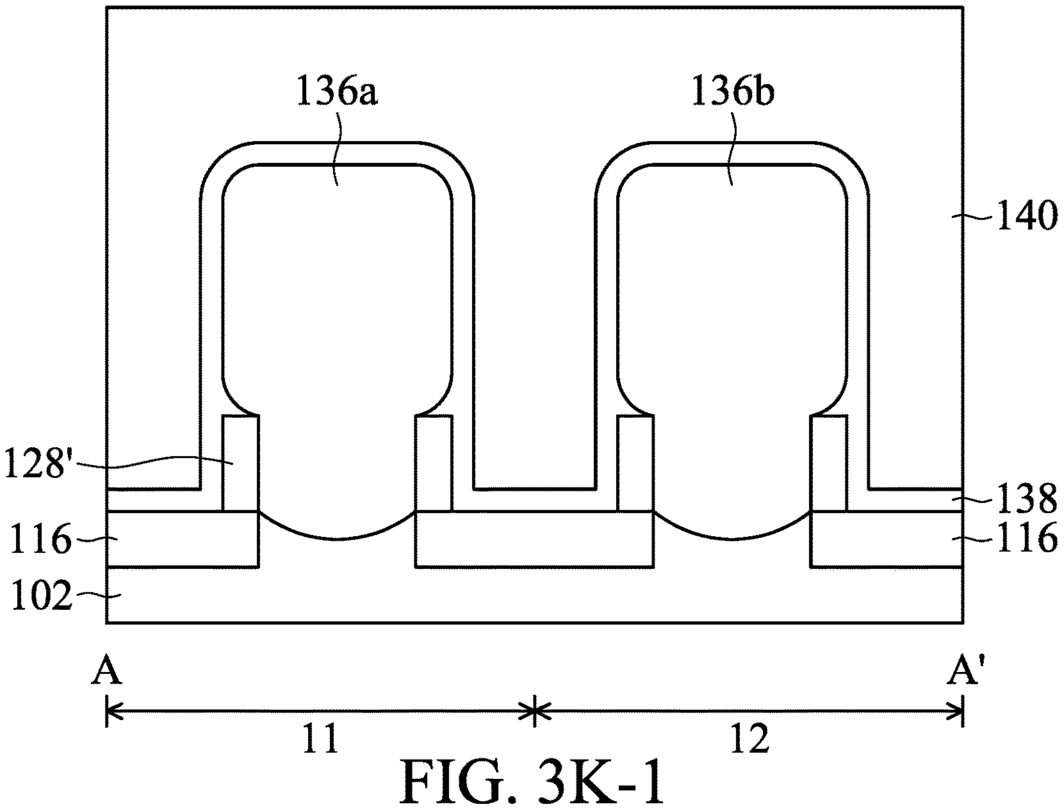
Figures 2, 3K:
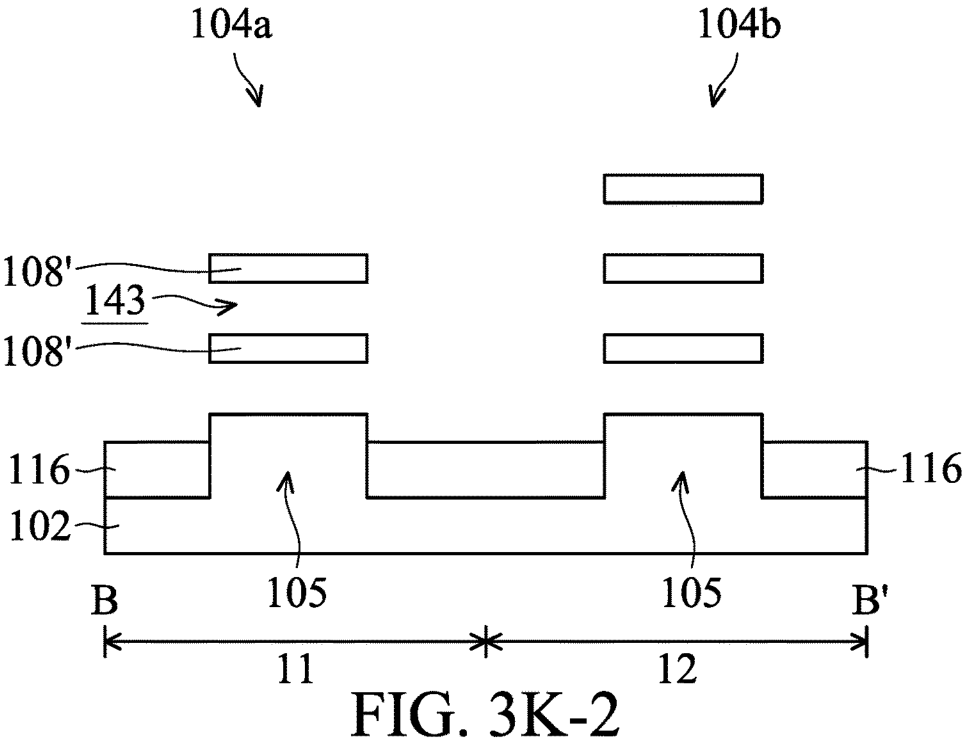
Figures 3, 3K:
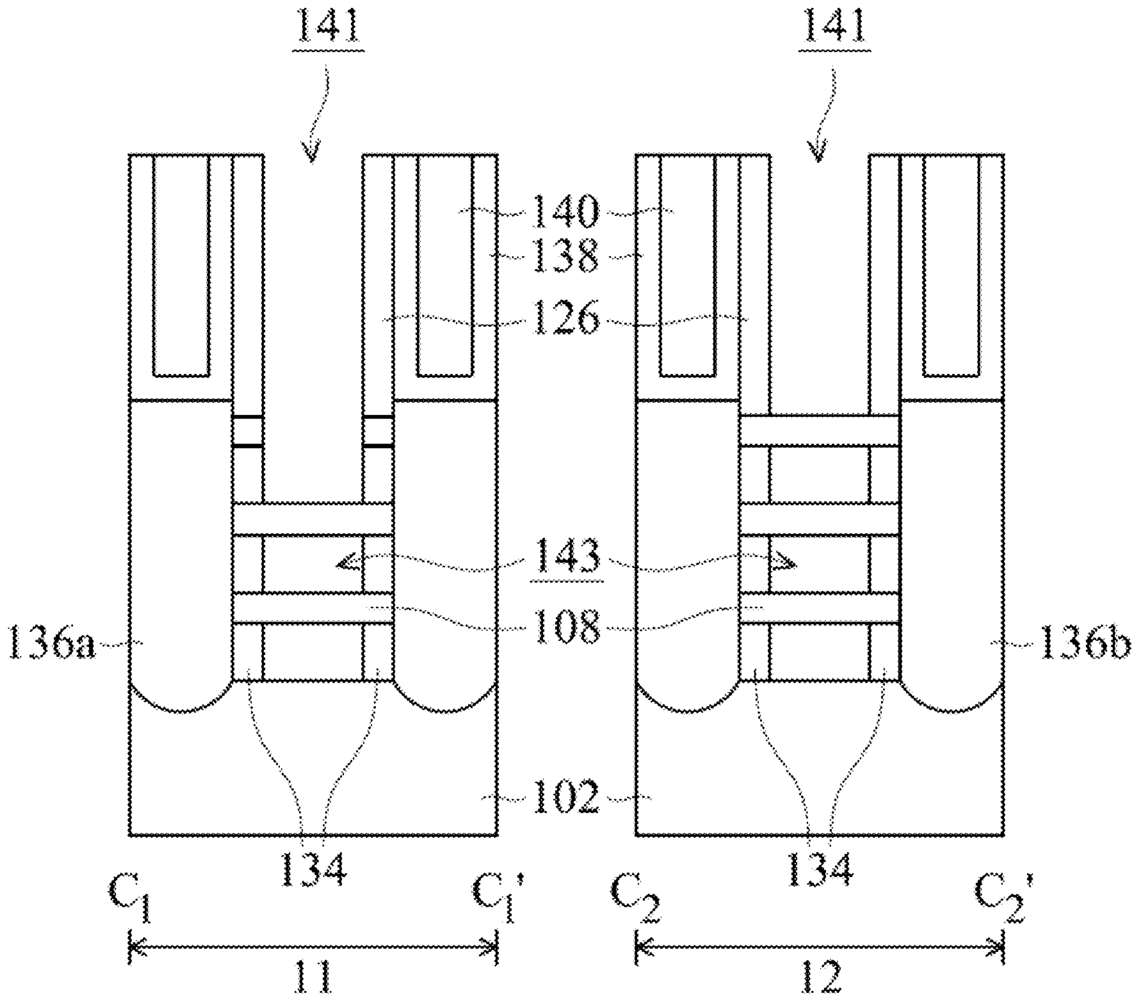
Figures 1, 3L:
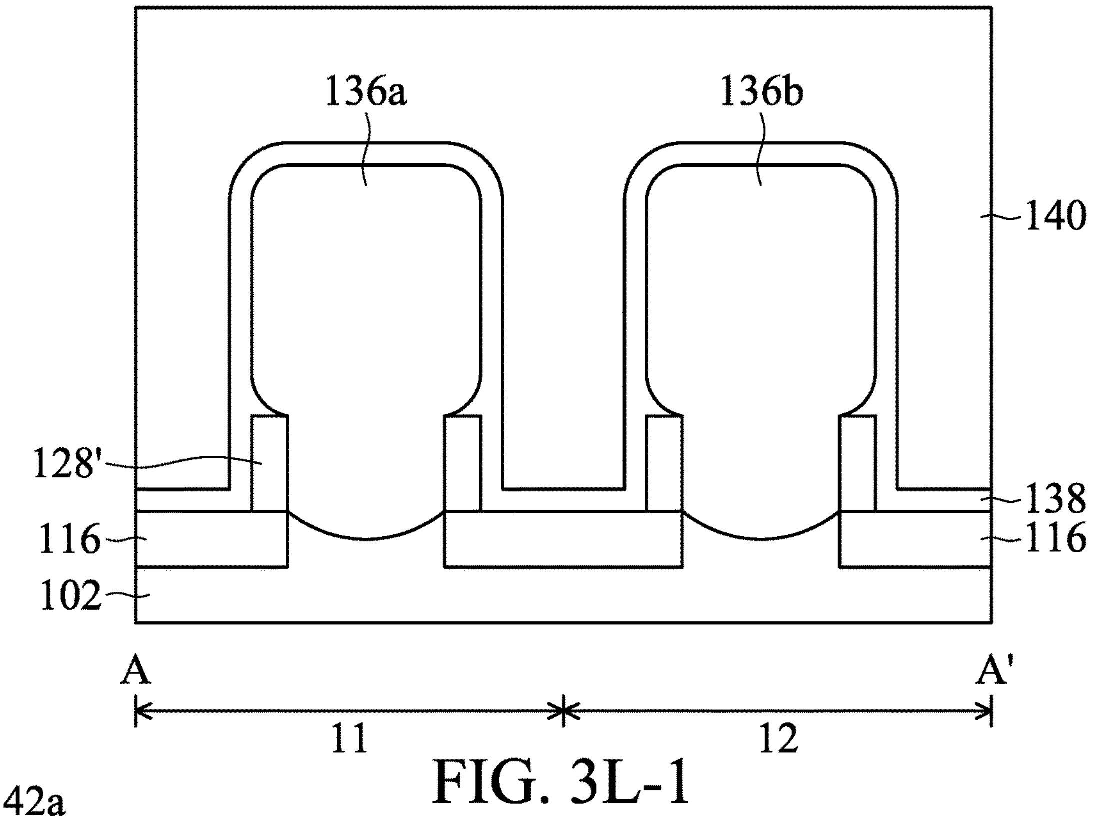
Figures 2, 3L:
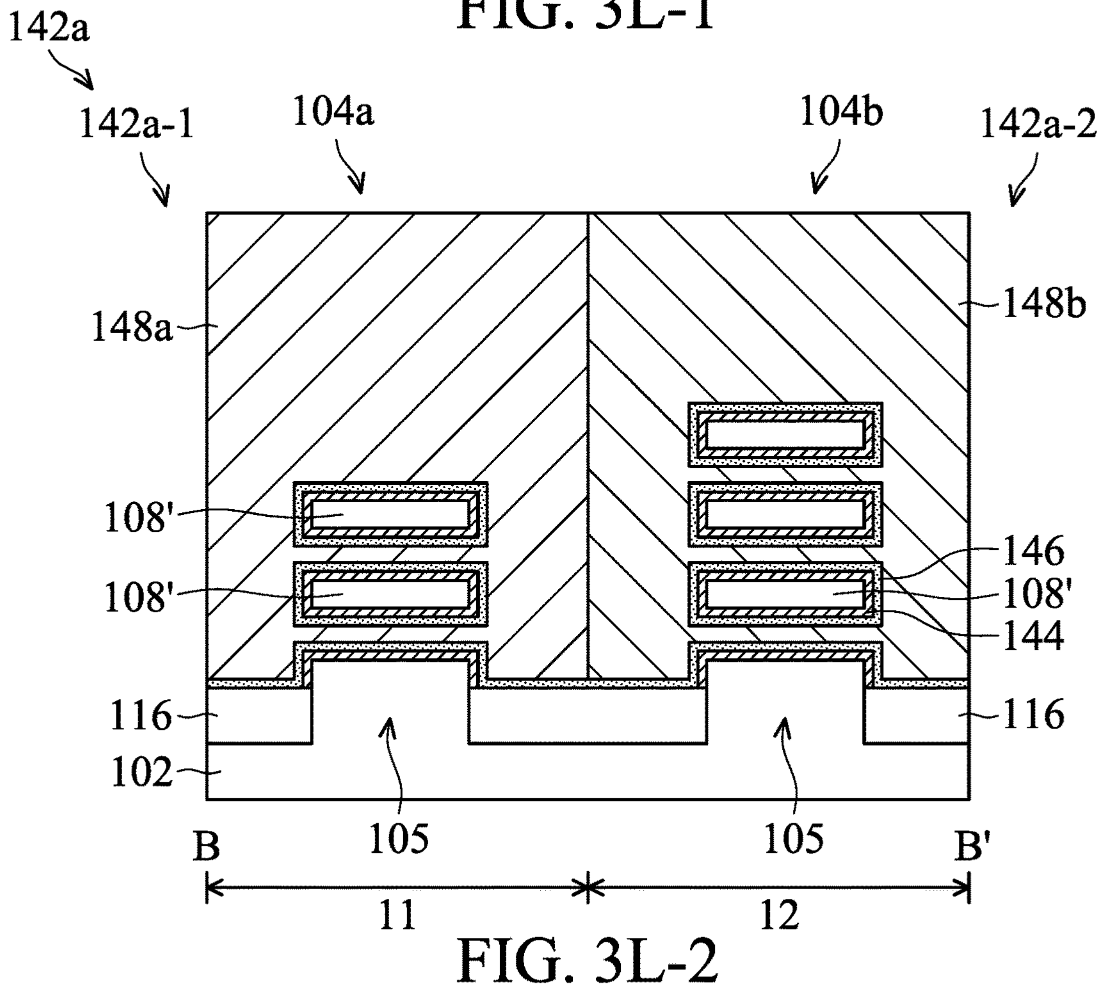
Figures 3, 3L:
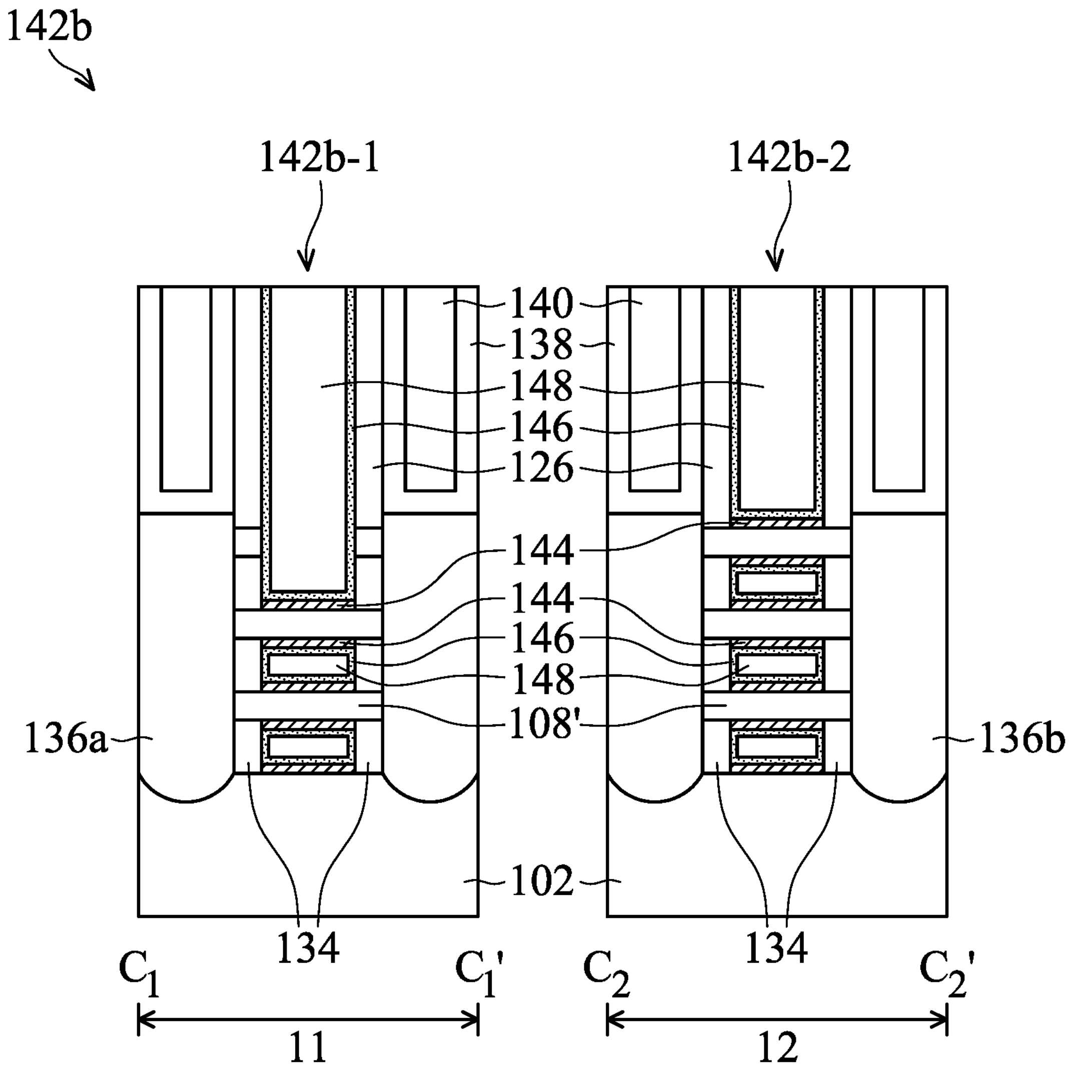
Figures 1, 3M:
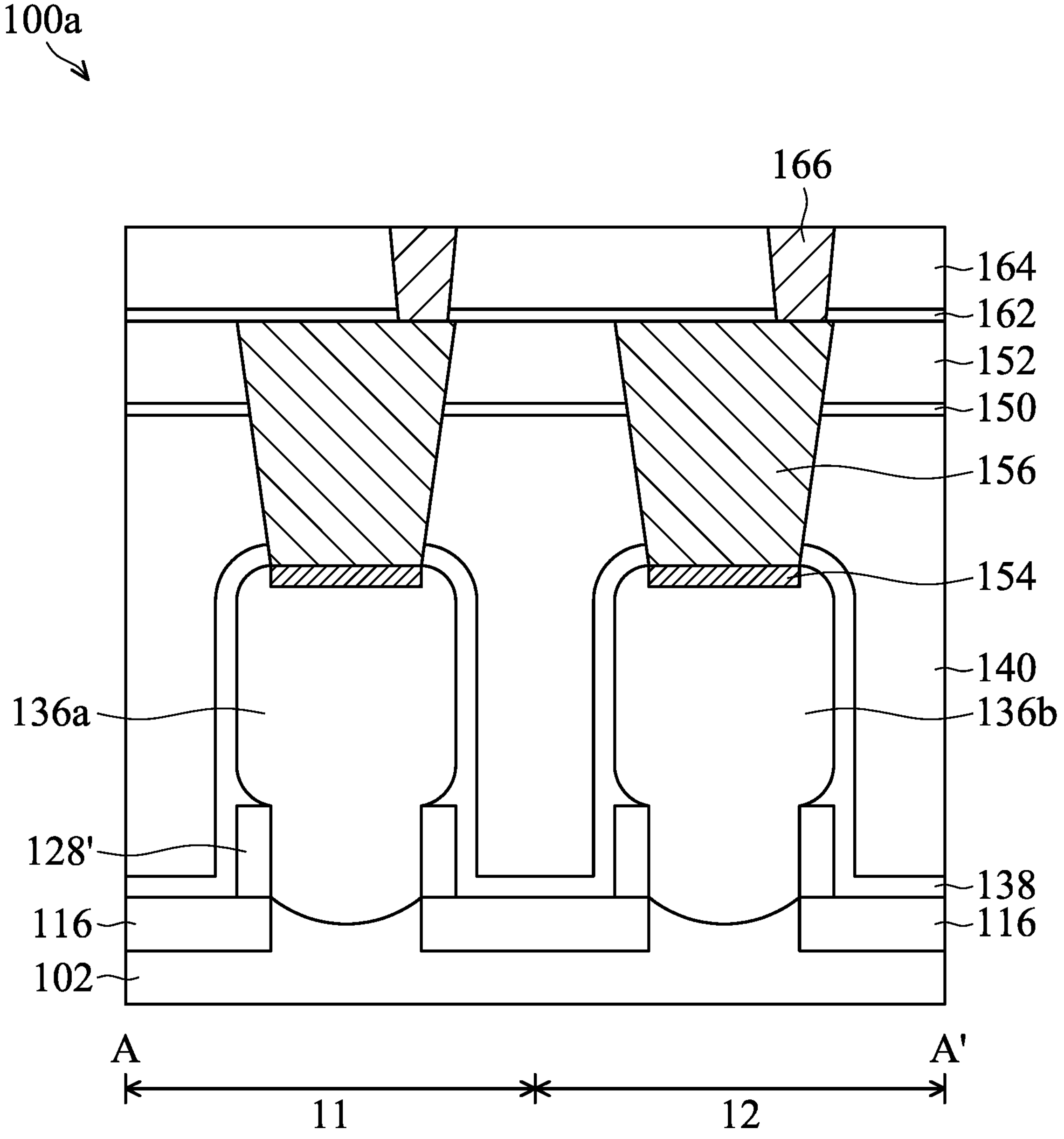
Figures 2, 3M:
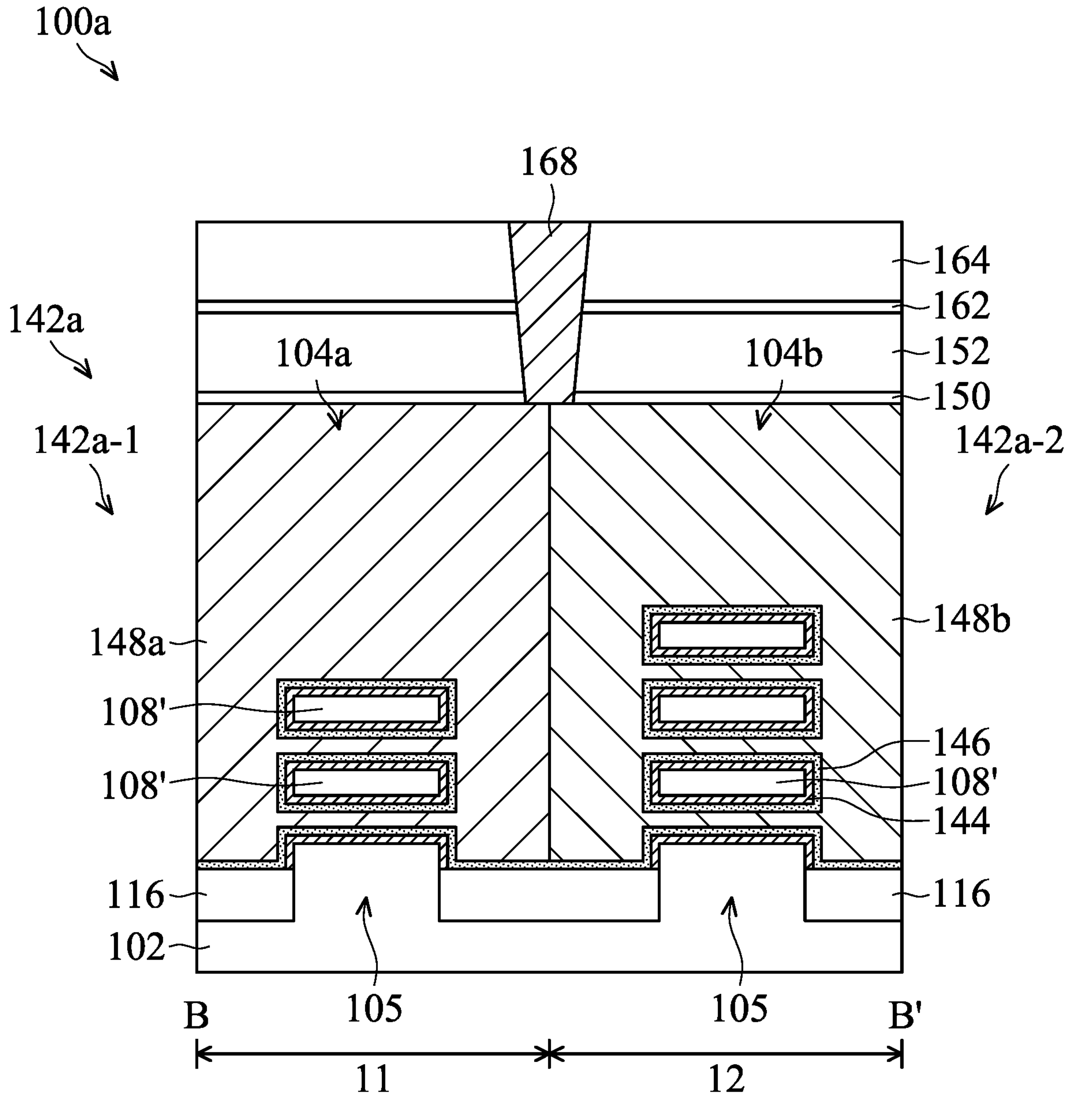
Figures 3, 3M:
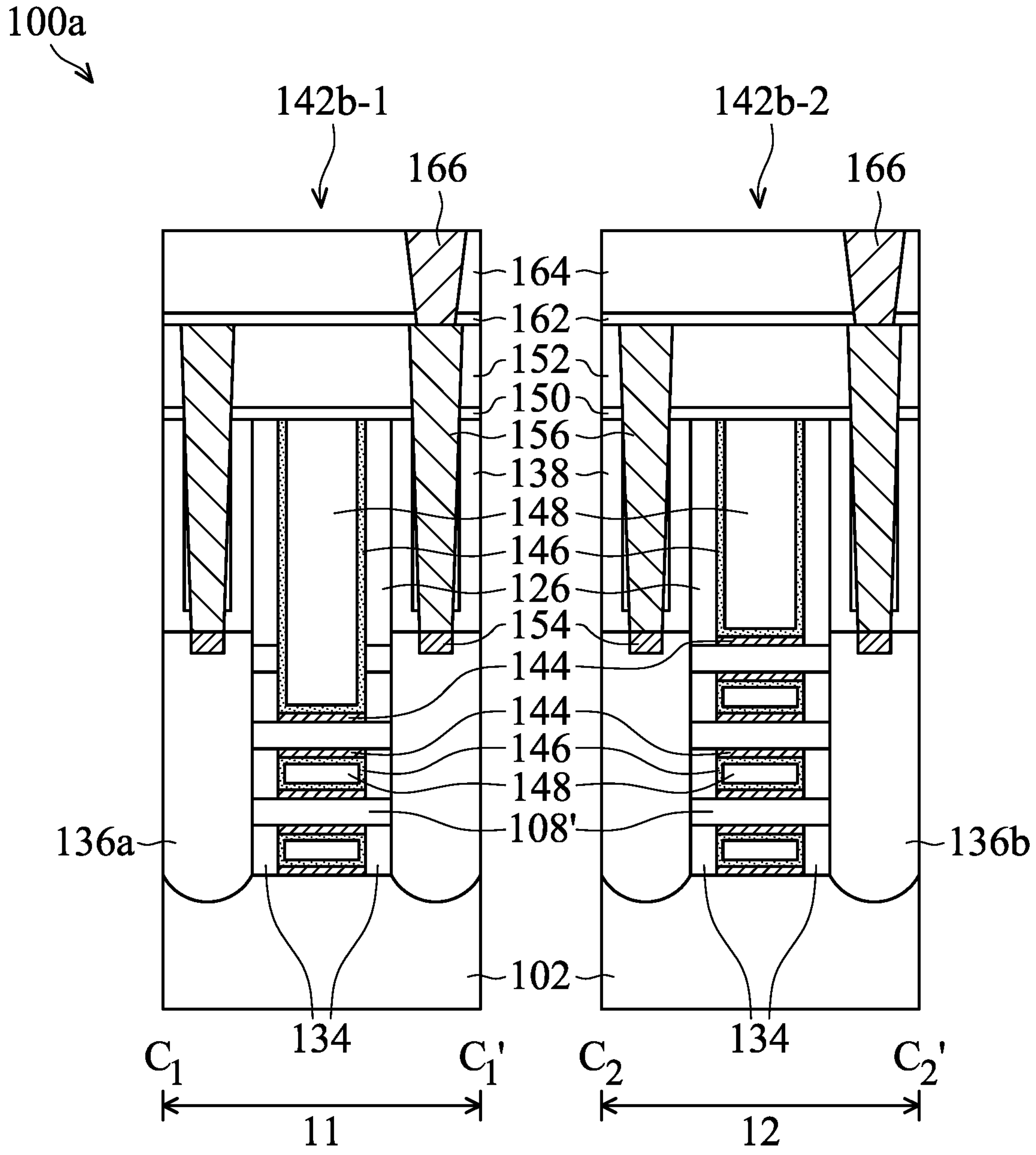

FIGS. 3A-1 to 3M-1 illustrate cross-sectional representations of various stages of manufacturing the semiconductor structure 100*a* shown along line A-A' in FIG. 1E and in FIG. 2, in accordance with some embodiments. FIGS. 3A-2 to 3M-2 illustrate cross-sectional representations of various stages of manufacturing the semiconductor structure 100*a* shown along line B-B' in FIG. 1E and in FIG. 2, in accordance with some embodiments. FIGS. 3A-3 to 3M-3 illustrate cross-sectional representations of various stages of manufacturing the semiconductor structure 100*a* shown along line $C_1$-$C_1$' and $C_2$-$C_2$' in FIG. 1E and in FIG. 2, in accordance with some embodiments.

More specifically, FIG. 3A-1 illustrates the cross-sectional representation shown along line A-A" in FIG. 1E and FIG. 2. FIG. 3A-2 illustrates the cross-sectional representation shown along line B-B' in FIG. 1E and FIG. 2 in accordance with some embodiments. FIG. 3A-3 illustrates the cross-sectional representation shown along line $C_1$-$C_1$' and $C_2$-$C_2$' in FIG. 1E and in FIG. 2.

Next, as shown in FIGS. 3B-1, 3B-2 and 3B-3, after the gate spacer layers 126 and the fin spacer layers 128 are formed, the source/drain (S/D) regions of the fin structure 104 are recessed to form source/drain (S/D) recesses 130, as shown in in accordance with some embodiments. More specifically, the first semiconductor material layers 106 and the second semiconductor material layers 108 not covered by the dummy gate structures 118 and the gate spacer layers 126 are removed, in accordance with some embodiments. In addition, some portions of the base fin structure 105 are also recessed to form curved top surfaces, as shown in FIG. 3B-1 in accordance with some embodiments.

In some embodiments, the first fin structure 104*a* and the second fin structure 104*b* are recessed by performing an etching process. The etching process may be an anisotropic etching process, such as dry plasma etching, and the first dummy gate structure 118*a*, the second dummy gate structure 118*b* and the gate spacer layers 126 are used as etching masks during the etching process. In some embodiments, the fin spacer layers 128 are also recessed to form lowered fin spacer layers 128'.

Afterwards, as shown in FIGS. 3C-1, 3C-2 and 3C-3, after the source/drain (S/D) recesses 130 are formed, the first semiconductor material layers 106 exposed by the source/drain recesses 130 are laterally recessed to form notches 132, in accordance with some embodiments.

In some embodiments, an etching process is performed on the semiconductor structure 100*a* to laterally recess the first semiconductor material layers 106 of the fin structure 104 from the source/drain recesses 130. In some embodiments, during the etching process, the first semiconductor material layers 106 have a greater etching rate (or etching amount) than the second semiconductor material layers 108, thereby forming notches 132 between adjacent second semiconductor material layers 108. In some embodiments, the etching process is an isotropic etching such as dry chemical etching, remote plasma etching, wet chemical etching, another suitable technique, and/or a combination thereof.

Next, as shown in FIGS. 3D-1, 3D-2 and 3D-3, inner spacers 134 are formed in the notches 132 between the second semiconductor material layers 108, in accordance with some embodiments. The inner spacers 134 are configured to separate the source/drain (S/D) structures and the gate structures formed in subsequent manufacturing processes in accordance with some embodiments. In some embodiments, the inner spacers 134 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof. In some embodiments, the inner spacer layer 134 is formed by a deposition process, such as chemical vapor deposition (CVD) process, atomic layer deposition (ALD) process, another applicable process, or a combination thereof.

Afterwards, as shown in FIGS. 3E-1, 3E-2 and 3E-3, after the inner spacers 134 are formed, a hard mask layer 129 is formed on the lowered fin spacer layers 128', the first fin structure 104*a*, the second fin structure 104*b*, and isolation structure 116, in accordance with some embodiments. Next, a photoresist layer 131 is formed over a portion of the hard mask layer 129. The photoresist layer 131 is patterned to form a patterned photoresist layer 131 to transfer the pattern to the hard mask layer 129. The patterned photoresist layer 131 is formed in the second sub-region 12.

The lowered fin spacer layers 128' have a high etching selectivity with respect to the hard mask layer 129. When the hard mask layer 129 is removed, the lowered fin spacer layers 128' are rarely removed. In some embodiments, the hard mask layer 129 is made of nitride or oxide, such as silicon nitride or aluminum oxide ($Al_2O_3$) or another applicable material. In some embodiments, the hard mask layer 129 is formed by chemical vapor deposition (CVD), atomic vapor deposition (ALD), physical vapor deposition (PVD), another suitable method, or a combination thereof.

Afterwards, as shown in FIGS. 3F-1, 3F-2 and 3F-3, a portion of the hard mask layer 129 in the first sub-region 11 which is not coved by the photoresist layer 131 is removed to expose the first S/D recess 130, and then the photoresist layer 131 is removed, and a first source/drain (S/D) structure 136*a* is formed in the S/D recesses 130, in accordance with some embodiments.

In some embodiments, the first source/drain (S/D) structure 136*a* is formed using an epitaxial growth process, such as Molecular beam epitaxy (MBE), Metal-organic Chemical Vapor Deposition (MOCVD), Vapor-Phase Epitaxy (VPE), other applicable epitaxial growth process, or a combination thereof. In some embodiments, the first source/drain (S/D) structure 136*a* is made of any applicable material, such as Ge, Si, GaAs, AlGaAs, SiGe, GaAsP, SiP, SiC, SiCP, or a combination thereof.

In some embodiments, the first source/drain (S/D) structure 136*a* is in-situ doped during the epitaxial growth process. For example, the first source/drain (S/D) structure 136*a* may be the epitaxially grown SiGe doped with boron (B). For example, the first source/drain (S/D) structure 136*a* may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. In some embodiments, the first source/drain (S/D) structure 136*a* is doped in one or more implantation processes after the epitaxial growth process.

Next, as shown in FIGS. 3G-1, 3G-2 and 3G-3, after the first source/drain (S/D) structure 136*a* formed, the hard mask layer 129 is again formed on the lowered fin spacer layers 128', the isolation structure 116 and the first S/D structure 136*a*, in accordance with some embodiments. Next, the photoresist layer 131 is formed over a portion of the hard mask layer 129 in the first sub-region 11, and the photoresist layer 131 is patterned to form a patterned photoresist layer 131. The patterned photoresist layer 131 is in the first sub-region 11.

Next, a portion of the hard mask layer 129 is removed to expose the second S/D recess 130 in the second sub-region 12. The remaining hard mask layer 129 is used to protect the first S/D structure 136*a*. Next, the photoresist layer 131 is removed.

Afterwards, as shown in FIGS. 3H-1, 3H-2 and 3H-3, a second S/D structure 136*b* is formed in the second S/D recess 130 in the second sub-region 12. Next, the hard mask layer 129 is removed after the second S/D structure 136*b* is formed.

In some embodiments, the second S/D structures 136*b* is made of any applicable material, such as Ge, Si, GaAs, AlGaAs, SiGe, GaAsP, SiP, SiC, SiCP, or a combination thereof. In some embodiments, the second S/D structure 136*b* is formed using an epitaxial growth process, such as Molecular beam epitaxy (MBE), Metal-organic Chemical Vapor Deposition (MOCVD), Vapor-Phase Epitaxy (VPE), other applicable epitaxial growth process, or a combination thereof.

In some embodiments, the second S/D structure 136*b* is in-situ doped during the epitaxial growth process. For example, the second S/D structure 136*b* may be the epitaxially grown SiGe doped with boron (B). For example, the second S/D structure 136*b* may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. In some embodiments, the second S/D structures 136*b* are doped in one or more implantation processes after the epitaxial growth process.

Afterwards, as shown in FIGS. 3I-1, 3I-2 and 3I-3, a contact etch stop layer (CESL) 138 is conformally formed to cover the first S/D structures 136*a*, the second S/D structure 136*b* and an interlayer dielectric (ILD) layer 140 is formed over the contact etch stop layers 138, in accordance with some embodiments.

In some embodiments, the contact etch stop layer 138 is made of a dielectric materials, such as silicon nitride, silicon oxide, silicon oxynitride, another suitable dielectric material, or a combination thereof. The dielectric material for the contact etch stop layers 138 may be conformally deposited over the semiconductor structure by performing chemical vapor deposition (CVD), ALD, other application methods, or a combination thereof.

The ILD layer 140 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The ILD layer 140 may be formed by chemical vapor deposition (CVD), physical vapor deposition, (PVD), atomic layer deposition (ALD), or other applicable processes.

After the contact etch stop layer 138 and the ILD layer 140 are deposited, a planarization process such as CMP or an etch-back process may be performed until the gate electrode layers 120 of the dummy gate structures 118 are exposed, as shown in FIG. 3I-3 in accordance with some embodiments.

Afterwards, as shown in FIGS. 3J-1, 3J-2 and 3J-3, the first dummy gate structure 118*a* and the second dummy gate structure 118*b* are removed to form a trench 141, in accordance with some embodiments. As a result, the first fin structure 104*a* and the second fin structure 104*b* are exposed by the trench 141.

The removal process may include one or more etching processes. For example, when the dummy gate electrode layer 122 is polysilicon, a wet etchant such as a tetramethylammonium hydroxide (TMAH) solution may be used to selectively remove the dummy gate electrode layer 122. Afterwards, the dummy gate dielectric layer 120 may be removed using a plasma dry etching, a dry chemical etching, and/or a wet etching.

Next, as shown in FIGS. 3K-1, 3K-2 and 3K-3, the first semiconductor material layers 106 are removed to form nanostructures 108' (or channel layers 108') with the second semiconductor material layers 108, in accordance with some embodiments. Next, a number of processes in FIG. 4A-4C are performed on the nanostructures 108'.

Figure 4A:
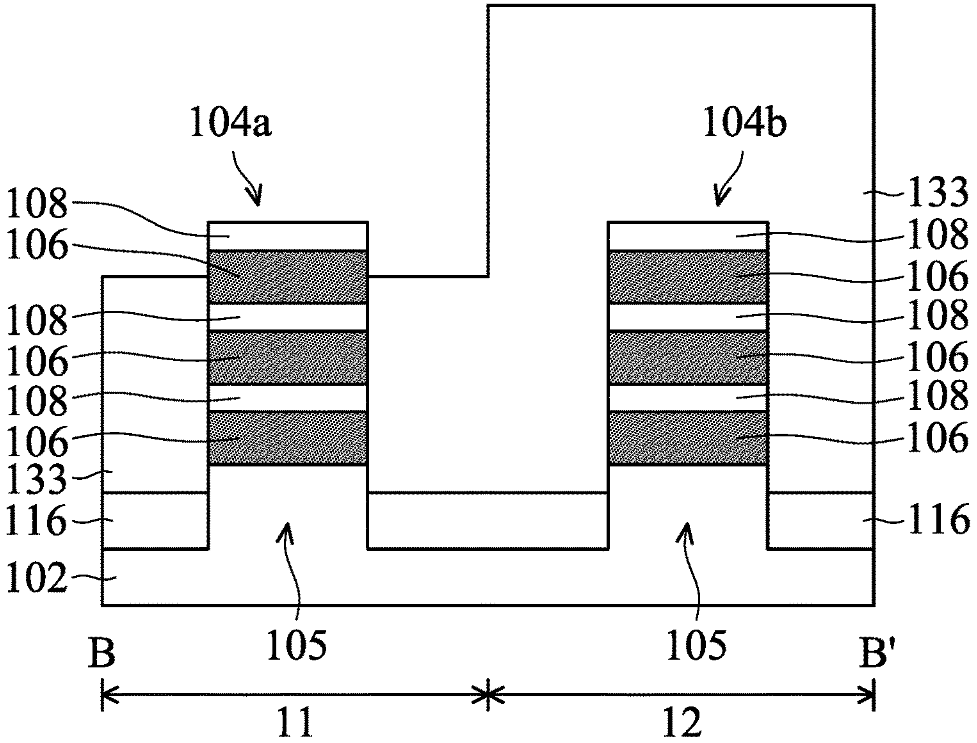
FIGS. 4A to 4C illustrate cross-sectional representations of various stages of manufacturing the semiconductor structure after the first semiconductor material layers are removed, in accordance with some embodiments.
Figure 4B:
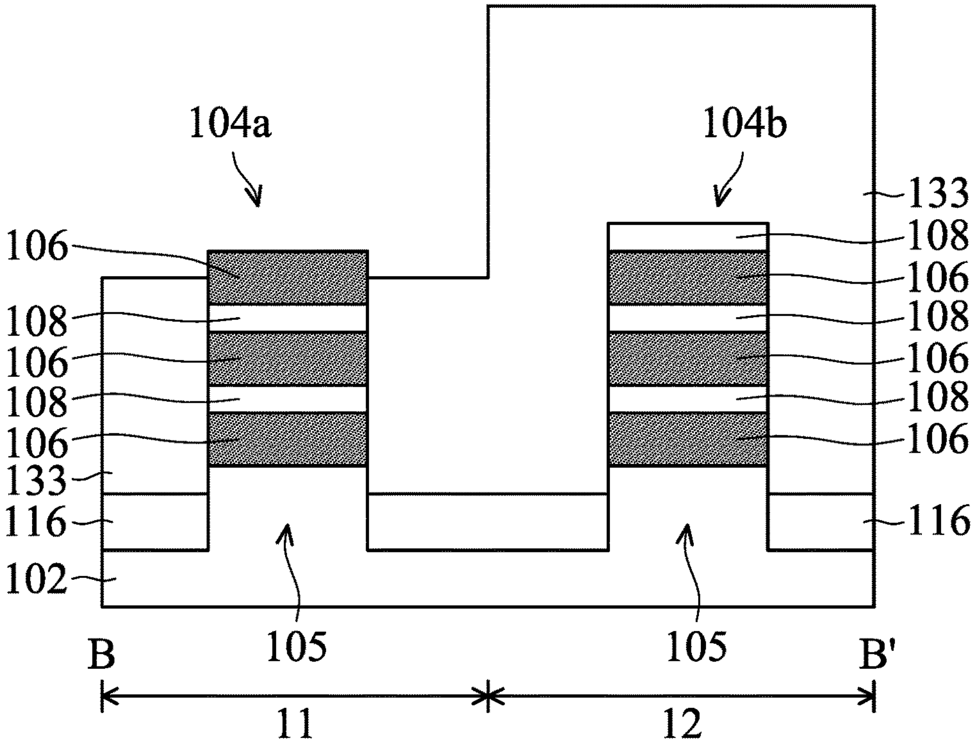
Figure 4C:
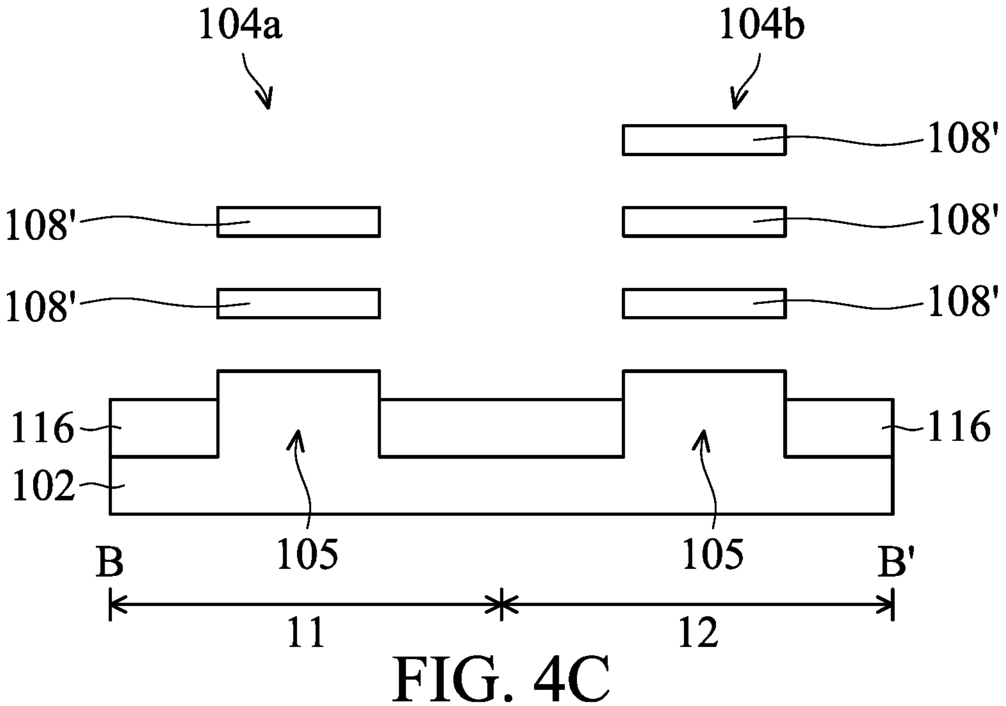

FIGS. 4A to 4C illustrate cross-sectional representations of various stages of manufacturing the semiconductor structure 100*a* after the first semiconductor material layers 106 are removed, in accordance with some embodiments.

As shown in FIG. 4A, the nanostructures 108' (or channel layers 108') in the first sub-region 11 and the second sub-region 12 are covered by a mask layer 133. The top portion of the mask layer 133 is removed to expose the topmost nanostructures 108' in the first sub-region 11.

Next, as shown in FIG. 4B, the exposed topmost nanostructures 108' in the first sub-region 11 is removed.

Afterwards, as shown in FIG. 4C, all of the mask layer 133 is removed. As a result, the number of nanostructures 108' (or channel layers 108') in the first sub-region 11 become two, and the number of nanostructures 108' (or channel layers 108') in the second sub-region 12 is still three. All of the nanostructures 108' or the first semiconductor material layers 108 in the second sub-region 12 is not removed and is protected by the mask layer 133.

The portion of the nanostructures 108' directly below and surrounded by the first dummy gate structure 118*a* in the first sub-region 11 original have three layers, and after the processes in FIG. 4A-4C, the number of nanostructures 108' in the first sub-region 11 become two layers. It should be noted that a portion of the topmost nanostructures 108' or topmost first semiconductor material layer 108 is removed, but another portion of the topmost nanostructures 108' or topmost first semiconductor material layer 108 directly below the gate spacer layer 142 is not removed. Therefore, the number of nanostructures 108' directly below the gate spacer layer 126 is still three.

The first S/D structure 136*a* and the second S/D structure 136*b* are attached to the nanostructures 108'. The first fin structure 104*a* and the second fin structure 104*b* include the nanostructures 108'.

The first semiconductor material layers 106 may be removed by performing a selective wet etching process, such as APM (e.g., ammonia hydroxide-hydrogen peroxide-water mixture) etching process. For example, the wet etching process uses etchants such as ammonium hydroxide ($NH_4OH$), TMAH, ethylenediamine pyrocatechol (EDP), and/or potassium hydroxide (KOH) solutions.

Next, as shown in FIGS. 3L-1, 3L-2 and 3L-3, after the nanostructures 108' are formed, a first gate structure 142*a* and a second gate structure 142*b* are formed to surround the nanostructures 108' and over the isolation structure 116, in accordance with some embodiments.

After the nanostructures 108' are formed, the first gate structure 142*a* and the second gate structure 142*b* are formed wrapped around the nanostructures 108'. The first gate structure 142*a* and the second gate structure 142*b* wrap around the nanostructures 108' to form gate-all-around transistor structures in accordance with some embodiments. In some embodiments, the first gate structure 142*a* includes an interfacial layer 144, a gate dielectric layer 146, and a first gate electrode layer 148*a*. In some embodiments, the second gate structure 142*b* includes an interfacial layer 144, a gate dielectric layer 146, and a second gate electrode layer 148*b*.

In some embodiments, the interfacial layers 144 are oxide layers formed around the nanostructures 108' and on the top of the base fin structure 105. In some embodiments, the interfacial layers 144 are formed by performing a thermal process.

In some embodiments, the gate dielectric layers 146 are formed over the interfacial layers 144, so that the nanostructures 108' are surrounded (e.g. wrapped) by the gate dielectric layers 146. In addition, the gate dielectric layers 146 also cover the sidewalls of the gate spacers 126 and the inner spacers 134 in accordance with some embodiments. In some embodiments, the gate dielectric layers 146 are made of one or more layers of dielectric materials, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, another suitable high-k dielectric material, or a combination thereof. In some embodiments, the gate dielectric layers 146 are formed using chemical vapor deposition (CVD), atomic layer deposition (ALD), another applicable method, or a combination thereof.

In some embodiments, the first gate structure 142*a* and the second gate structure 142*b* are formed on the gate dielectric layer 146. In some embodiments, the first gate structure 142*a* and the second gate structure 142*b* are made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the first gate structure 142*a* and the second gate structure 142*b* are formed using chemical vapor deposition (CVD), atomic layer deposition (ALD), electroplating, another applicable method, or a combination thereof. Other conductive layers, such as work function metal layers, may also be formed in the first gate structure 142*a* and the second gate structure 142*b*, although they are not shown in the figures. In some embodiments, the n-work function layer includes tungsten (W), copper (Cu), titanium (Ti), silver (Ag), aluminum (Al), titanium nitride (TiN), tantalum nitride (TaN), tantalum carbide (TaC), titanium aluminum alloy (TiAl), titanium aluminum nitride (TiAlN), tantalum carbon nitride (TaCN), tantalum silicon nitride (TaSiN), manganese (Mn), zirconium (Zr) or a combination thereof. In some embodiments, the p-work function layer includes titanium (Ti), titanium nitride (TiN), tantalum nitride (TaN), tantalum carbide (TaC), molybdenum nitride, tungsten nitride (WN), ruthenium (Ru) or a combination thereof.

After the interfacial layers 144, the gate dielectric layers 146, and first gate structure 142*a* and the second gate structure 142*b* are formed, a planarization process such as CMP or an etch-back process may be performed until the ILD layer 140 is exposed.

Afterwards, as shown in FIGS. 3M-1, 3M-2 and 3M-3, an etch stop layer 150 is formed over the gate structure 142, and a dielectric layer 152 is formed over the etch stop layer 150, in accordance with some embodiments.

In some embodiments, the etch stop layer 150 is made of a dielectric materials, such as silicon nitride, silicon oxide, silicon oxynitride, another suitable dielectric material, or a combination thereof. The dielectric material for the etch stop layers 150 may be conformally deposited over the semiconductor structure by performing chemical vapor deposition (CVD), ALD, other application methods, or a combination thereof.

The dielectric layer 152 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The dielectric layer 152 may be formed by chemical vapor deposition (CVD), physical vapor deposition, (PVD), atomic layer deposition (ALD), or other applicable processes.

Next, a silicide layer 154 and an S/D contact structure 156 are formed over the first S/D structure 136*a* and the second S/D structure 136*b*, in accordance with some embodiments.

In some embodiments, the contact openings may be formed through the contact etch stop layer 138, the inter-layer dielectric layer 140, the etch stop layer 150 and the dielectric layer 152 to expose the top surfaces of the first S/D structures 136*a* and the second S/D structure 136*b*, and then the silicide layers 154 and the S/D contact structure 156 may be formed in the contact openings. The contact openings may be formed using a photolithography process and an etching process. In addition, some portions of the first S/D structure 136*a* and second S/D structure 136*b* exposed by the contact openings may also be etched during the etching process.

The silicide layers 154 may be formed by forming a metal layer over the top surfaces of the first S/D structure 136*a* and the second S/D structure 136*b* and annealing the metal layer so the metal layer reacts with the first S/D structure 136*a* and the second S/D structure 136*b* to form the silicide layers 154. The unreacted metal layer may be removed after the silicide layers 154 are formed.

The S/D contact structure 156 may include a barrier layer and a conductive layer. In some other embodiments, the S/D contact structure 156 does not include a barrier layer. In some embodiments, the barrier layer is made of titanium (Ti), titanium nitride (TiN), tantalum (Ta), tantalum nitride (TaN), or another applicable material. In some embodiments, the barrier layer is formed by using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes. In some embodiments, the conductive layer is made of tungsten (W), ruthenium (Ru), molybdenum (Mo), or the like. In some embodiments, the conductive layer is formed by performing a deposition process, such as chemical vapor deposition (CVD), physical vapor deposition, (PVD), atomic layer deposition (ALD), or other applicable processes.

After the S/D contact structure 156 are formed, an etch stop layer 162 is formed over the S/D contact structure 156, and a dielectric layer 164 is formed over the etch stop layer 162, in accordance with some embodiments. Next, an S/D conductive via 166 is formed over the S/D contact structure 156, and a gate conductive plug 168 is formed over the first gate structure 142*a* and the second gate structure 142*b*.

In some embodiments, the etch stop layer 162 is made of a dielectric materials, such as silicon nitride, silicon oxide, silicon oxynitride, another suitable dielectric material, or a combination thereof. The dielectric material for the contact etch stop layers 162 may be conformally deposited over the semiconductor structure by performing chemical vapor deposition (CVD), atomic layer deposition (ALD), other application methods, or a combination thereof.

The dielectric layer 164 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The dielectric layer 164 may be formed by chemical vapor deposition (CVD), physical vapor deposition, (PVD), atomic layer deposition (ALD), or other applicable processes.

In some embodiments, the S/D conductive via 166 is made of conductive material, such as tungsten (W), ruthenium (Ru), molybdenum (Mo), or the like. In some embodiments, the S/D conductive via 166 is formed by performing a deposition process, such as chemical vapor deposition (CVD), physical vapor deposition, (PVD), atomic layer deposition (ALD), or other applicable processes.

In some embodiments, the gate conductive plug 168 is made of conductive material, such as tungsten (W), ruthenium (Ru), molybdenum (Mo), or the like. In some embodiments, the gate conductive plug 168 is formed by performing a deposition process, such as chemical vapor deposition (CVD), physical vapor deposition, (PVD), atomic layer deposition (ALD), or other applicable processes.

As shown in FIG. 3M-3, the number of nanostructures 108' (or channel layers 108') directly below in the second gate structure 142*b*-1 in first sub-region 11 become two, and the number of nanostructures 108' (or channel layers 108') directly below the second gate structure 142*b*-2 in the second sub-region 12 is still three. More specifically, the number of nanostructures 108' (or channel layers 108') directly below the second gate structure 142*b*-1 in the first sub-region 11 is two, and the number of nanostructures 108' (or channel layers 108') directly below the gate spacer layer 126 in the first sub-region 11 is three. Furthermore, the number of nanostructures 108' (or channel layers 108') directly below in the second gate structure 142*b*-2 in second sub-region 12 is three. Therefore, the number of nanostructures 108' (or channel layers 108') directly below the second gate structure 142*b*-1 in the first sub-region 11 is smaller than the number of nanostructures 108' (or channel layers 108') directly below in the second gate structure **142*b*-2 in second sub-region 12**.

In the first sub-region 11, the second gate structure **142*b*-1 has a continuous sidewall surface in direct contact with the gate spacer layer 126, and the bottom surface of the continuous sidewall surface of the second gate structure 142*b*-1 is lower than the bottom surface of the gate spacer layer 126. In addition, the continuous sidewall surface of the second gate structure 142*b*-1 is in direct contact with the topmost nanostructure 108*a'***.

It should be noted that the topmost nanostructure is divided into two portions by the second gate structure **142*b*-1, and the two portions of the first gate structure 142*a* are in direct contact with the gate spacer layer 126**.

More nanostructures (e.g. three nanostructures 108' directly below the second gate structure **142*b*-2 in the second sub-region 12) can provide large effective width ($W_{eff}$) of the channel layer. The large effective width ($W_{eff}$) of channel layer can provide high speed of the semiconductor structure 100*a***. However, the larger effective width of the channel layer consumes more power. For high speed performance consideration, larger effective width ($W_{eff}$) is formed by having more nanostructures. For power efficiency, a smaller effective width ($W_{eff}$) is formed by having fewer nanostructures.

In order to fulfill different needs in a region, the second gate structure **142*b*-1 in the first sub-region 11 is formed for power efficiency, and the second gate structure 142*b*-2 in the second sub-region 12 is formed for high speed performance. The second gate structure 142*b*-1 and second gate structure 142*b*-2** co-exist to achieve multi-nanostructures for speed performance and power efficiency.

In some embodiments, the second area of the S/D contact structure 156 in the second sub-region 12 is greater than the first area of the S/D contact structure 156 in the first sub-region 11. In some embodiments, the area ratio of the second area of the S/D contact structure 156 to the first area of the S/D contact structure 156 is in a range from about 1.1 to about 2.5.

In some embodiments, the second area of the S/D conductive via structure 166 in the second sub-region 12 is greater than the first area of the S/D conductive via structure 166 in the first sub-region 11. In some embodiments, the area ratio of the second area of the S/D conductive via structure 166 to the first area of the S/D conductive via structure 166 is in a range from about 1.1 to about 2.5.

Figure 5:
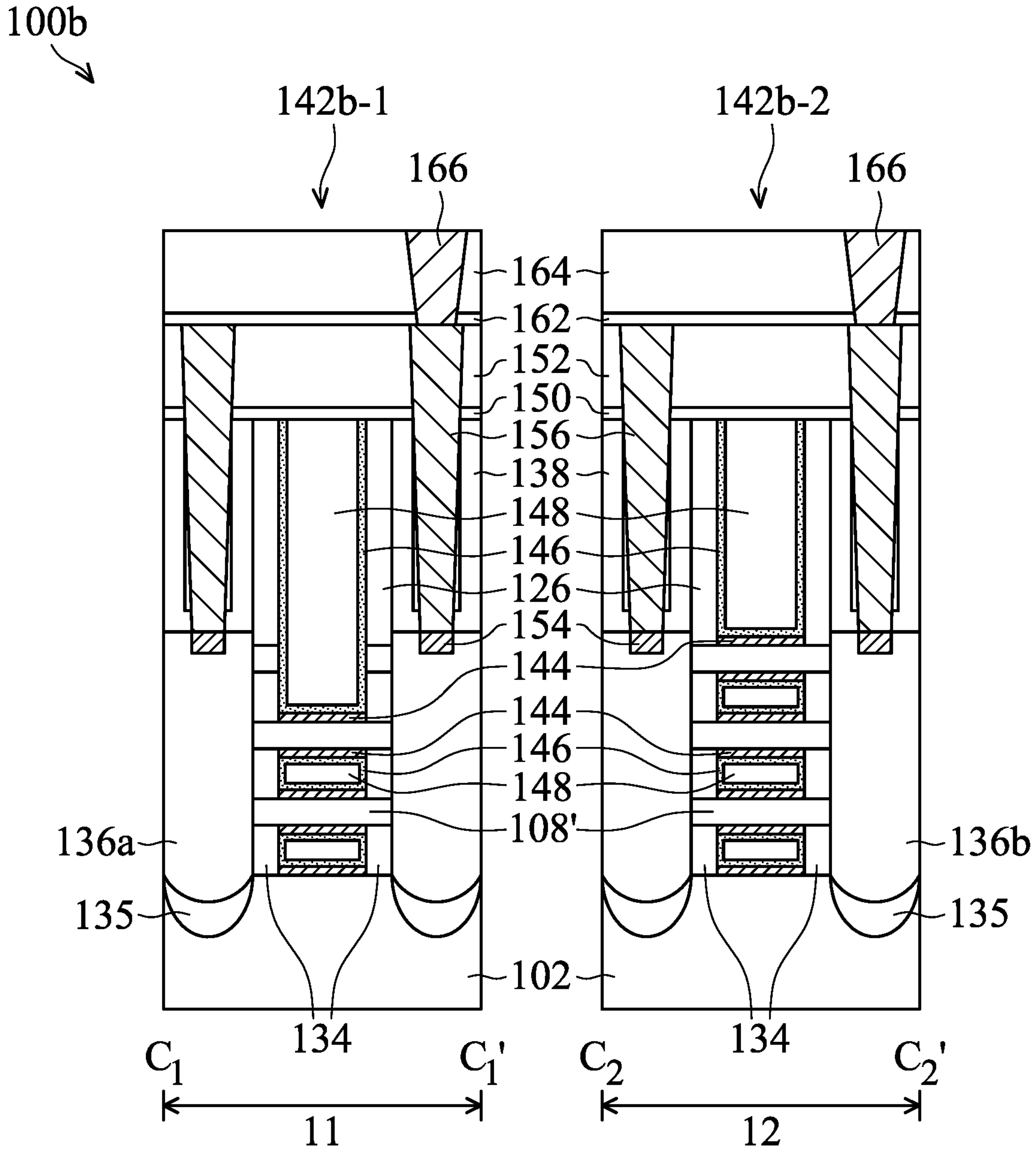
FIG. 5 illustrates a cross-sectional view of a semiconductor structure, in accordance with some embodiments.

FIG. 5 illustrates a cross-sectional view of a semiconductor structure **100*b*, in accordance with some embodiments. The semiconductor structure 100*b* of FIG. 5 includes elements that are similar to, or the same as, elements of the semiconductor structure 100*a* of FIG. 3M-3. The difference between FIG. 5 and FIG. 3M-3 is that there is a bottom isolation layer 135 below the first source/drain (S/D) structure 136*a* and the second S/D structure 136*b*. The bottom isolation layer 135 is used to reduce leakage from the semiconductor structure 100*a***.

In some embodiments, the bottom isolation layer 135 includes un-doped Si, un-doped SiGe or a combination thereof. In some embodiments, the bottom isolation layer 135 is formed by an epitaxy or epitaxial (epi) process. The epi process may include a selective epitaxial growth (SEG) process, CVD deposition techniques (e.g., vapor-phase epitaxy (VPE) and/or ultra-high vacuum CVD (UHV-CVD)), molecular beam epitaxy, or other suitable epi processes.

Figure 6:
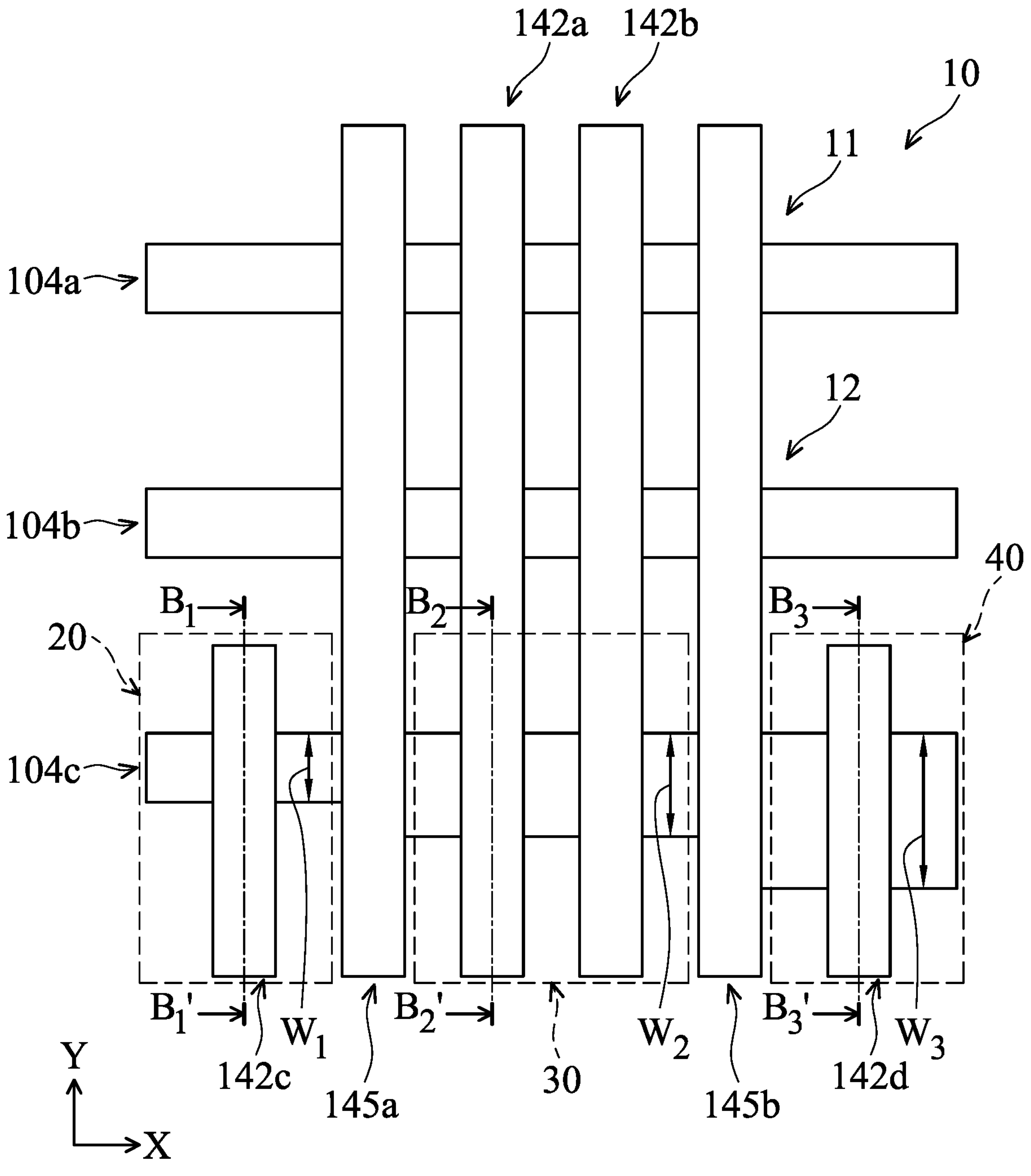
FIG. 6 shows a top-view representation of a semiconductor structure, in accordance with some embodiments.

FIG. 6 shows a top-view representation of a semiconductor structure **100*c***, in accordance with some embodiments.

As shown in FIG. 6, the substrate 102 includes the first region 10, a second region 20, a third region 30 and a fourth region 40. The first region 10 includes the first sub-region 11 and a second sub-region 12 (shown in FIG. 2). The third region 30 is between the second region 20 and the fourth region 40, and the third region 30 is adjacent to the first region 10. A third fin structure **104*c* is formed along the first direction (e.g. X-axis). The first fin structure 104*a*, the second fin structure 104*b* and the third fin structure 104*c*** are parallel to each other.

The third fin structure **104*c* is adjacent to the second fin structure 104*b*, and the second fin structure 104*b* is between the first fin structure 104*a* and the third fin structure 104*c*. The third fin structure 104*c* has different widths in different regions along the second direction (e.g. y-axis). The third fin structure 104*c* has a first width $W_1$ in the second region 20, a second width $W_2$ in the third region 30 and a third width $W_3$ in the fourth region 40**. In some embodiments, the first width $W_1$ is smaller than the second width $W_2$, and the second width $W_2$ is smaller than the third width $W_3$.

In the second region 20, a third gate structure **142*c* is formed across the third fin structure 104*c*. In the third region 30, the first gate structure 142*a* and the second gate structure 142*b* are formed across the third fin structure 104*c*. In the fourth region 40, the fourth gate structure 142*d* is formed across the third fin structure 104*c***.

A first dielectric structure **145*a* is formed between the second region 20 and the third region 30, and a second dielectric structure 145*b* is formed between the third region 30 and the fourth region 40. The first dielectric structure 145*a* is in parallel to the third gate structure 142*c*. The second dielectric structure 145*b* is also in parallel to the third gate structure 142*c*. The first dielectric structure 145*a* and the second dielectric structure 145*b*** are used to reduce leakage from two adjacent semiconductor devices.

Figure 7A:
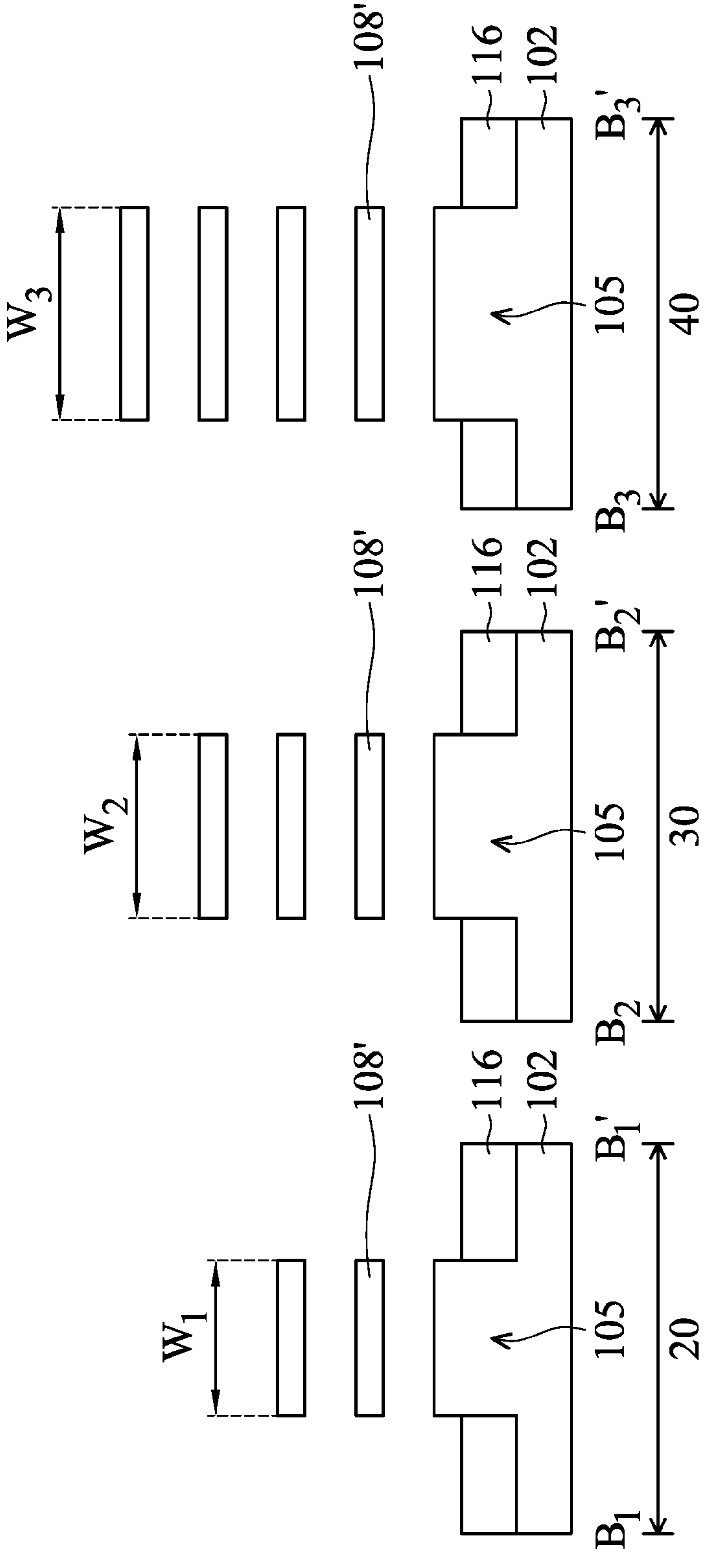
FIGS. 7A to 7C illustrate cross-sectional representations of various stages of manufacturing the semiconductor structure shown along line $B_1$-$B_1$', $B_2$-$B_2$' and $B_3$-$B_3$' in FIG. 6, in accordance with some embodiments.
Figure 7B:
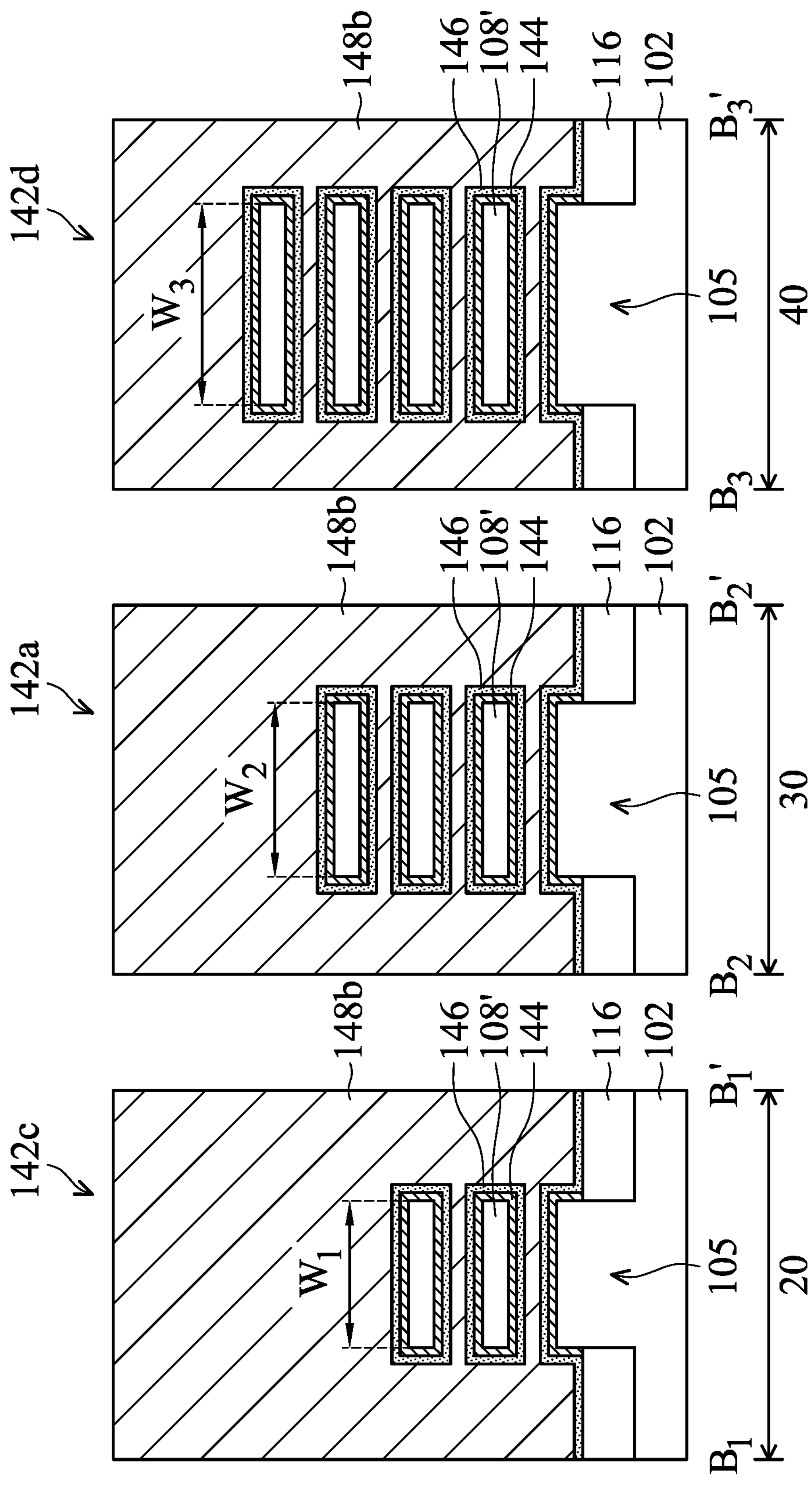
Figure 7C:
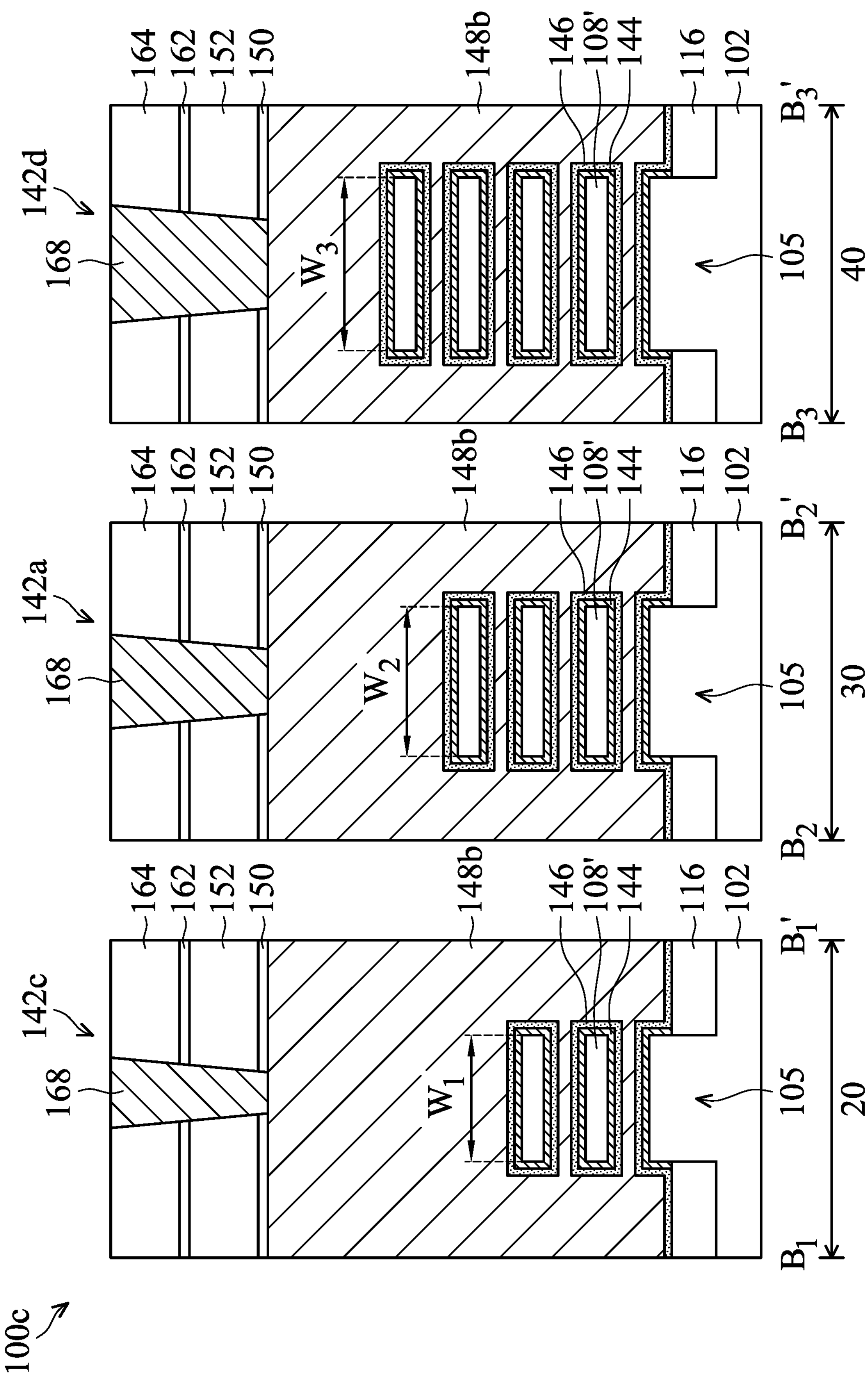

FIGS. 7A to 7C illustrate cross-sectional representations of various stages of manufacturing the semiconductor structure **100*c* shown along line $B_1$-$B_1$', $B_2$-$B_2$' and $B_3$-$B_3$' in FIG. 6, in accordance with some embodiments. The semiconductor structure 100*c* of FIGS. 7A-7C includes elements that are similar to, or the same as, elements of the semiconductor structure 100*a* of FIGS. 3A-1 to 3M-1, 3A-2 to 3M-2 and 3A-3 to 3M-3**.

As shown in FIG. 7A, there are two nanostructures 108' (or channel layers 108') in the second region 20, there are three nanostructures 108' in the third region 30 and there are fourth nanostructures 108" in the fourth region 40. The formation of the nanostructures 108' (or channel layers 108') is described in FIGS. 3A-2 to 3M-2, and the detail is not described again for brevity. The numbers of the nanostructures 108' in the second region 20, that in the third region 30 and that in the fourth region 40 are the same in original design, but after the processes (e.g. FIGS. 4A-4C), the number of nanostructures 108' in the second region 20 becomes two and the number of nanostructures 108' in the third region 30 become three.

The number of nanostructures 108' (or channel layers 108') in the second region 20 is smaller than the number of nanostructures 108' (or channel layers 108') in the third region 30. The number of nanostructures 108' (or channel layers 108') in the third region 30 is smaller than the nanostructures 108' (or channel layers 108') in the fourth region 40.

In the second region 20, the nanostructures 108' (or channel layers 108') has the first width $W_1$. In the third region 30, the nanostructures 108' (or channel layers 108') has the second width $W_2$. In the fourth region 40, the nanostructures 108' (or channel layers 108') has the third width $W_3$. The first width $W_1$ is smaller than the second width $W_2$, and the second width $W_2$ is smaller than the third width $W_3$.

Next, as shown in FIG. 7B, the third gate structure 142*c* is formed to surround the nanostructures 108' (or channel layers 108') in the second region 20, in accordance with some embodiments. In addition, the first gate structure 142*a* and the second gate structure 142*b* is formed to surround the nanostructures 108' (or channel layers 108') in the third region 30, and the fourth gate structure 142*d* is formed to surround the nanostructures 108' (or channel layers 108') in the fourth region 40.

The first width $W_1$ of the nanostructures 108' (or channel layers 108') directly below the third gate structure 142*c* in the second region 20 is smaller than the second width $W_2$ of the nanostructures 108' (or channel layers 108') directly below the second gate structure 142*b* in the third region 30. In addition, the second width $W_2$ of the nanostructures 108' (or channel layers 108') directly below the first gate structure 142*a* in the third region 30 is smaller than third width $W_3$ of the fourth gate structure 142*d* in the fourth region 40.

Afterwards, the etching stop layer 150 and the dielectric layer 152 is formed over the third gate structure 142*c*, the first gate structure 142*a*, the second gate structure 142*b* and the fourth gate structure 142*d*.

Next, the etching stop layer 162 and the dielectric layer 164 are formed over the dielectric layer 152. Afterwards, the S/D conductive via structure 166 (not shown) is formed through the dielectric layer 164 and the etching stop layer 162. The gate contact structure 168 is formed through the dielectric layer 164, the etching stop layer 162, the dielectric layer 152 and the etching stop layer 150. The gate contact structure 168 is connected to the third gate structure 142*c* in the second region 20, the first gate structure 142*a* in the third region 30 and the fourth gate structure 142*d* in the fourth region 40.

Figure 8:
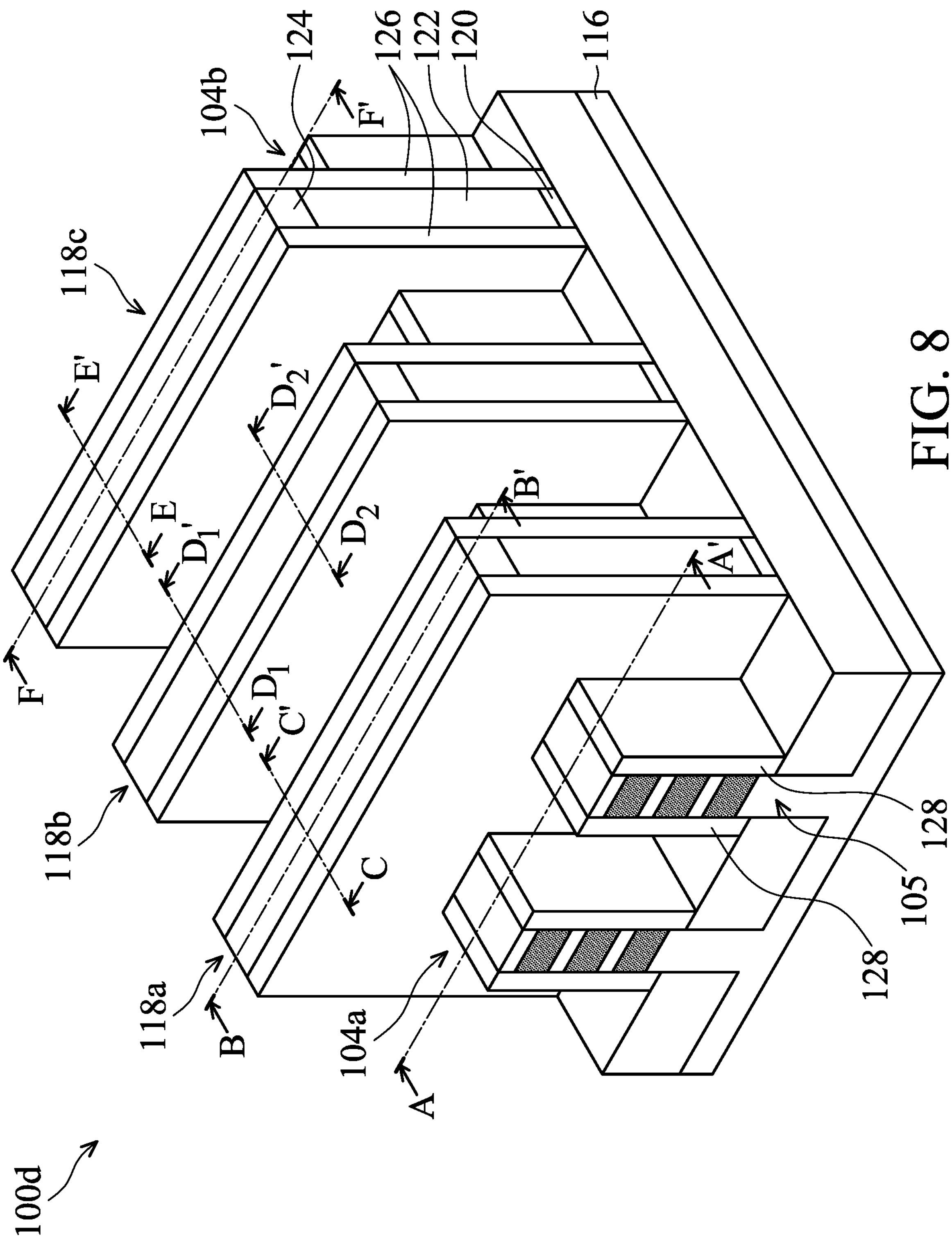
FIG. 8 illustrates a perspective view of a semiconductor structure, in accordance with some embodiments

FIG. 8 illustrates a perspective view of a semiconductor structure 100*d*, in accordance with some embodiments. The semiconductor structure 100*d* of FIG. 8 includes elements that are similar to, or the same as, elements of the semiconductor structure 100*a* of FIG. 1E. The difference between FIG. 8 and FIG. 1E is that there is a third dummy gate structure 118*c* between the first dummy gate structure 118*a* and the second dummy gate structure 118*b*.

Figure 9:
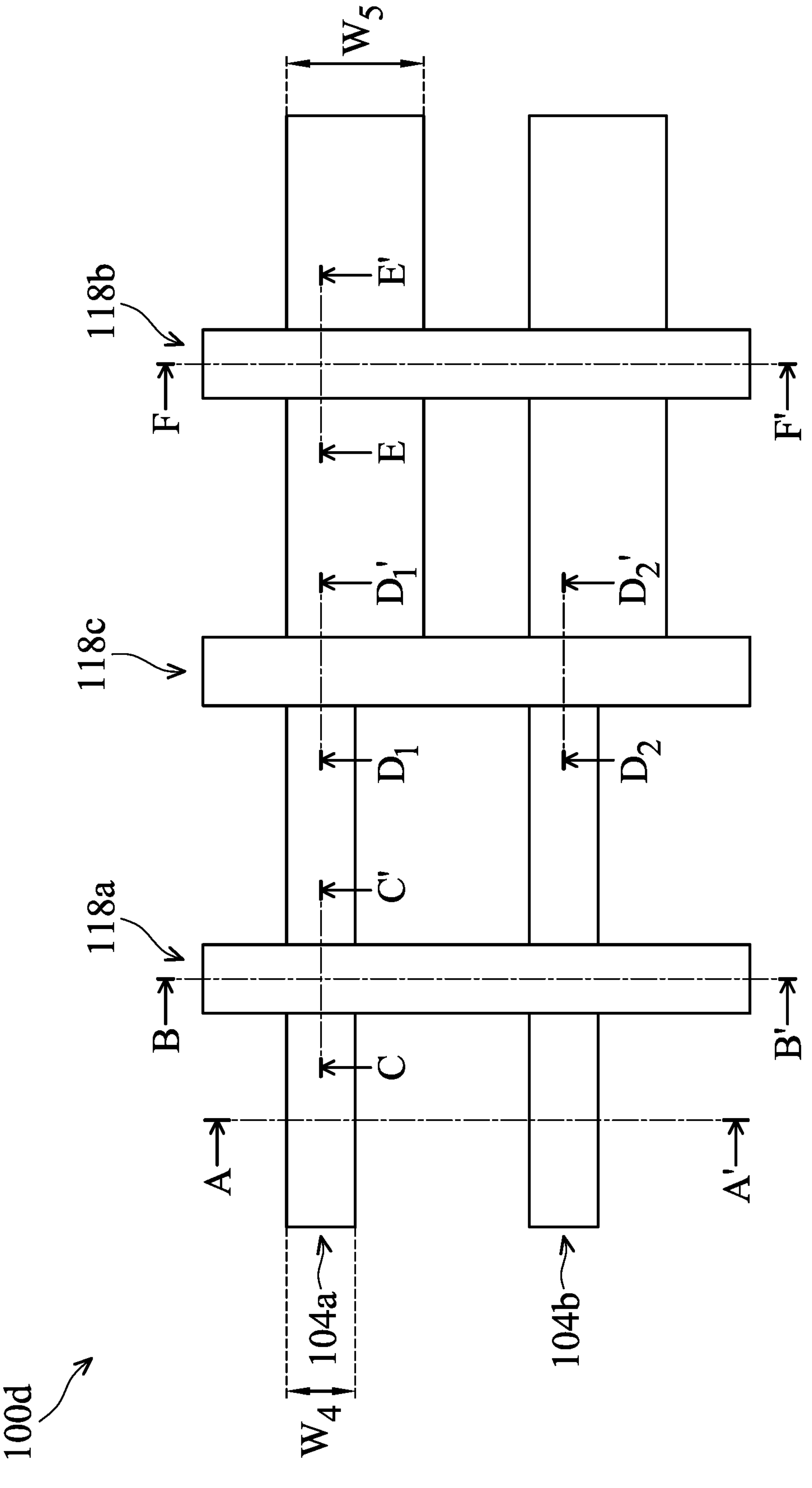
FIG. 9 shows a top-view representation of the semiconductor structure, in accordance with some embodiments.

FIG. 9 shows a top-view representation of the semiconductor structure 100*d*, in accordance with some embodiments. The first fin structure 104*a* and the second fin structure 104*b* are parallel to each other, and the first dummy gate structure 118*a*, the second dummy gate structure 118*b* and the third dummy gate structure 118*c* are formed across the first fin structure 104*a* and the second fin structure 104*b*. The third dummy gate structure 118*c* will be replaced by the dielectric structure 145 (shown in FIG. 10E-3). The dielectric structure 145 is an isolation structure to reduce the leakage.

The first fin structure 104*a* has a fourth width $W_4$ on the left side of the third dummy gate structure 118*c* and a fifth width $W_5$ on the right side of the third dummy gate structure 118*c*. The fourth width $W_4$ and the fifth width $W_5$ are along the second direction (e.g. y-direction). In some embodiments, the fourth width W4 is smaller than the fifth width $W_5$.

Figures 1, 10A:
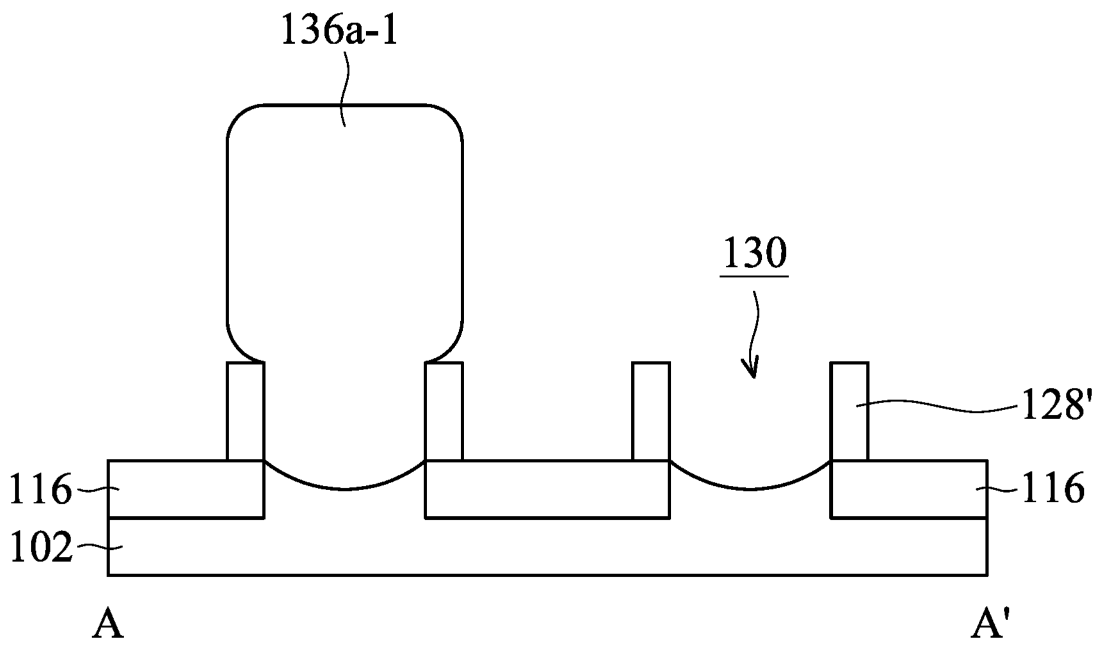
Figures 2, 10A:
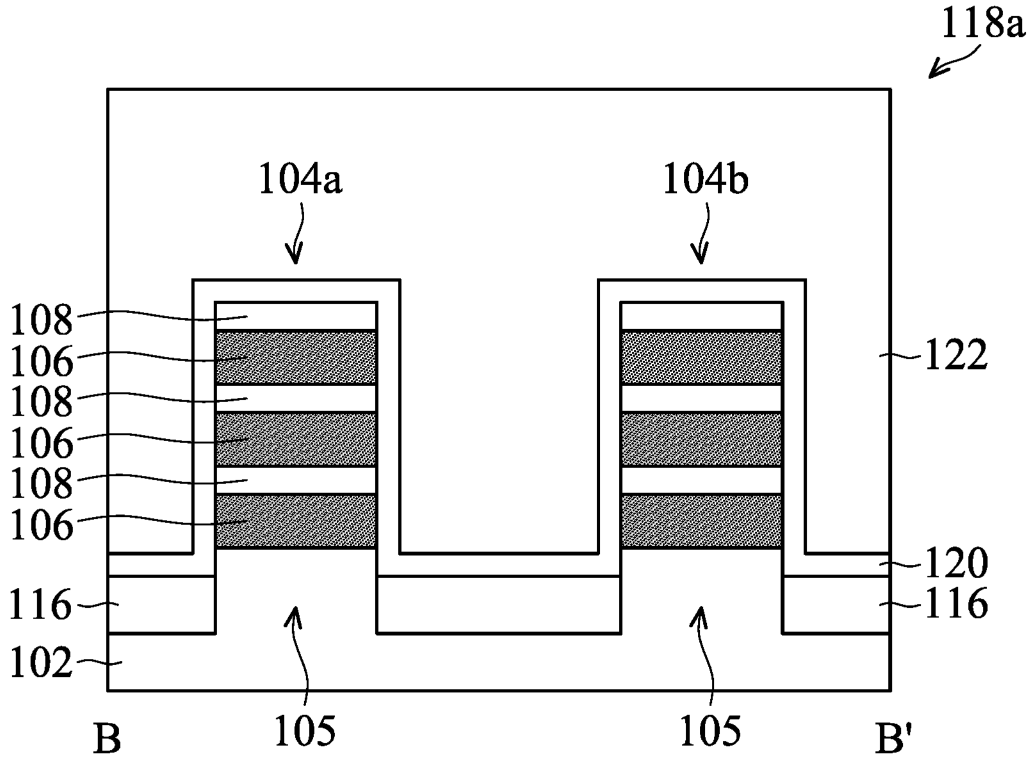
Figures 3, 10A:
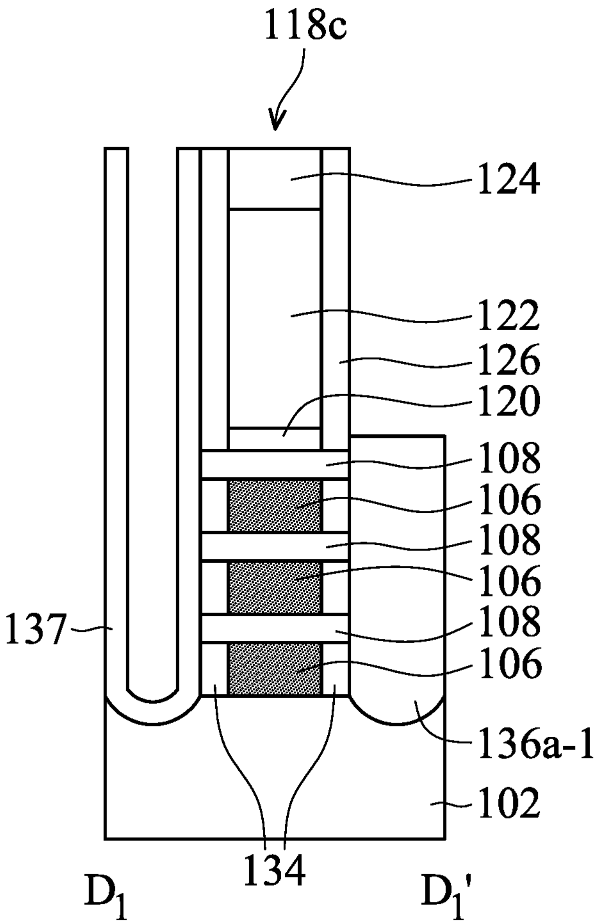
Figures 1, 10B:
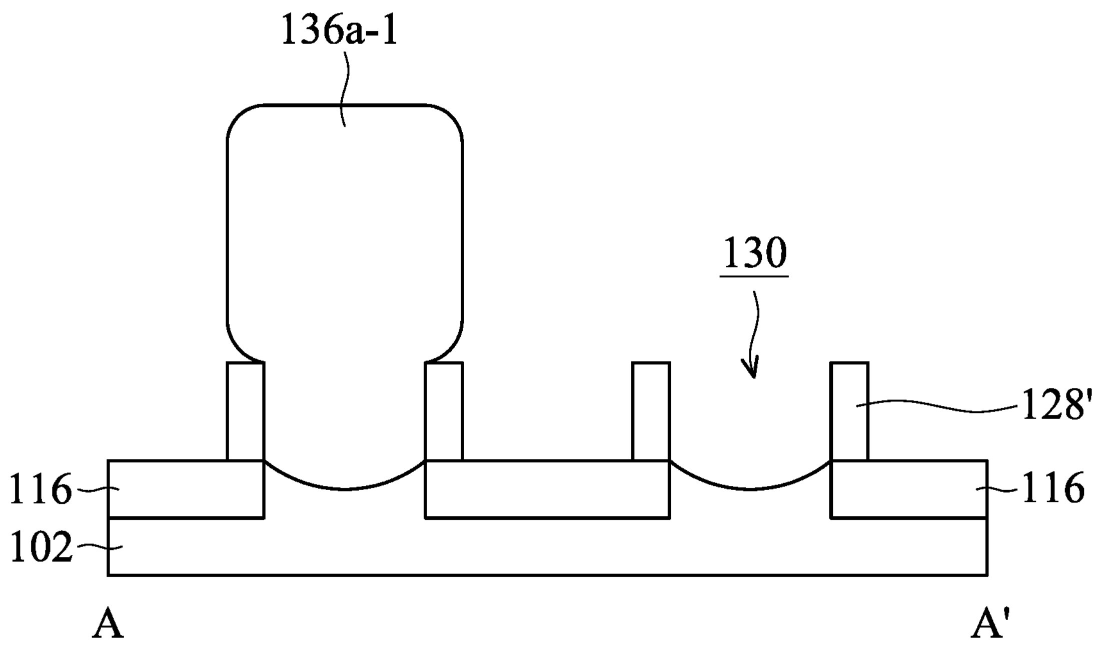
Figures 2, 10B:
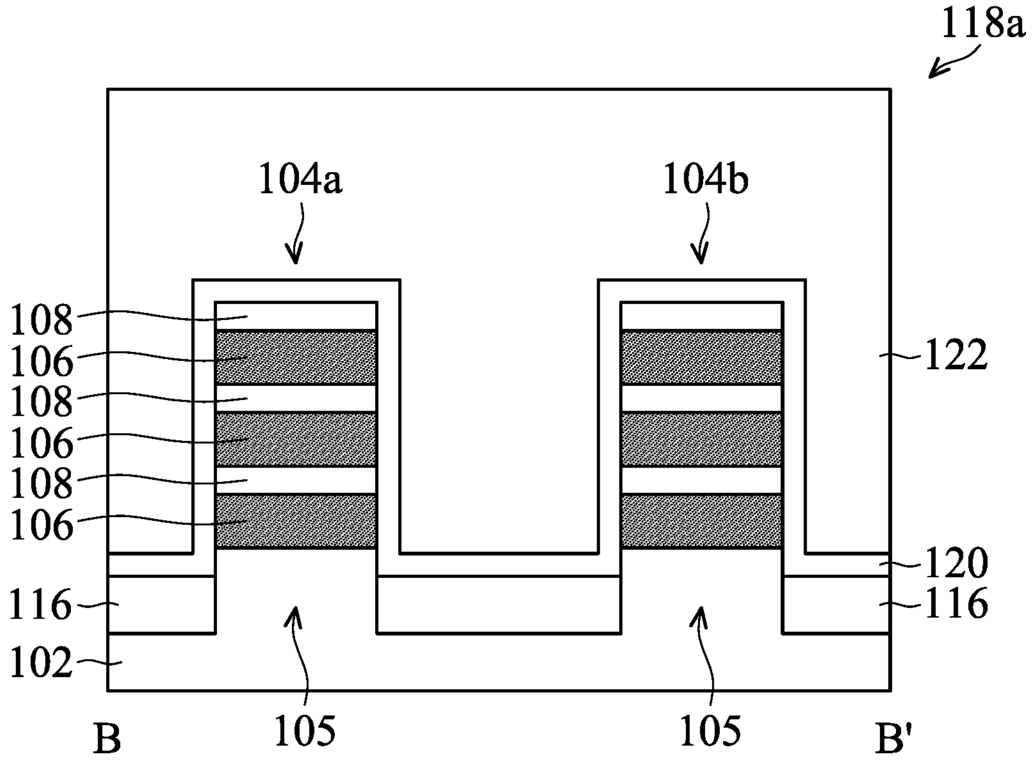
Figures 3, 10B:
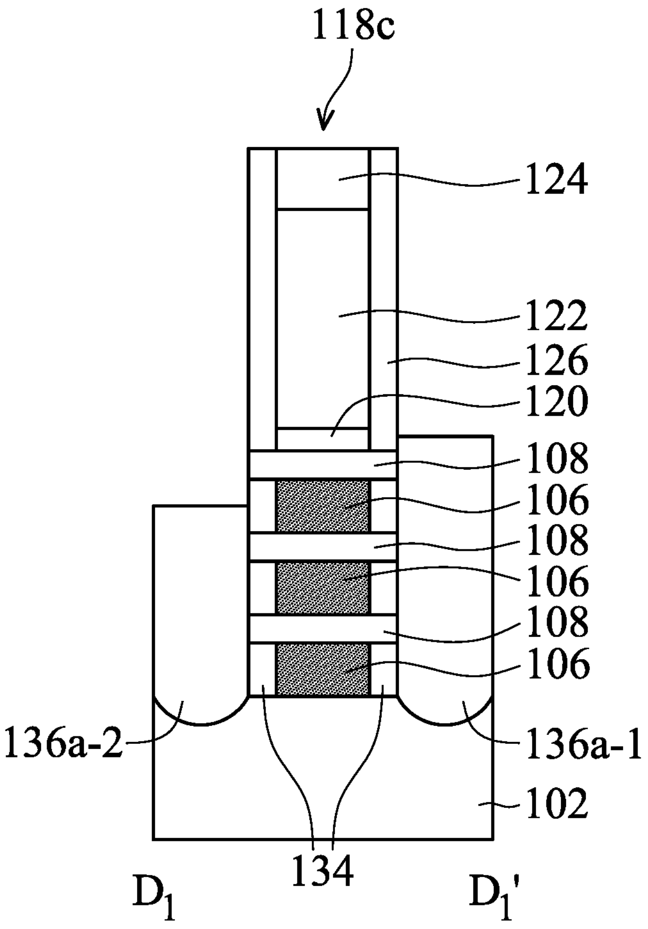
Figures 1, 10C:
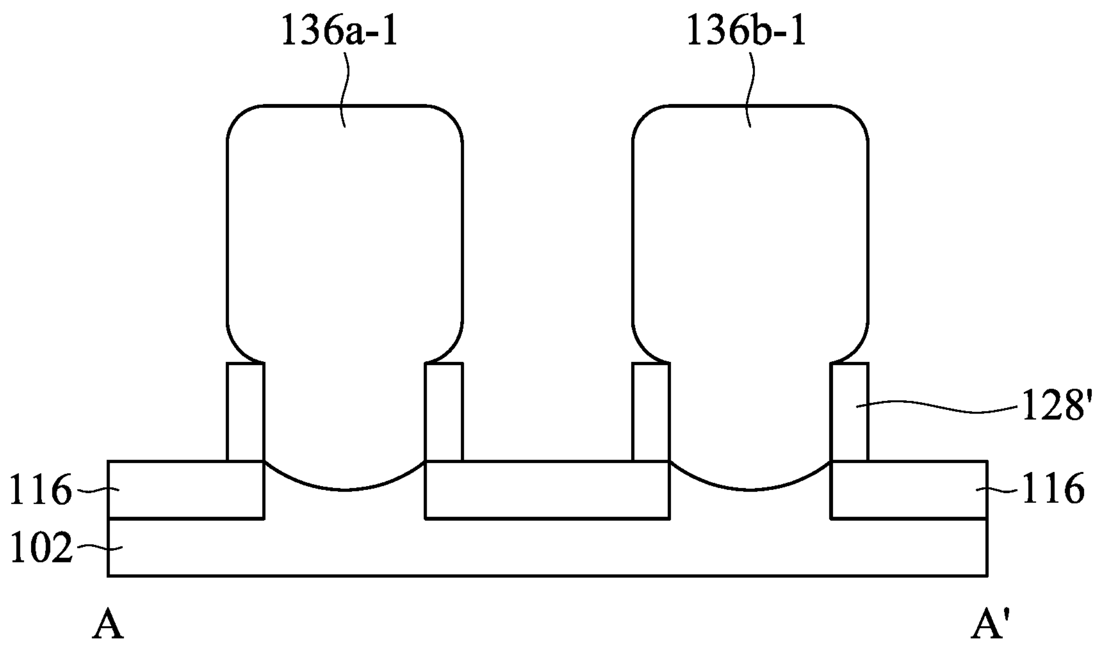
Figures 2, 10C:
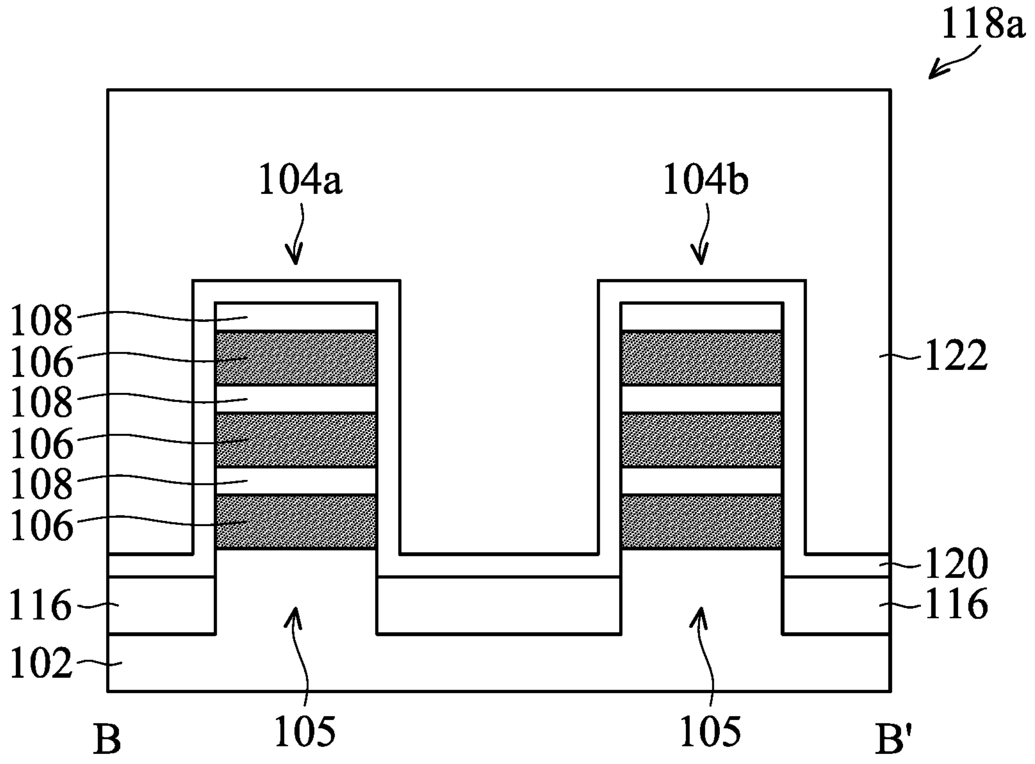
Figures 3, 10C:
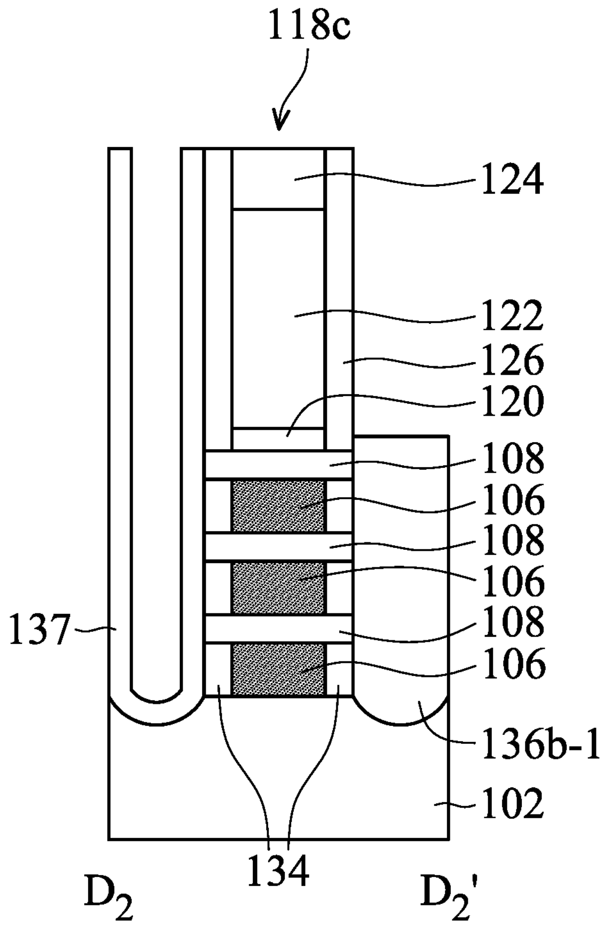
Figures 1, 10D:
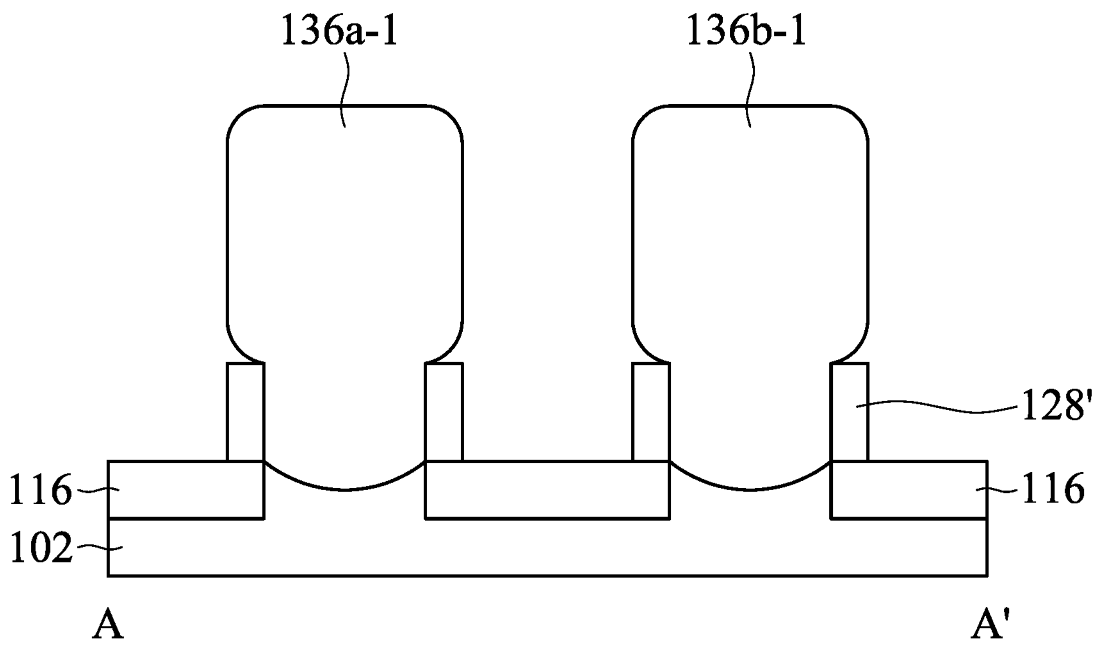
Figures 2, 10D:
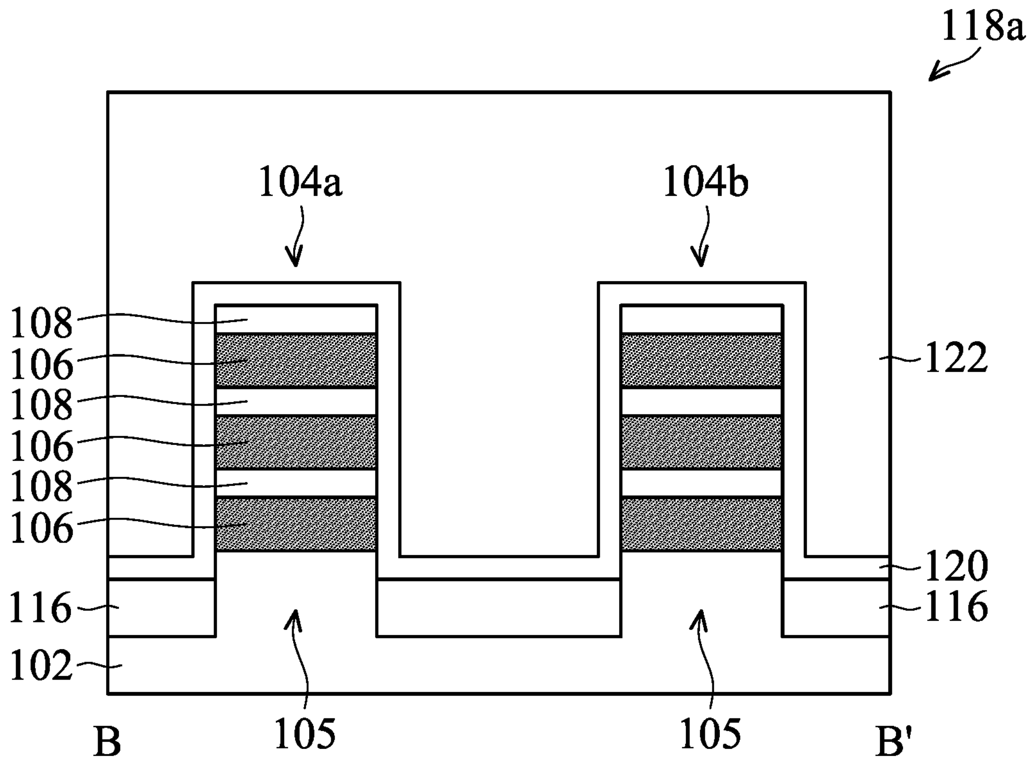
Figures 3, 10D:
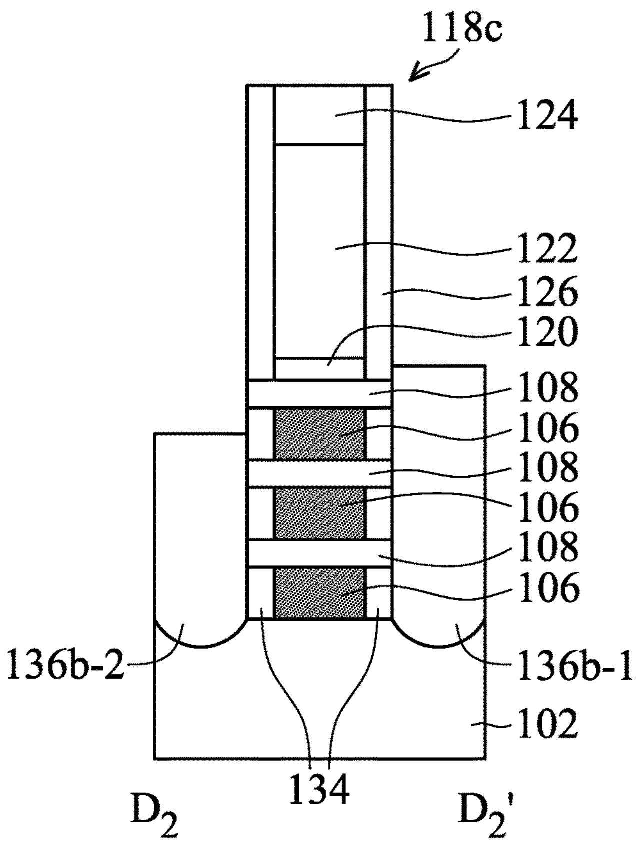
Figures 1, 10E:
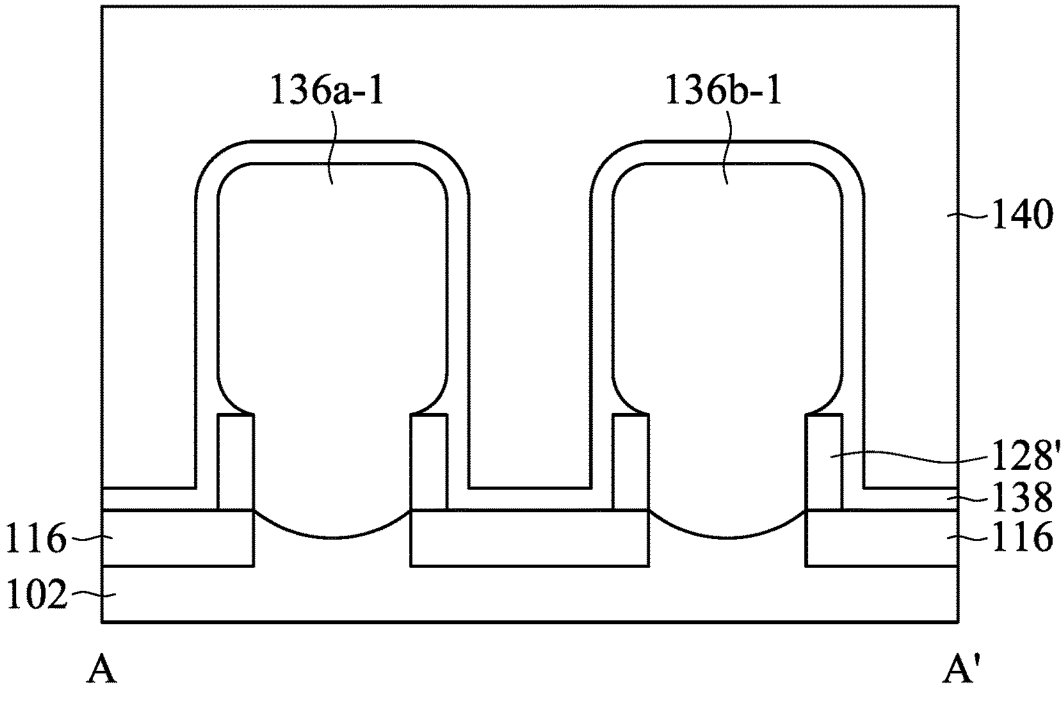
Figures 2, 10E:
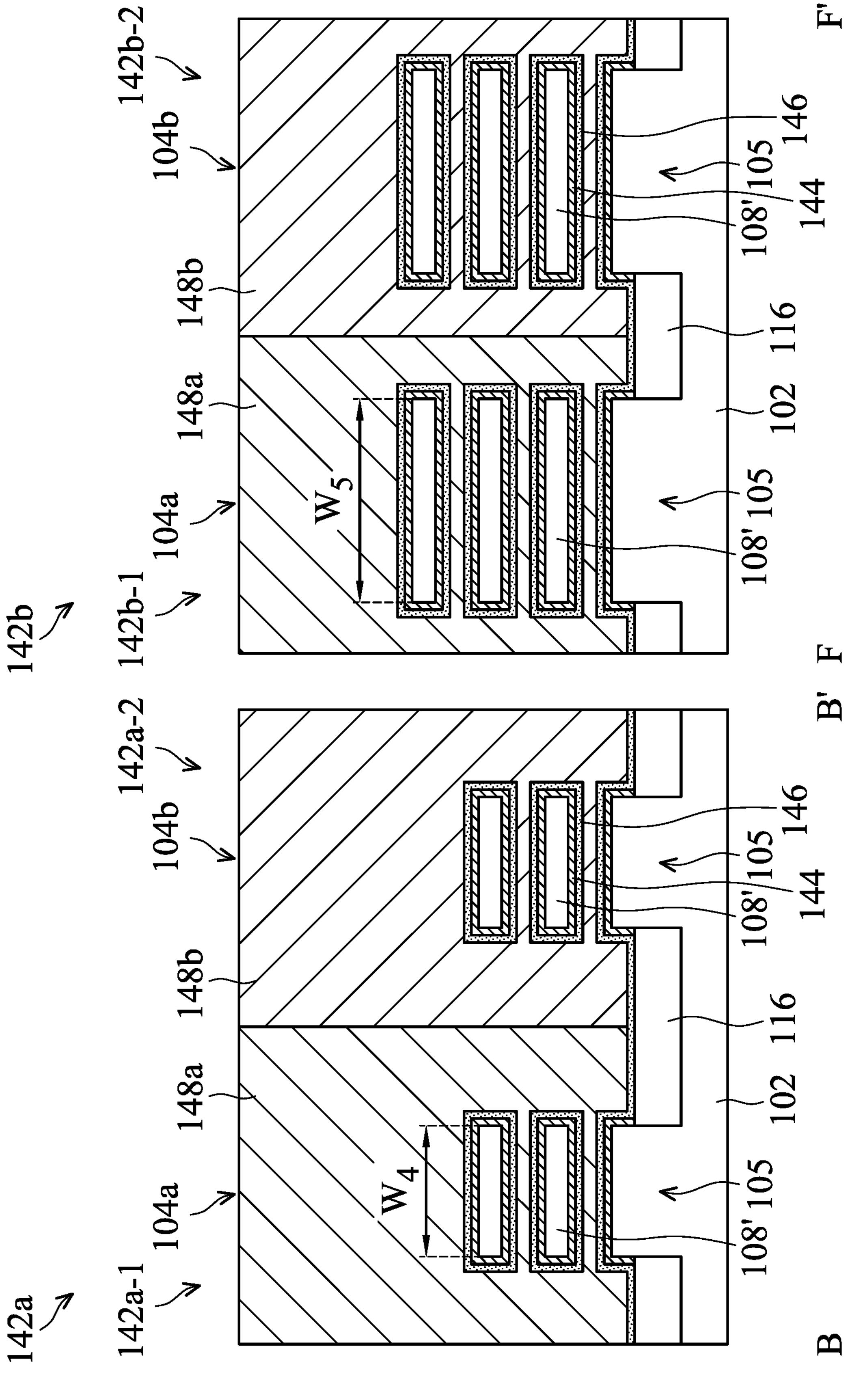
Figures 3, 10E:
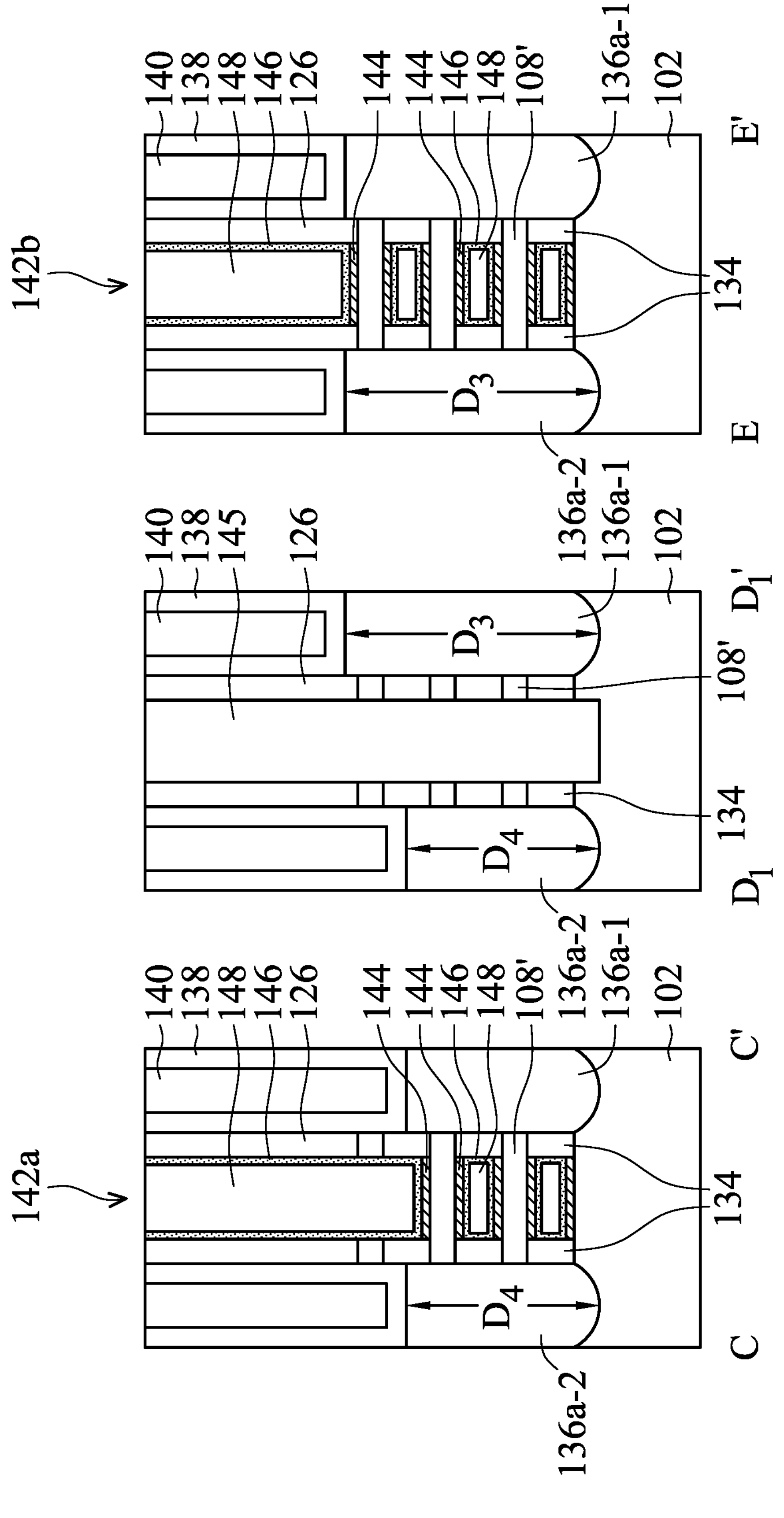
Figures 1, 10F:
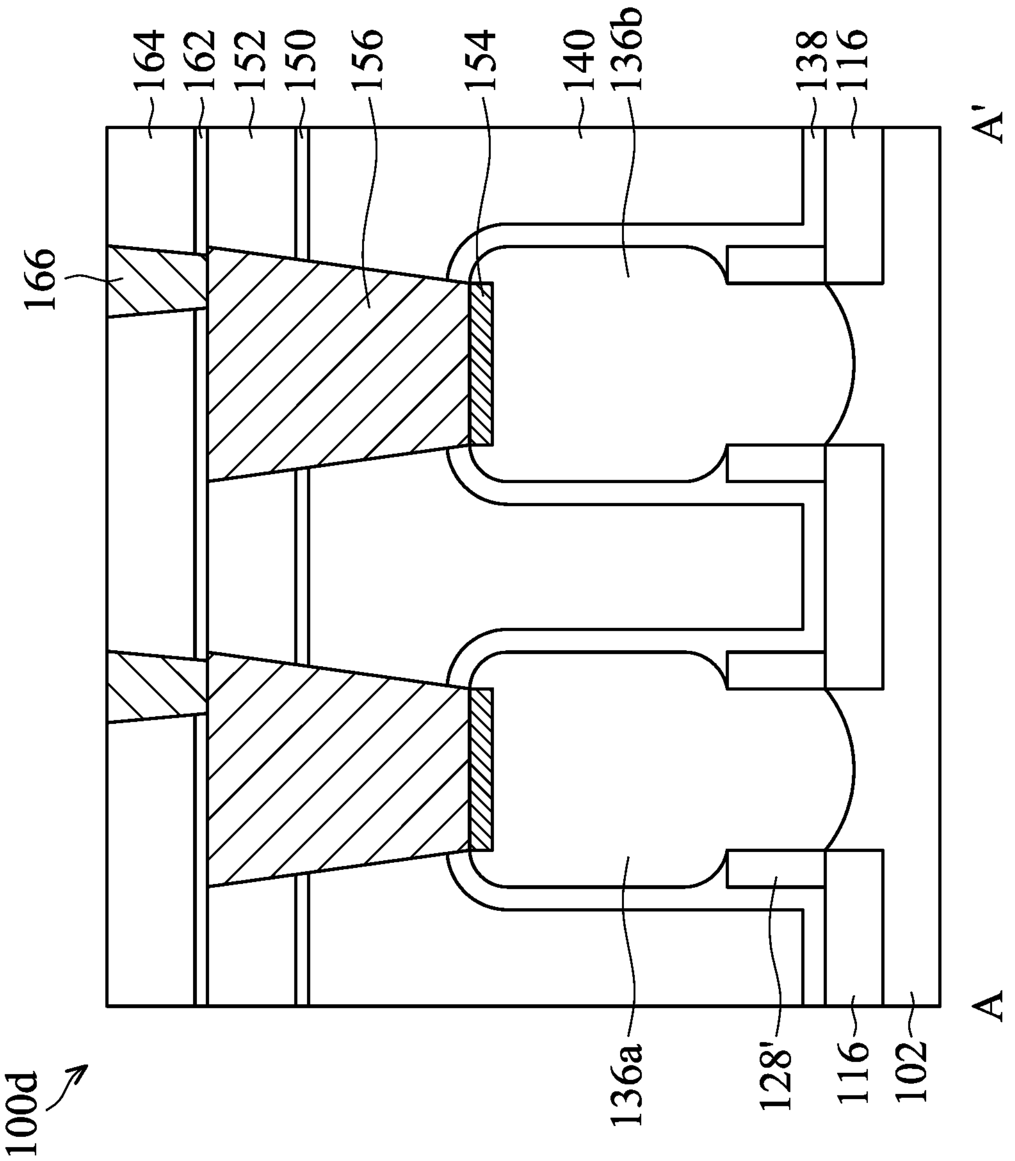
Figures 2, 10F:
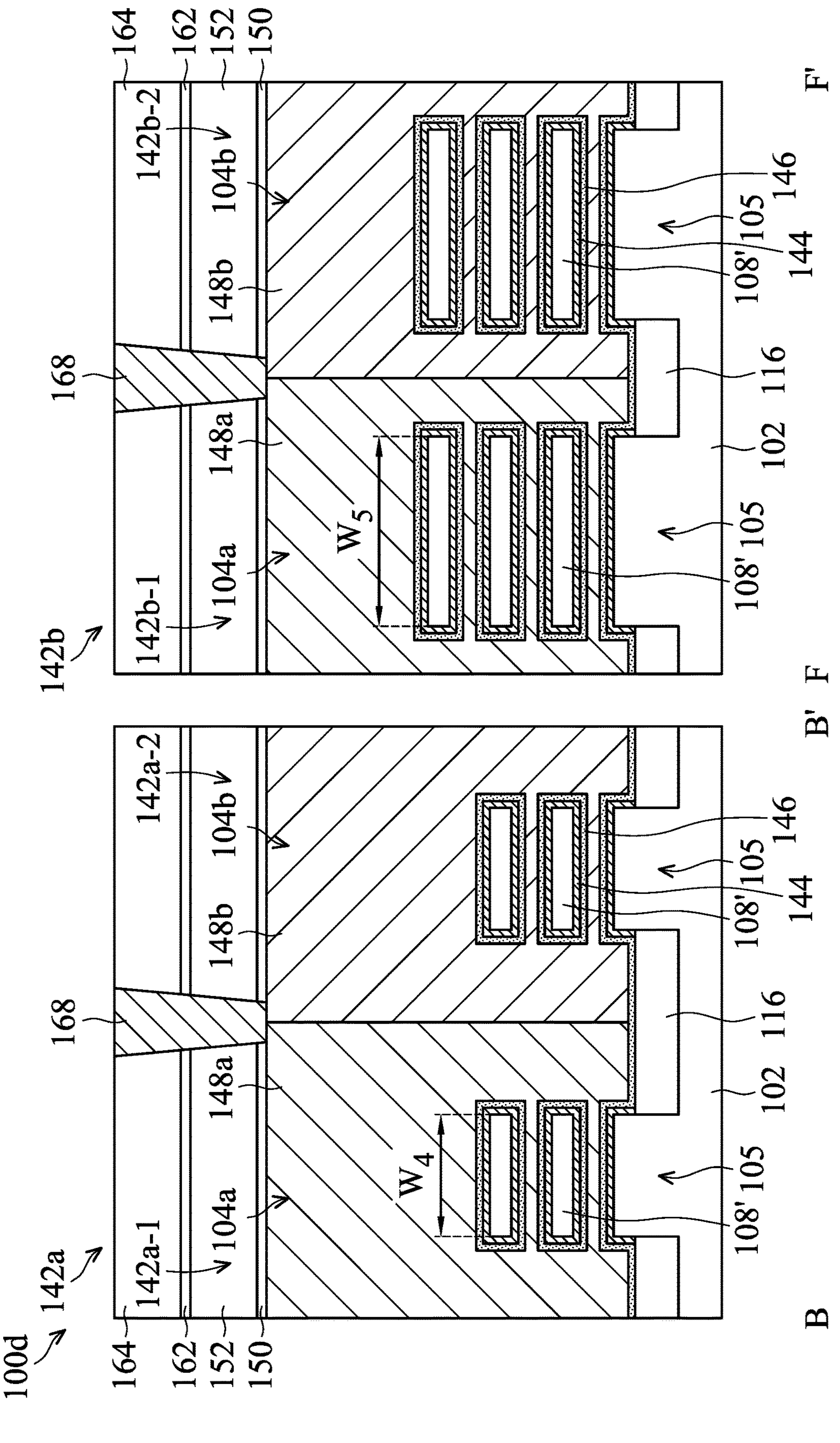
Figures 3, 10F:
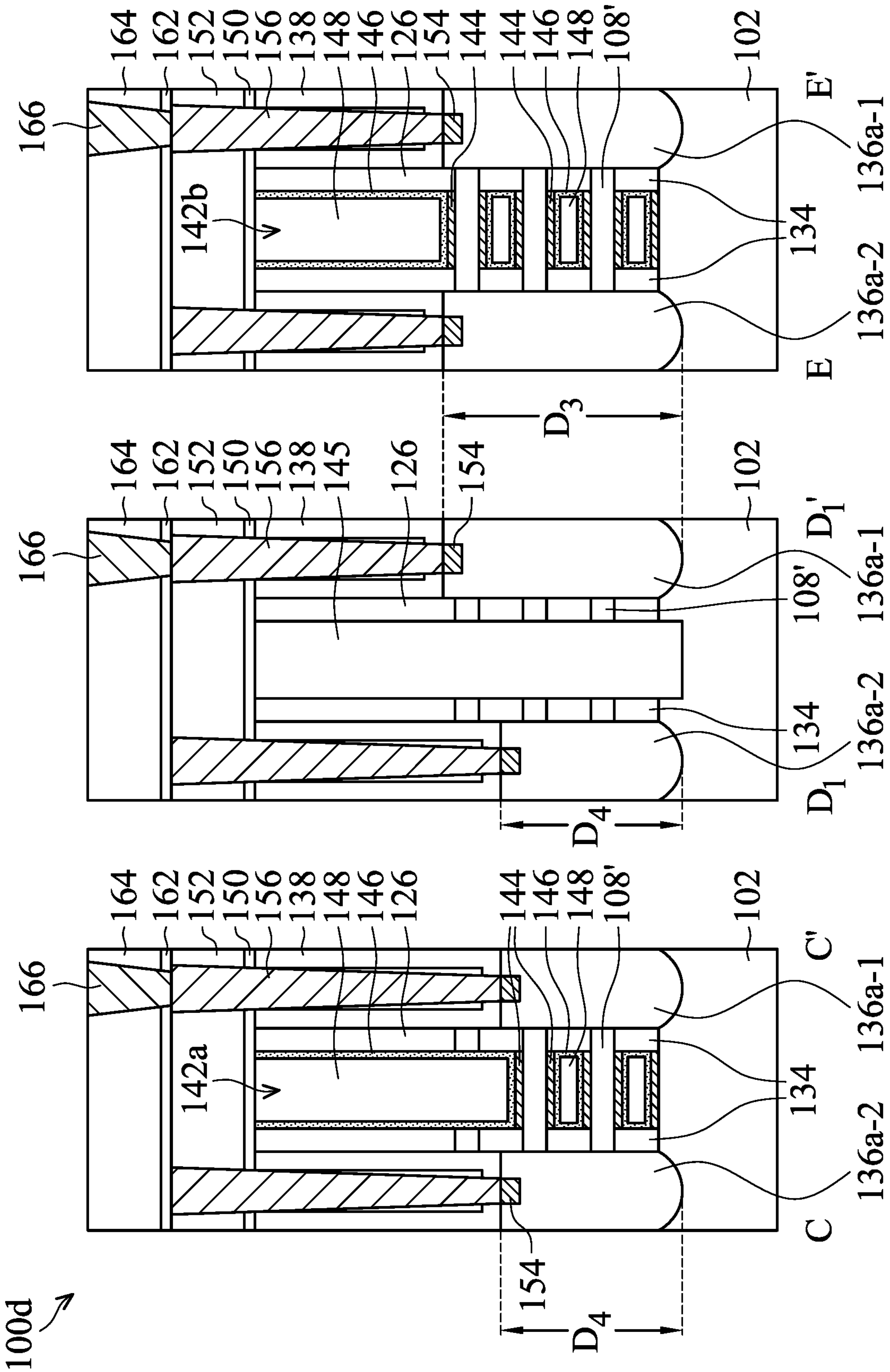

FIGS. 10A-1 to 10F-1 illustrate cross-sectional representations of various stages of manufacturing the semiconductor structure 100*d* shown along line A-A' in FIG. 8 and in FIG. 9, in accordance with some embodiments. FIGS. 10A-2 to 10D-2 illustrate cross-sectional representations of various stages of manufacturing the semiconductor structure 100*d* shown along line B-B' in FIG. 8 and in FIG. 9, in accordance with some embodiments. FIGS. 10E-2 to 10F-2 illustrate cross-sectional representations of various stages of manufacturing the semiconductor structure 100*d* shown along line B-B' and F-F' in FIG. 8 and in FIG. 9, in accordance with some embodiments.

FIGS. 10A-3 to 10B-3 illustrate cross-sectional representations of various stages of manufacturing the semiconductor structure 100*d* shown along line $D_1$-$D_1$' in FIG. 8 and in FIG. 9, in accordance with some embodiments. FIGS. 10C-3 to 10D-3 illustrate cross-sectional representations of various stages of manufacturing the semiconductor structure 100*d* shown along line $D_2$-$D_2$' in FIG. 8 and in FIG. 9, in accordance with some embodiments.

FIGS. 10E-3 to 10F-3 illustrate cross-sectional representations of various stages of manufacturing the semiconductor structure 100*d* shown along line C-C', $D_1$-$D_1$' and E-E' in FIG. 8 and in FIG. 9, in accordance with some embodiments. The semiconductor structure 100*d* of FIGS. 10A-1 to 10F-1, 10A-2 to 10F-2, and 10A-3 to 10F-3 includes elements that are similar to, or the same as, elements of the semiconductor structure 100*a* of FIGS. 3A-1 to 3M-1, 3A-2 to 3M-2 and 3A-3 to 3M-3.

As shown in FIGS. 10A-1, 10A-2 and 10A-3, the first S/D structure 136*a*-1 is formed in the S/D recesses 130, in accordance with some embodiments. In addition, as shown in FIG. 10A-3, the first S/D structure 136*a*-1 is formed on right side of the third dummy gate structure 118*c*, and a mask layer 137 is formed on the left side of the third dummy gate structure 118*c*.

In some embodiments, the first source/drain (S/D) structure 136*a*-1 is formed using an epitaxial growth process, such as Molecular beam epitaxy (MBE), Metal-organic Chemical Vapor Deposition (MOCVD), Vapor-Phase Epitaxy (VPE), other applicable epitaxial growth process, or a combination thereof. In some embodiments, the first source/drain (S/D) structure 136*a*-1 is made of any applicable material, such as Ge, Si, GaAs, AlGaAs, SiGe, GaAsP, SiP, SiC, SiCP, or a combination thereof.

Afterwards, as shown in FIGS. 10B-1, 10B-2 and 10B-3, the mask layer 137 is removed, and the first S/D structure 136*a*-2 is formed in the S/D recess 130 at the left side of the third dummy gate structure 118*c*, in accordance with some embodiments.

The top surface of the first S/D structure 136*a*-2 at the left side of the third dummy gate structure 118*c* is lower than the top surface of the first S/D structure 136*a*-1 at the right side of the third dummy gate structure 118*c*. The top surface of the first S/D structure 136*a*-2 is lower than the topmost second semiconductor material layer 108.

Next, as shown in FIGS. 10C-1, 10C-2 and 10C-3, the second S/D structure 136*b*-1 is formed adjacent to the first S/D structure 136*a*-1, in accordance with some embodiments. As shown in FIG. 10C-3, the second S/D structure 136*b*-1 is formed on right side of the third dummy gate structure 118*c*, and the mask layer 137 is formed on the left side of the third dummy gate structure 118*c*. The second S/D structure 136*b*-1 and the first S/D structure 136*a*-1 are made of different materials.

In some embodiments, the second source/drain (S/D) structure 136*b*-1 is formed using an epitaxial growth process, such as Molecular beam epitaxy (MBE), Metal-organic Chemical Vapor Deposition (MOCVD), Vapor-Phase Epitaxy (VPE), other applicable epitaxial growth process, or a combination thereof. In some embodiments, the second source/drain (S/D) structure 136*b*-1 is made of any applicable material, such as Ge, Si, GaAs, AlGaAs, SiGe, GaAsP, SiP, SiC, SiCP, or a combination thereof.

Afterwards, as shown in FIGS. 10D-1, 10D-2 and 10D-3, the mask layer 137 is removed, and the second S/D structure 136*b*-2 is formed in the S/D recess 130 at the left side of the third dummy gate structure 118*c*, in accordance with some embodiments.

As shown in FIG. 10D-3, the top surface of the second S/D structure 136*b*-2 at the left side of the third dummy gate structure 118*c* is lower than the top surface of the second S/D structure 136*b*-1 at the right side of the third dummy gate structure 118*c*. The top surface of the second S/D structure 136*b*-2 is lower than the topmost second semiconductor material layer 108.

Next, as shown in FIGS. 10E-1, 10E-2 and 10E-3, the first gate structure 142*a*, the dielectric structure 145 and the second gate structure 142*b* are formed across the first fin structure 104*a* and the second fin structure 104*b*, in accordance with some embodiments. The dielectric structure 145 is between the first gate structure 142*a* and the second gate structure 142*b*.

The dielectric structure 145 is formed by following processes. The third dummy gate structure 118*c*, and the first semiconductor material layers 106 and the second semiconductor material layer 108 are removed to form a trench and a dielectric material is filled into the trench to form the dielectric structure 145. The bottom surface of the dielectric structure 145 is lower than the bottom surface of first S/D structure 136*a*-1 and 136*a*-2. In addition, the dielectric structure 145 is in direct contact with the inner spacer layer 134 and the gate spacer layer 126.

FIG. 10E-2 illustrate cross-sectional representation of the semiconductor structure 100*d* shown along line B-B' and F-F' in FIG. 8 and in FIG. 9, in accordance with some embodiments.

In the cross-sectional representation taken along line B-B' in FIG. 8 and in FIG. 9, there are two nanostructures 108' directly below and surrounded by the first gate structure 142*a*. In the cross-sectional representation taken along line F-F' in FIG. 8 and in FIG. 9, there are three nanostructures 108' directly below and surrounded by the second gate structure 142*b*. Therefore, the number of nanostructures 108' directly below the first gate structure 142*a* is smaller than the number of nanostructures 108' directly below the second gate structure 142*b*.

In addition, the fourth width $W_4$ of the nanostructures 108' along the second direction (e.g. y-axis) directly below the first gate structure 142*a* is smaller than the fifth width $W_5$ of the nanostructures 108' along the second direction (e.g. y-axis) directly below the second gate structure 142*b*.

FIG. 10E-3 illustrate cross-sectional representation of the semiconductor structure 100*d* shown along line C-C', $D_1$-$D_1$' and E-E' in FIG. 8 and in FIG. 9, in accordance with some embodiments. The first dummy gate structure 118*a* is replaced with the first gate structure 142*a*, the third dummy gate structure 118*c* is replaced with the dielectric structure 145, and the second dummy gate structure 118*b* is replaced with the second gate structure 142*b*.

In the cross-sectional representation taken along line C-C' in FIG. 8 and in FIG. 9, the first S/D structure 136*a*-2 is one the left side of the first gate structure 142*a* and the first S/D structure 136*a*-2 is on the right side of the first gate structure 142*a*.

In the cross-sectional representation taken along line D1-D1' in FIG. 8 and in FIG. 9, the first S/D structure 136*a*-2 is one the left side of the first gate structure 142*a* and the first S/D structure 136*a*-1 is on the right side of the dielectric structure 145.

In the cross-sectional representation taken along line E-E' in FIG. 8 and in FIG. 9, the first S/D structure 136*a*-1 is one the left side of the second gate structure 142*b* and the first S/D structure 136*a*-1 is on the right side of the second gate structure 142*b*. Note that, in the cross-sectional representation taken along line D1-D1' in FIG. 8 and in FIG. 9, the top surface of first S/D structure 136*a*-1 is higher than the top surface of first S/D structure 136*a*-2.

The first S/D structure 136*a*-1 has a third depth $D_3$, and the first S/D structure 136*a*-2 has a fourth depth $D_4$. In some embodiments, the third depth $D_3$ is greater than the fourth depth $D_4$. In some embodiments, there is a difference of about 5 nm to about 50 nm between the third depth $D_3$ and the fourth depth $D_4$.

It should be noted that, in the cross-sectional representation taken along line C-C' in FIG. 8 and in FIG. 9, the topmost nanostructure 108' is divided into two portions by the first gate structure 142*a*, and the two portions of the first gate structure 142*a* are in direct contact with the gate spacer layer 126. The first gate structure 142*a* has a continuous sidewall surface in direct contact with the gate spacer layer 126, and the continuous sidewall surface of the first gate structure 142*a* is in direct contact with the topmost nanostructure 108'.

Afterwards, as shown in FIGS. 10F-1, 10F-2 and 10F-3, the etching stop layer 150 and the dielectric layer 152 are formed over the first gate structure 142*a*, the dielectric structure 145 and the second gate structure 142*b*. Afterwards, the S/D contact structure 156 is formed through the dielectric layer 152, the etching stop layer 150 and the dielectric layer 140.

Next, the etching stop layer 162 and the dielectric layer 164 are formed over the dielectric layer 152. Afterwards, the S/D conductive via structure 166 is formed through the dielectric layer 164 and the etching stop layer 162. The gate contact structure 168 is formed through the dielectric layer 164, the etching stop layer 162, the dielectric layer 152 and the etching stop layer 150. The gate contact structure 168 is connected to the first gate structure 142*a* and the second gate structure 142*b*.

As shown in FIG. 10F-2, in the cross-sectional representation taken along line B-B' and F-F' in FIG. 8 and in FIG. 9, the number of nanostructures 108' directly below the first gate structure 142*a* is smaller than the number of nanostructures 108' directly below the second gate structure 142*b*.

As shown in FIG. 10F-3, in the cross-sectional representation taken along line E-E' in FIG. 8 and in FIG. 9, the topmost surface of the inner spacer layer 134 is higher than the top surface of the first S/D structure 136*a*-2. In addition, the topmost surface of the inner spacer layer 134 is higher than the bottom surface of S/D contact structure 156. In other words, the top surface of the first S/D structure 136*a*-2 is lower than the top surface of the topmost nanostructures 108' (channel layer 108').

In the cross-sectional representation taken along line C-C' and E-E' in FIG. 8 and in FIG. 9, the top surface of the first S/D structure 136*a*-1 in direct contact with three nanostructures 108' is higher than the top surface of the first S/D structure 136*a*-2 in direct contact with two nanostructures 108'.

Figure 11:
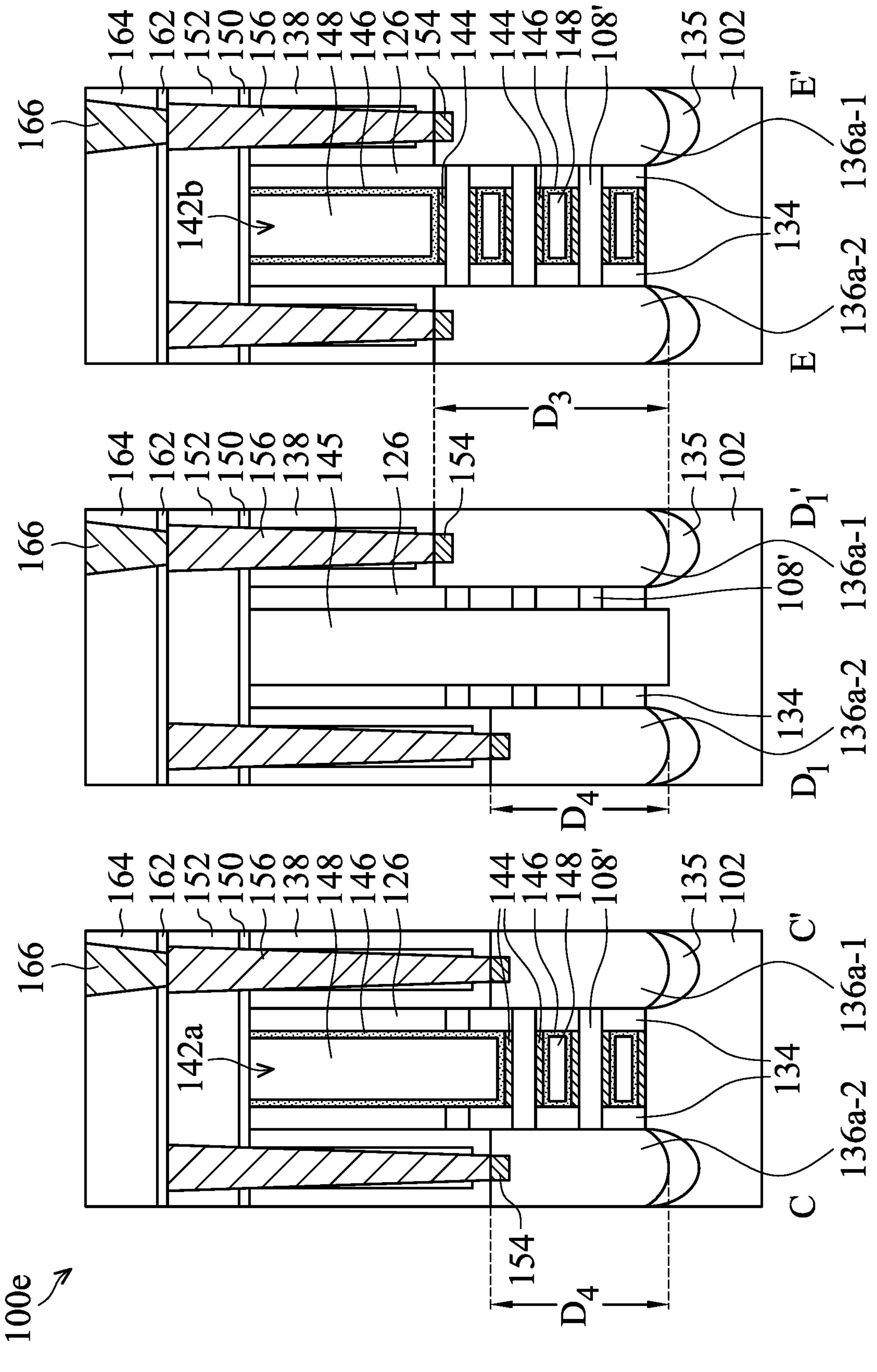
FIG. 11 illustrates a cross-sectional view of a semiconductor structure, in accordance with some embodiments.

FIG. 11 illustrates a cross-sectional view of a semiconductor structure 100*e*, in accordance with some embodiments. The semiconductor structure 100*e* of FIG. 11 includes elements that are similar to, or the same as, elements of the semiconductor structure 100*d* of FIG. 10F-3. The difference between FIG. 11 and FIG. 10F-3 is that there is a bottom isolation layer 135 below the first source/drain (S/D) structure 136*a*-1 and the first S/D structure 136*a*-2. The bottom isolation layer 135 is used to reduce leakage from the semiconductor structure 100*a*.

In some embodiments, the bottom isolation layer 135 includes un-doped Si, un-doped SiGe or a combination thereof. In some embodiments, the bottom isolation layer 135 is formed by an epitaxy or epitaxial (epi) process. The epi process may include a selective epitaxial growth (SEG) process, CVD deposition techniques (e.g., vapor-phase epitaxy (VPE) and/or ultra-high vacuum CVD (UHV-CVD)), molecular beam epitaxy, or other suitable epi processes.

Figures 1, 12A:
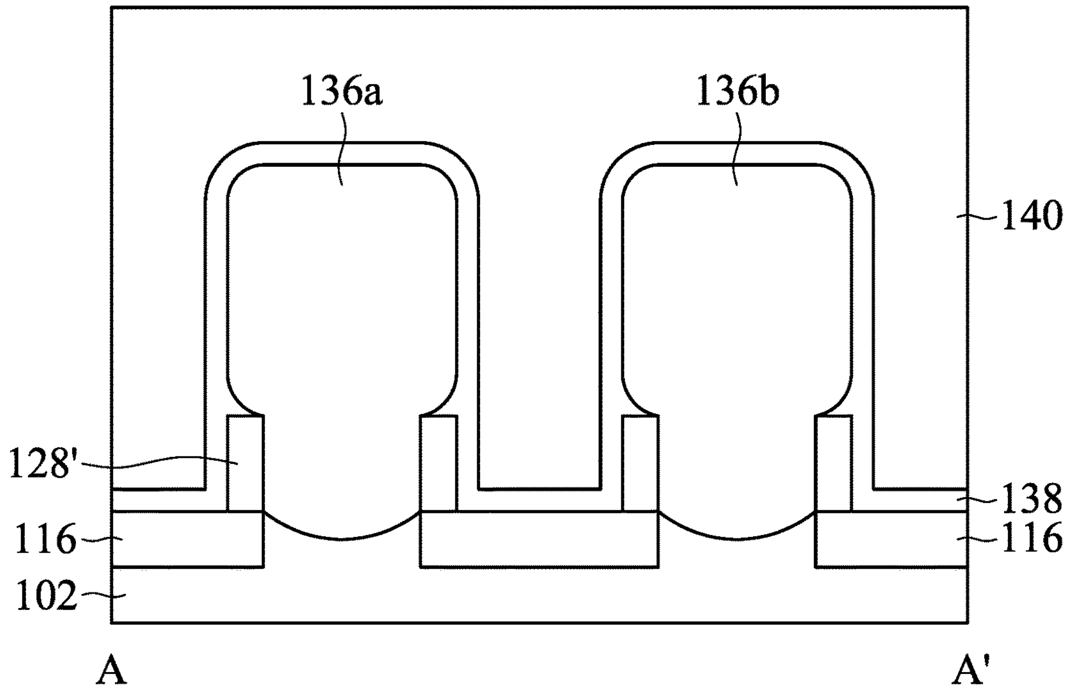
Figures 2, 12A:
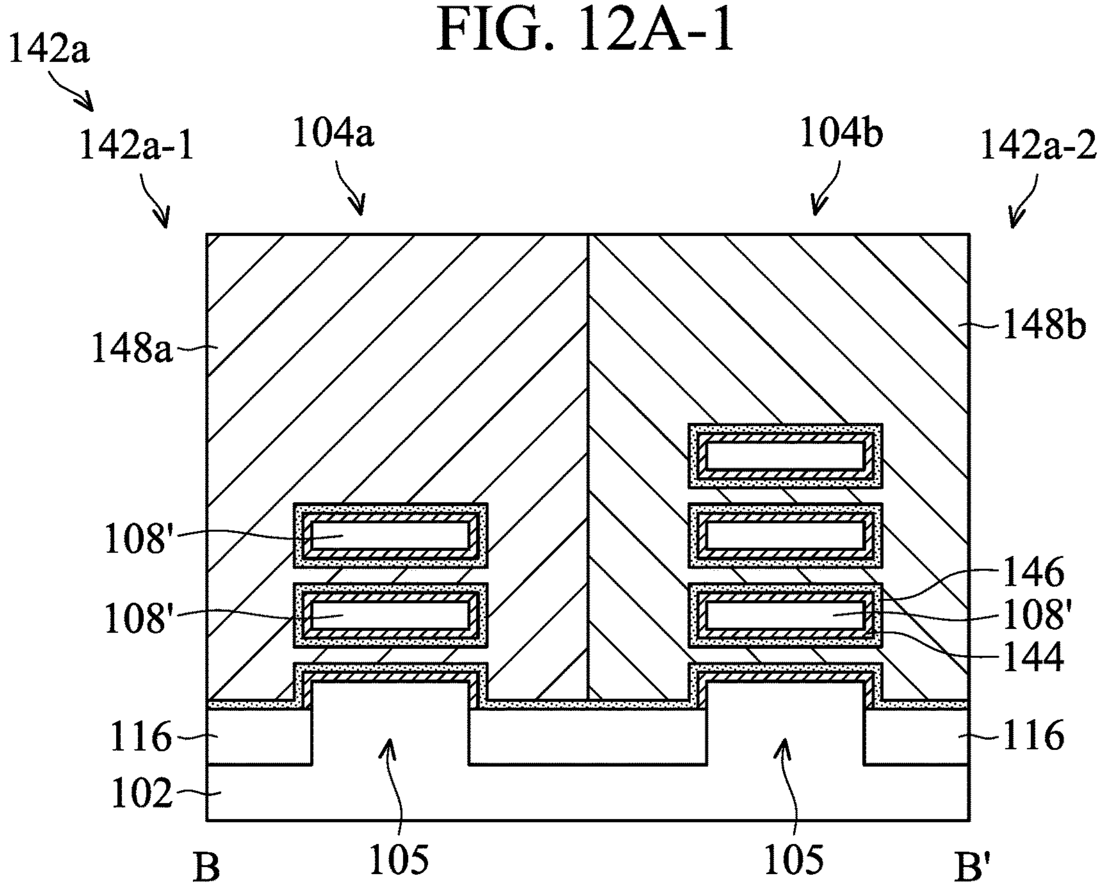
Figures 3, 12A:
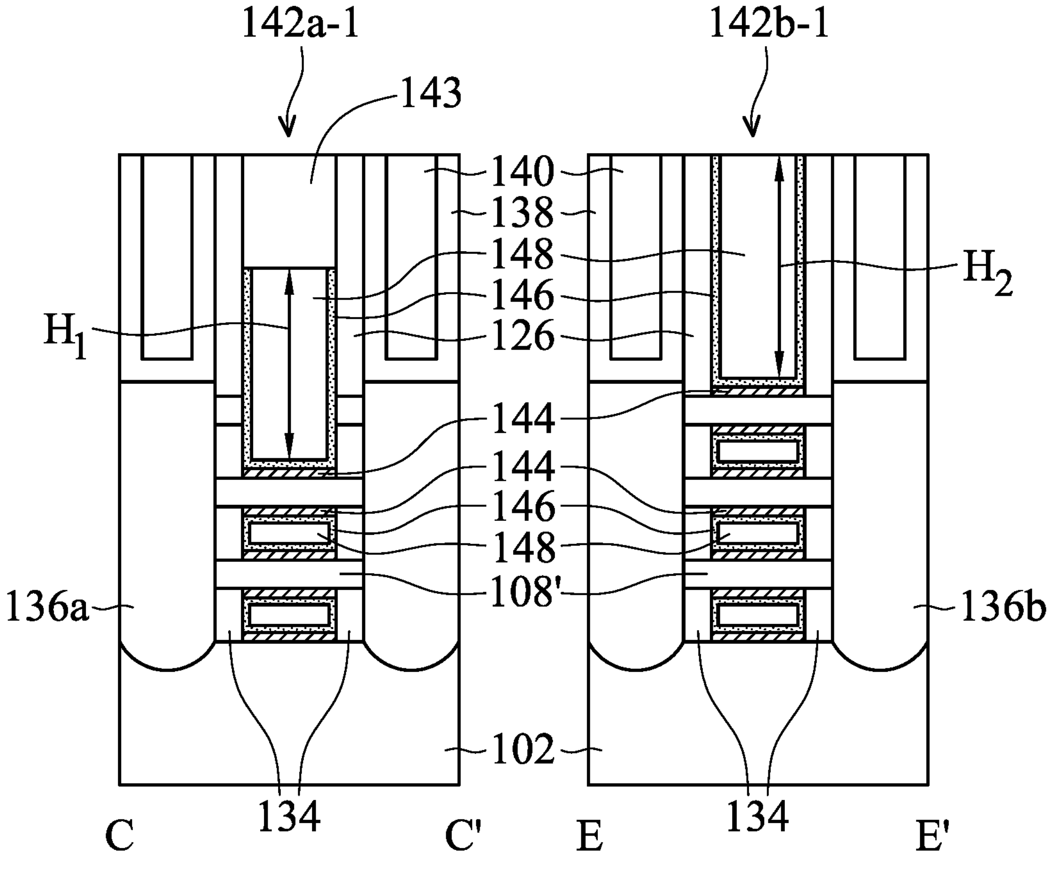
Figures 1, 12B:
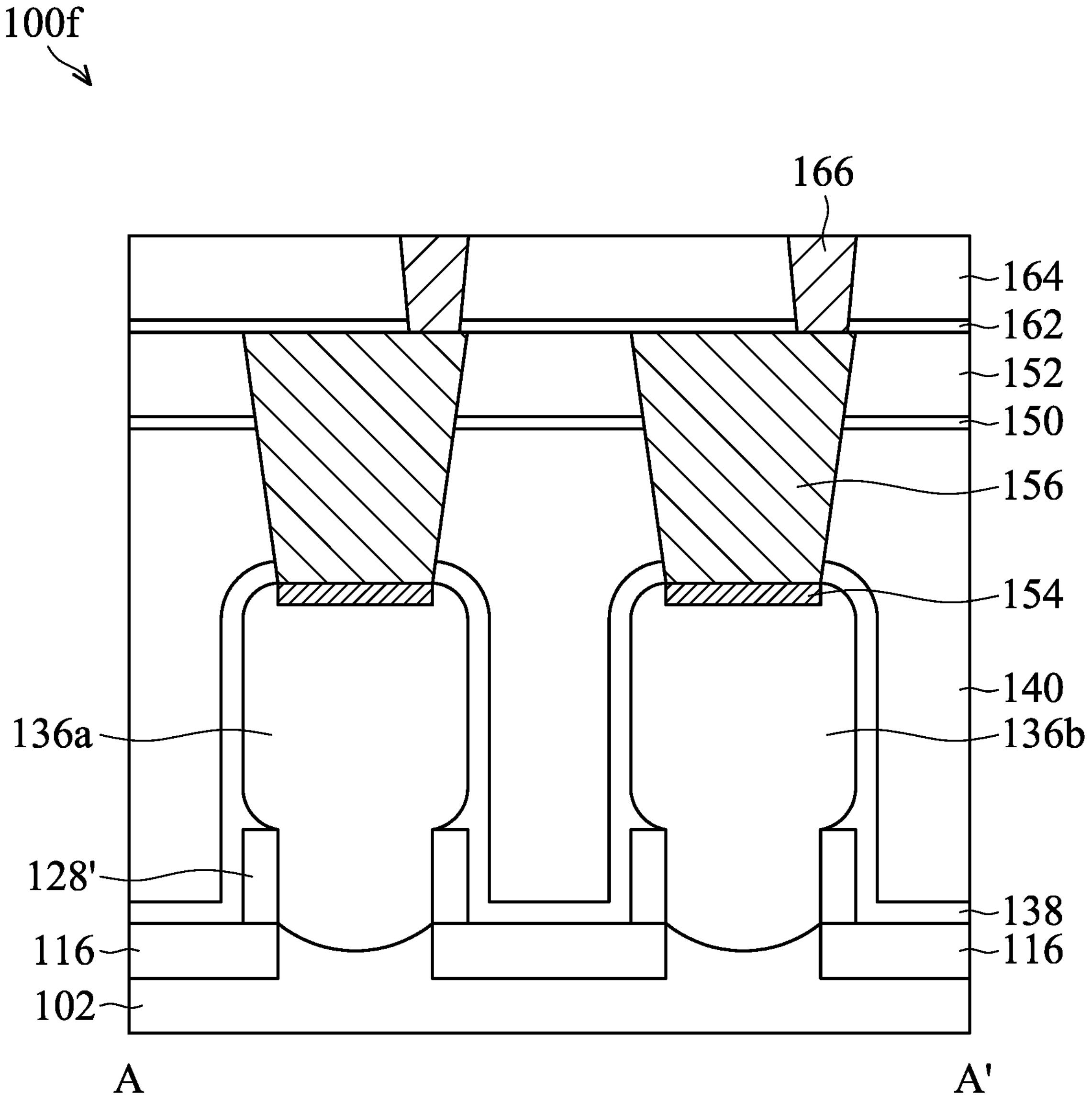
Figures 2, 12B:
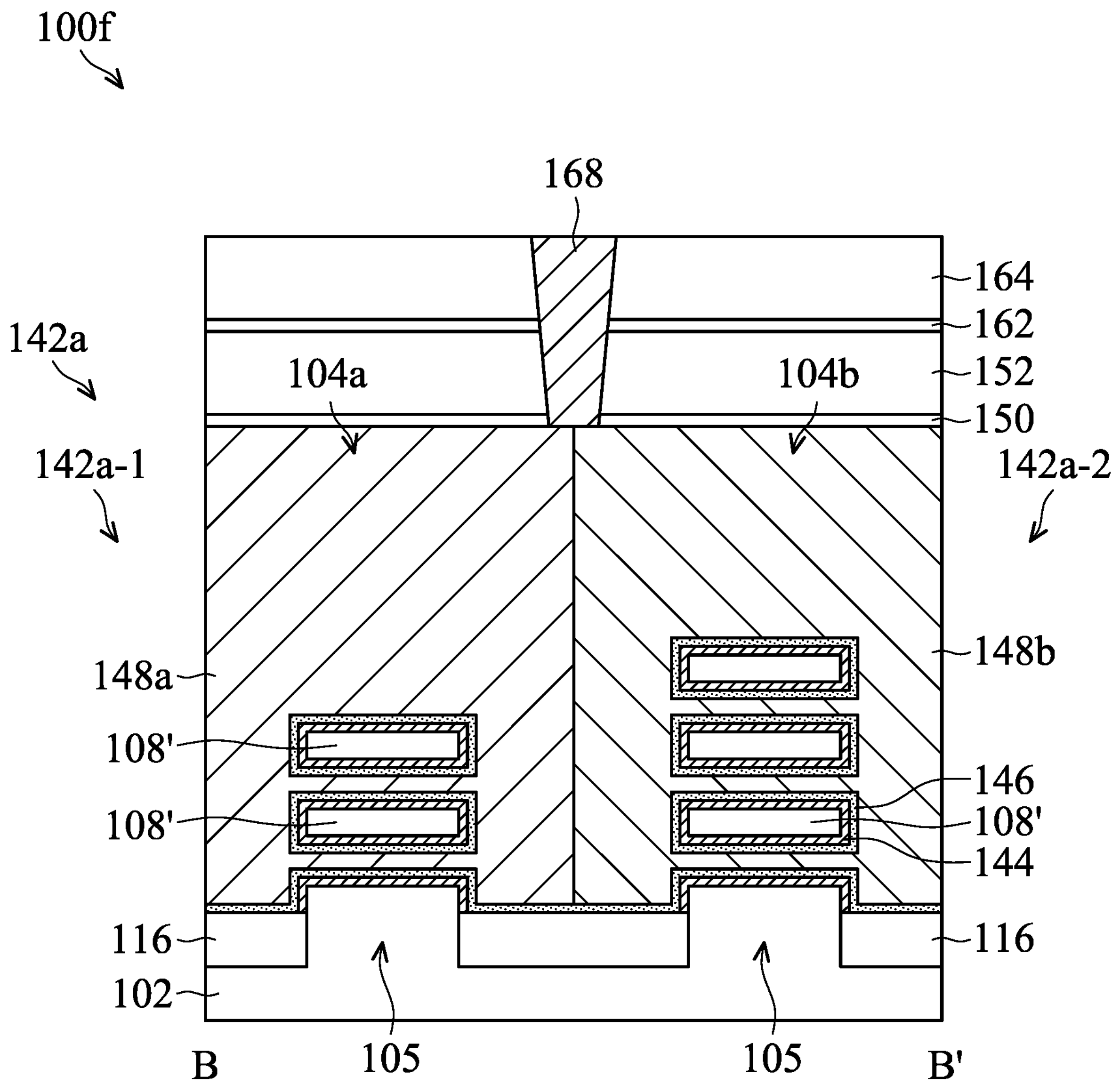
Figures 3, 12B:
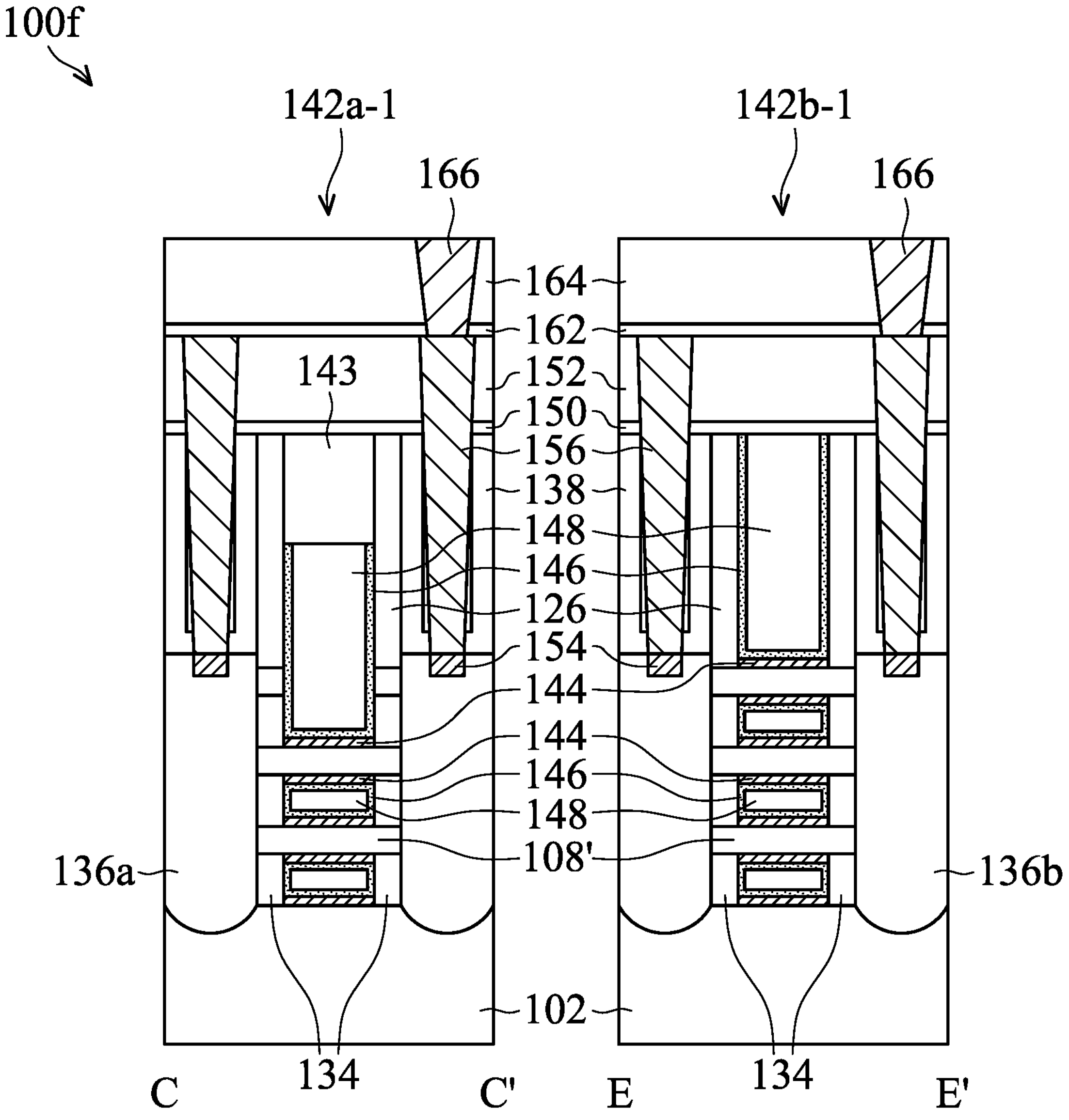

FIGS. 12A-1 to 12B-1 illustrate cross-sectional representations of various stages of manufacturing a semiconductor structure 100*f* shown along line A-A' in FIG. 8 and in FIG. 9, in accordance with some embodiments. FIGS. 12A-2 to 12B-2 illustrate cross-sectional representations of various stages of manufacturing the semiconductor structure 100*f* shown along line B-B' in FIG. 8 and in FIG. 9, in accordance with some embodiments. FIGS. 12A-3 to 12B-3 illustrate cross-sectional representations of various stages of manufacturing the semiconductor structure 100*f* shown along line C-C' and E-E' in FIG. 8 and in FIG. 9, in accordance with some embodiments.

FIGS. 12A-1 and 12A-2 includes elements that are similar to, or the same as, elements of the semiconductor structure 100*a* of FIGS. 3L-1 and 3L-2.

As shown in 12A-3, the top surface of the second gate structure 142*b* is substantially leveled with the top surface of the gate spacer layer 126 shown along line E-E' in FIG. 8 and in FIG. 9. However, the top surface of the first gate structure 142*a* is lower than the top surface of the gate spacer layer 126 shown along line C-C' in FIG. 8 and in FIG. 9. The top surface of the first gate structure 142*a* is lower than the top surface of the second gate structure 142*b*. The top portion of the first gate structure 142*a* which is in direct contact with the gate spacer layer 126 has a first height $H_1$. The top portion of the second gate structure 142*b* which is in direct contact with the gate spacer layer 126 has a second height $H_2$. In some embodiments, the first height $H_1$ is smaller than the second height $H_2$. In some embodiments, there is a height difference of about 5 nm to about 50 nm between the second height $H_2$ and the first height $H_1$.

The top portion of the first gate structure 142*a* is removed to form a recess (not shown), and the mask layer 143 is filled into the recess. Note that the number of nanostructures 108' (or channel layers) directly below the first gate structure 142*a* is smaller than the number of nanostructures 108' (or channel layers) directly below the second gate structure 142*b*.

Figure 13:
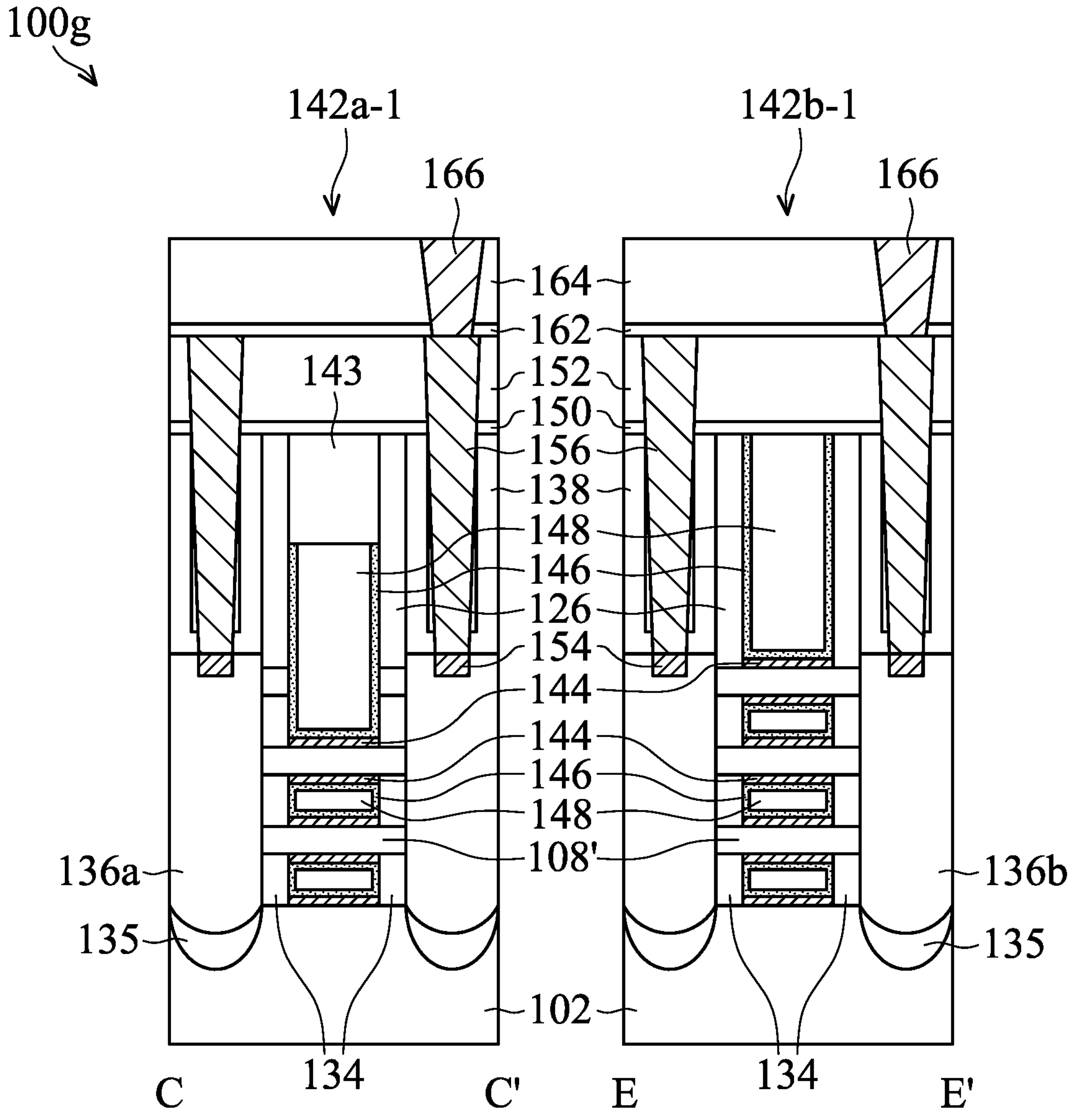
FIG. 13 illustrates a cross-sectional view of a semiconductor structure, in accordance with some embodiments.

FIG. 13 illustrates a cross-sectional view of a semiconductor structure 100*g*, in accordance with some embodiments. The semiconductor structure 100*g* of FIG. 13 includes elements that are similar to, or the same as, elements of the semiconductor structure 100*f* of FIG. 12B-3. The difference between FIG. 13 and FIG. 12B-3 is that there is a bottom isolation layer 135 below the first source/drain (S/D) structure 136*a*. The bottom isolation layer 135 is used to reduce leakage from the semiconductor structure 100*a*.

In some embodiments, the bottom isolation layer 135 includes un-doped Si, un-doped SiGe or a combination thereof. In some embodiments, the bottom isolation layer 135 is formed by an epitaxy or epitaxial (epi) process. The epi process may include a selective epitaxial growth (SEG) process, CVD deposition techniques (e.g., vapor-phase epitaxy (VPE) and/or ultra-high vacuum CVD (UHV-CVD)), molecular beam epitaxy, or other suitable epi processes.

It should be appreciated that semiconductor structures 100*a* to 100*g* having different number of nanostructures 108' (or channel layers) in different regions for performing different functions described above may also be applied to FinFET structures, although this is not shown in the figures.

It should be noted that same elements in FIGS. 1A to 13 may be designated by the same numerals and may include similar or the same materials and may be formed by similar or the same processes; therefore such redundant details are omitted in the interest of brevity. In addition, although FIGS. 1A to 13 are described in relation to the method, it will be appreciated that the structures disclosed in FIGS. 1A to 13 are not limited to the method but may stand alone as structures independent of the method. Similarly, although the methods shown in FIGS. 1A to 13 are not limited to the disclosed structures but may stand alone independent of the structures. Furthermore, the nanostructures described above may include nanowires, nanosheets, or other applicable nanostructures in accordance with some embodiments.

Also, while disclosed methods are illustrated and described below as a series of acts or events, it will be appreciated that the illustrated ordering of such acts or events may be altered in some other embodiments. For example, some acts may occur in different orders and/or concurrently with other acts or events apart from those illustrated and/or described above. In addition, not all illustrated acts may be required to implement one or more aspects or embodiments of the description above. Further, one or more of the acts depicted above may be carried out in one or more separate acts and/or phases.

Furthermore, the terms "approximately," "substantially," "substantial" and "about" describe above account for small variations and may be varied in different technologies and be in the deviation range understood by the skilled in the art. For example, when used in conjunction with an event or circumstance, the terms can refer to instances in which the event or circumstance occurs precisely as well as instances in which the event or circumstance occurs to a close approximation.

Embodiments for forming semiconductor structures may be provided. The semiconductor structure includes a first fin structure and a second fin structure formed over a substrate. The first fin structure includes first nanostructures, and the second fin structure includes second nanostructures along a first direction (e.g. x-axis). A first gate structure formed over the first nanostructures and a first S/D structure adjacent to the first gate structure. A second gate structure formed over the second nanostructures along the second direction (e.g. y-axis). A gate spacer layer is adjacent to the gate structure. A portion of the topmost nanostructures is removed, and therefore the number of nanostructures directly below and surrounded by the gate structure is reduced. In addition, the first width of the first nanostructures along the second direction is smaller than the second width of the second nanostructures along the second direction. In order to fulfill different needs in a region, the first gate structure is formed for power efficiency, and the second gate structure is formed for high speed performance. The first gate structure and second gate structure co-exist to achieve multi-nanostructures for speed performance and power efficiency. Therefore, the performance of the semiconductor structure is improved.

In some embodiments, a semiconductor structure is provided. The semiconductor structure includes first nanostructures formed over a substrate along a first direction, and a first gate structure formed over the first nanostructures along a second direction. The semiconductor structure includes a gate spacer layer formed adjacent to the first gate structure, and a first number of the first nanostructures directly below the gate spacer layer is greater than a second number of the nanostructures directly below the first gate structure.

In some embodiments, a semiconductor structure is provided. The semiconductor structure includes first channel layers formed over a first region of a substrate along a first direction. The semiconductor structure includes second channel layers adjacent to the first channel layers and over a second region of the substrate. The semiconductor structure includes a first gate structure formed over the first fin structure along a second direction, and a topmost first channel layer is divided into two portions by the first gate structure. The semiconductor structure includes a second gate structure formed over the second fin structure along the second direction, and a first number of the first channel layers directly below the first gate structure is smaller than a second number of the second channel layers directly below the second gate structure.

In some embodiments, a method for forming a semiconductor structure is provided. The method includes forming a first fin structure and a second fin structure over a first region and a second region of a substrate, respectively, and the first fin structure includes first semiconductor material layers and second semiconductor material layers alternately stacked, and the second fin structure includes first semiconductor material layers and second semiconductor material layers alternately stacked. The method includes forming a first dummy gate structure and a second dummy gate structure over the first fin structure and the second fin structure, and forming a first gate spacer layer adjacent to the first dummy gate structure. The method also includes removing the first dummy gate structure and the second dummy gate structure to expose the first fin structure and the second fin structure. The method further includes removing all of the second semiconductor material layers to expose the first semiconductor material layers. The method includes removing a portion of a topmost first semiconductor material layer in the first region directly below the first dummy gate structure, and another portion of the topmost first semiconductor material layer in the first region directly below the first gate spacer layer is not removed, wherein a first number of the first semiconductor material layers directly below the first gate spacer layer is greater than a second number of the first semiconductor material layers directly below the first gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:

a stack comprising at least one first nanostructure and a topmost first nanostructure portion over the at least one first nanostructure, the stack being formed over a substrate along a first direction;

a first gate structure wrapping around the at least one first nanostructure and extending along a second direction, the first gate structure extending through the topmost first nanostructure portion in a third direction;

a source/drain structure adjacent the stack, an uppermost surface of the source/drain structure being at a first elevation below a second elevation of the topmost first nanostructure portion;

a source/drain contact structure formed over the source/drain structure, the topmost first nanostructure portion being positioned between the first gate structure and the source/drain contact structure along the first direction; and a gate spacer layer formed adjacent to the first gate structure.

2. The semiconductor structure as claimed in claim 1, further comprising:

an inner spacer layer between the source/drain structure and the first gate structure, wherein a topmost surface of the inner spacer layer is higher than the uppermost surface of the source/drain structure.

3. The semiconductor structure as claimed in claim 2, wherein the topmost surface of the inner spacer layer is higher than a bottom surface of the source/drain contact structure.

4. The semiconductor structure as claimed in claim 1, wherein the first gate structure has a continuous sidewall surface in direct contact with the gate spacer layer, and a bottom surface of the continuous sidewall surface of the first gate structure is lower than a bottom surface of the gate spacer layer.

5. The semiconductor structure as claimed in claim 4, wherein the continuous sidewall surface of the first gate structure is in direct contact with the topmost first nanostructure portion of the stack.

6. The semiconductor structure as claimed in claim 1, wherein the uppermost surface of the source/drain structure is lower than a top surface of the topmost first nanostructure portion of the stack.

7. The semiconductor structure as claimed in claim 1, wherein a topmost surface of the first gate structure is lower than a top surface of the gate spacer layer.

8. The semiconductor structure as claimed in claim 1, further comprising:

second nanostructures adjacent to the first nanostructures, wherein each of the first nanostructures has a first width along the second direction, each of the second nanostructures has a second width along the second direction, and the first width is smaller than the second width.

9. The semiconductor structure as claimed in claim 1, wherein the topmost first nanostructure portion of the stack comprises two portions separated from each other by the first gate structure, and the two portions are in direct contact with the gate spacer layer.

10. A semiconductor structure, comprising:

a first stack comprising at least two first channel layers and a first nanostructure portion over the first two channel layers, the stack being formed over a first region of a substrate along a first direction;

a second stack comprising at least two second channel layers adjacent to the first channel layers and over a second region of the substrate, a topmost second channel layer of the at least two second channel layers being at substantially a same elevation as the first nanostructure portion;

a first gate structure wrapping around the at least two first channel layers and extending along a second direction, the first gate structure extending through the first nano-structure portion; and a second gate structure formed over the second channel layers along the second direction, wherein a first number of the at least two first channel layers directly below the first gate structure is smaller than a second number of the at least two second channel layers directly below the second gate structure.

11. The semiconductor structure as claimed in claim 10, wherein each of the at least two first channel layers has a first width along the second direction, each of the at least two second channel layers has a second width along the second direction, and the first width is smaller than the second width.

12. The semiconductor structure as claimed in claim 10, further comprising:

a third stack comprising at least two third channel layers adjacent to the at least two second channel layers and over a third region of the substrate, wherein the second number of the at least two second channel layers is smaller than a third number of the third channel layers.

13. The semiconductor structure as claimed in claim 10, further comprising:

a gate spacer layer adjacent to the first gate structure, wherein the first gate structure has a continuous side-wall surface in direct contact with the gate spacer layer, and a bottom edge of the continuous sidewall surface of the first gate structure is lower than a bottom surface of the gate spacer layer.

14. The semiconductor structure as claimed in claim 13, further comprising:

a first source/drain structure formed adjacent to the at least two first channel layers, wherein a top surface of the first source/drain structure is lower than a top surface of the first nanostructure portion.

15. The semiconductor structure as claimed in claim 14, further comprising:

a second source/drain structure formed adjacent to the at least two second channel layers, wherein a top surface of the second source/drain structure is higher than the top surface of the first source/drain structure.

16. The semiconductor structure as claimed in claim 10, further comprising:

a second gate structure formed over the at least two second channel layers, wherein a top surface of the first gate structure is lower than a top surface of the second gate structure.

17. A semiconductor structure, comprising:

a stack of nanostructures comprising a topmost nanostructure;

a source/drain structure adjacent the stack of nanostructures;

a gate structure wrapping around the nanostructures and extending through the topmost nanostructure;

a source/drain contact overlying the source/drain structure, an uppermost surface of the topmost nanostructure being below a bottommost surface of the source/drain contact; and a gate spacer layer separating the gate structure from the source/drain contact, the gate spacer layer overlying the topmost nanostructure.

18. The semiconductor structure of claim 17, wherein the stack of nanostructures comprises a second nanostructure underlying the topmost nanostructure, and the gate structure extends through the second nanostructure.

19. The semiconductor structure of claim 17, wherein the gate structure comprises:

a gate electrode layer; and a gate dielectric layer between the gate electrode layer and the stack of nanostructures, the gate dielectric layer having a sidewall contiguous with a sidewall of the topmost nanostructure.

20. The semiconductor structure of claim 17, wherein a bottommost surface of the gate spacer layer is contiguous with the uppermost surface of the topmost nanostructure.

* * * * *